US006414874B2

(12) United States Patent
Akaogi

(10) Patent No.: US 6,414,874 B2
(45) Date of Patent: Jul. 2, 2002

(54) NONVOLATILE SEMICONDUCTOR MEMORY DEVICE HAVING ELECTRICALLY AND COLLECTIVELY ERASABLE CHARACTERISTICS

(75) Inventor: Takao Akaogi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/832,916

(22) Filed: Apr. 12, 2001

Related U.S. Application Data

(62) Division of application No. 09/457,736, filed on Dec. 10, 1999, now Pat. No. 6,288,945, which is a division of application No. 09/081,243, filed on May 19, 1998, now abandoned, which is a division of application No. 08/822,036, filed on Mar. 24, 1997, now Pat. No. 5,815,440, which is a division of application No. 08/432,723, filed on Jun. 6, 1995, now Pat. No. 5,666,314, which is a division of application No. 08/079,738, filed on Jun. 22, 1998, now Pat. No. 5,452,251.

(30) Foreign Application Priority Data

| Dec. 3, 1992 | (JP) | ............................................ 4-324284 |
| Dec. 28, 1992 | (JP) | ............................................ 4-349481 |
| Jan. 5, 1993 | (JP) | ............................................ 5-000304 |

(51) Int. Cl.$^7$ .............................................. G11C 16/04
(52) U.S. Cl. ............................... 365/185.11; 365/185.29
(58) Field of Search ....................... 365/185.11, 185.29, 365/185.05, 230.03

(56) References Cited

U.S. PATENT DOCUMENTS

| 4,279,024 A | 7/1981 | Schrenk ...................... 365/203 |
| 4,543,647 A | 9/1985 | Yoshida ...................... 365/201 |
| 4,757,474 A | 7/1988 | Fukushi et al. ............. 365/200 |

(List continued on next page.)

FOREIGN PATENT DOCUMENTS

| DE | 40 14723 A1 | 11/1990 |
| DE | 0 504 434 A1 | 9/1992 |
| DE | 42 07 934 A1 | 10/1992 |

(List continued on next page.)

OTHER PUBLICATIONS

"A 16–ns 1–Mb CMOS EPROM" Kuriyama et al., 8107 IEEE Journal of Solid–State Circuits, Oct. 25, 1990, No. 5, New York, U.S. pp 1141–1146.

"Intel Flash EPROM for in–system reprogrammable non-volatile storage", Zales et al. 2407 Microprocessors and Microsystems, Oct. 14, 1990, No. 8, London, GB, pp. 543–549.

(List continued on next page.)

Primary Examiner—Vu A. Le
(74) Attorney, Agent, or Firm—Arent Fox Kintner Plotkin & Kahn

(57) ABSTRACT

A semiconductor memory device has $2^n$ word lines, a plurality of bit lines, a plurality of nonvolatile memory cells disposed at each intersection of the word lines and the bit lines, a write circuit for writing data to a memory cell located at an intersection of selected ones of the word lines and the bit lines, and a sense amplifier for reading data out of the memory cells. Further, the semiconductor memory device comprises a first unit for simultaneously selecting a block of $2^m$ (n>m) word lines among the $2^n$ word lines, and a second unit for not selecting a block of $2^k$ (m>k) word lines among the $2^m$ word lines. The second unit does not select the block of $2^k$ word lines, and selects a block of $2^k$ word lines prepared outside the $2^n$ word lines when any one of the $2^k$ word lines among the $2^m$ word lines is defective. Consequently, redundant word lines are effectively employed, write and verify operations are stable, and thereby the yield and performance of the semiconductor memory device are improved.

4 Claims, 85 Drawing Sheets

U.S. PATENT DOCUMENTS

| | | | |
|---|---|---|---|
| 4,906,994 A | 3/1990 | Hoffmann et al. | 341/51 |
| 5,039,882 A | 8/1991 | Arakawa | 365/230.06 |
| 5,060,197 A | 10/1991 | Park et al. | 365/200 |
| 5,126,808 A | 6/1992 | Montalvo et al. | 357/23.5 |
| 5,233,559 A | 8/1993 | Biennan, Jr. | 365/200 |
| 5,237,535 A | 8/1993 | Mielke et al. | 365/185.3 |
| 5,241,507 A | 8/1993 | Fong | 365/185.3 |
| 5,287,312 A | 2/1994 | Okamura et al. | 365/230.06 |
| 5,289,417 A | 2/1994 | Ooishi et al. | 365/200 |
| 5,297,085 A | 3/1994 | Choi et al. | 365/200 |
| 5,297,096 A * | 3/1994 | Terada et al. | 365/218 |
| 5,297,148 A | 3/1994 | Harari et al. | 365/200 |
| 5,307,316 A | 4/1994 | Takemae | 365/200 |
| 5,335,205 A | 8/1994 | Ogihara | 365/230.06 |
| 5,452,248 A | 9/1995 | Naruke et al. | 365/185.24 |
| 5,463,583 A | 10/1995 | Takashina | 365/185.24 |
| 5,504,713 A | 4/1996 | Ooishi et al. | 365/200 |

FOREIGN PATENT DOCUMENTS

| | | |
|---|---|---|
| DE | 42 13 741 A1 | 11/1992 |
| EP | 0 239 196 | 9/1987 |
| EP | 0 314 819 A2 | 5/1989 |
| EP | 0 317 323 A2 | 5/1989 |
| EP | 0 376 065 A2 | 7/1990 |
| EP | 0 379 693 A2 | 8/1990 |
| EP | 0 392 895 A2 | 10/1990 |
| EP | 0 495 493 A2 | 7/1992 |
| EP | 0 496 282 A2 | 7/1992 |
| EP | 0 501 289 A2 | 9/1992 |
| FR | 2 667 169 | 3/1992 |
| FR | 2 672 709 | 8/1992 |
| GB | 2 215 156 A | 9/1989 |
| JP | 55160394 A | 12/1980 |
| JP | 61184793 A | 8/1986 |
| JP | 01112600 A | 5/1989 |
| JP | 01159895 A | 5/1989 |
| JP | 01236496 A | 9/1989 |
| JP | 1-273357 A | 11/1989 |
| JP | 02027596 A | 1/1990 |
| JP | 2-87394 | 3/1990 |
| JP | 2-142000 | 5/1990 |
| JP | 3-203097 A | 9/1991 |
| WO | WO92/05559 | 4/1992 |

OTHER PUBLICATIONS

"The Effects of Write/Erase Cycling on Data Loss in EPROMs", Baglee et al., International Electron Devices Meeting Dec. 1–4, 1985, pp 624–626, XP 002074591.

"A 62nd 16Mb CMOS with Address Transition Detection Technique", Ohtsuka et al., 8172 IEEE International Solid-State Circuits Conference, vol. 34, Feb. 1, 1991, pp. 262–263.

Patent Abstracts of Japan, vol. 012, No. 497 (P–806) Dec. 26, 1988, of JP 63 206998A, published Aug. 26, 1988, Abstract only.

* cited by examiner

→ TIME

| Fig.56A |
|---|
| Fig.56B |

| Fig.58A |
|---|
| Fig.58B |

HIGH VOLTAGE SOURCE
CONTROL SIGNAL

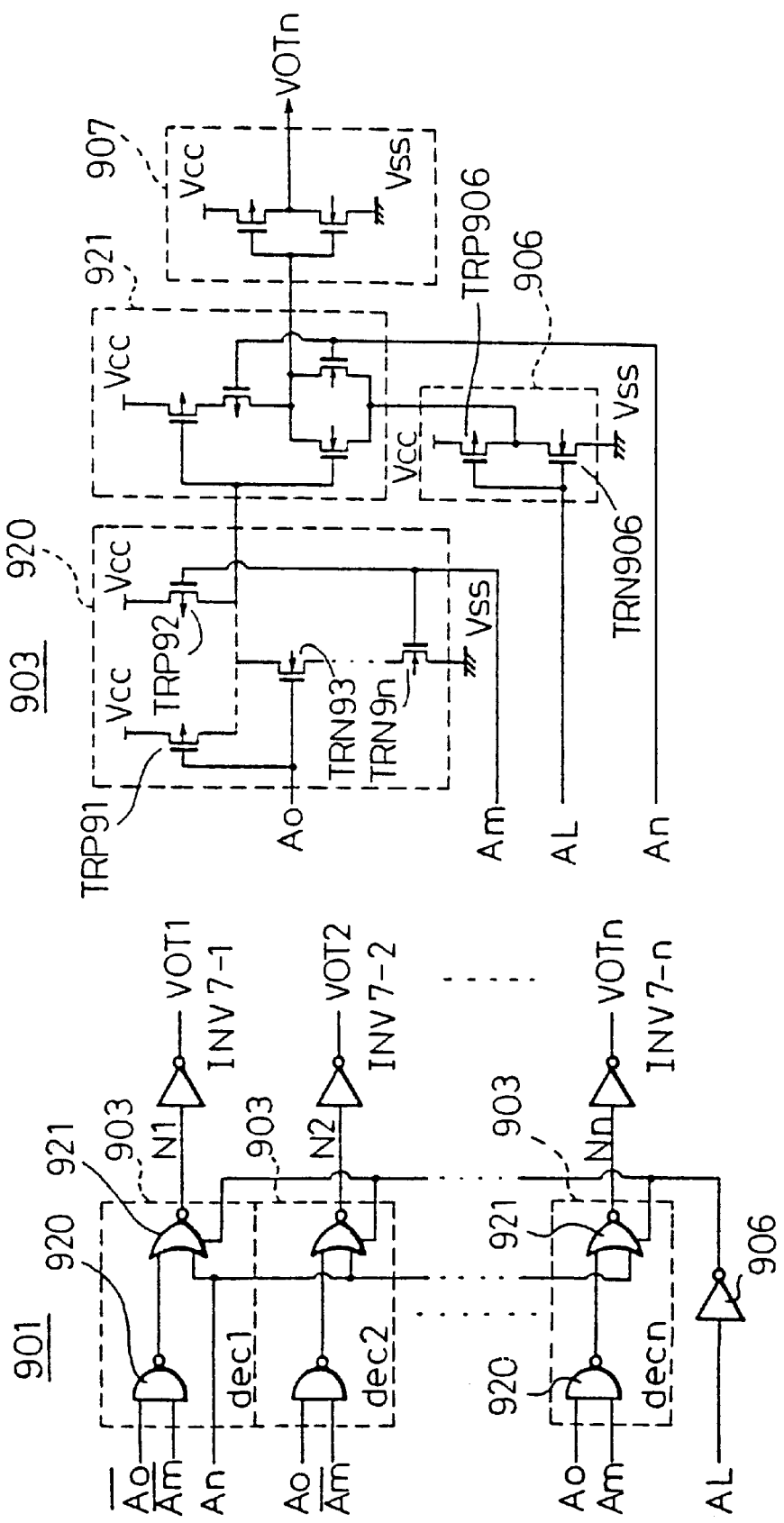

NONVOLATILE SEMICONDUCTOR MEMORY DEVICE HAVING ELECTRICALLY AND COLLECTIVELY ERASABLE CHARACTERISTICS

This application is a divisional application filed under 37 CFR §1.53(b) of parent application Ser. No. 09/457,736, filed Dec. 10, 1999 now U.S. Pat. No. 6,288,945, which in turn is a divisional of application Ser. No. 09/081,243, filed May 19, 1998 now abandoned, which in turn is a divisional of application Ser. No. 08/822,036, filed Mar. 24, 1997, now U.S. Pat. No. 5,815,440, which in turn is a divisional of application Ser. No. 08/432,723, filed Jun. 6, 1995, now U.S. Pat. No. 5,666,314, which in turn is a divisional of application Ser. No. 08/079,738, filed Jun. 22, 1993, now U.S. Pat. No. 5,452,251.

BACKGROUND OF THE INVENTION

1. Field of the Invention

The present invention relates to a semiconductor memory device, and more particularly, to a flash memory, i.e., a nonvolatile semiconductor memory device having electrically and collectively erasable characteristics.

2. Description of the Related Art

Recently, in accordance with popularization of computers, word processors, and the like, a plurality of semiconductor memory devices, typically non-volatile semiconductor memory devices, e.g., flash memory, used in such information processors, have been developed and produced.

The flash memory, which is one kind of non-volatile semiconductor memory device, can be made programmable by the user. Further, the flash memory can be rewritten by electrically and collectively erasing the stored data, and then by programming. Therefore, the flash memories have attracted considerable attention as a replacement for magnetic storage devices because they are suitable for integration. Note, there is a necessity of improving redundant circuits, write circuits, and overerasing preventive measures for such a flash memory.

SUMMARY OF THE INVENTION

An object of a first aspect of the present invention is to provide a semiconductor memory device for realizing effective word line redundancy and stable write and verify operations in a semiconductor memory device, to improve the yield and performance of the semiconductor memory device.

An object of a second aspect of the present invention is to provide a semiconductor memory device for reducing the size of the semiconductor memory device, to improve the yield of large capacity semiconductor memories and reduce the cost thereof.

An object of a third aspect of the present invention is to provide a semiconductor memory device for carrying out a delivery test of a semiconductor memory device with "n" rewrite operations at the maximum, and taking into account deterioration due to an increase in the number of rewrite operations, to guarantee the maximum rewrite operations N (N>n) for a user.

An object of a fourth aspect of the present invention is to provide a semiconductor memory device that is capable of supplying a write drain voltage that is not influenced by the threshold voltage of a write voltage supply transistor, thereby correctly writing data to a memory cell even with a low write voltage.

An object of a fifth aspect of the present invention is to provide a semiconductor memory device that correctly reads data even if there is an overerased cell transistor.

An object of a sixth aspect of the present invention is to provide a semiconductor memory device that correctly reads data by saving overerased cell transistors.

An object of a seventh aspect of the present invention is to provide a semiconductor memory device capable of simultaneously erasing a plurality of blocks of memory cells and easily verifying the erased blocks.

An object of an eighth aspect of the present invention is to provide a semiconductor memory device employing two power sources that are easy to use and operable like a single power source.

An object of a ninth aspect of the semiconductior memory device of the present invention is to provide an inexpensive decoder circuit that solves the problems of the prior art. The decoder circuit of the present invention is simple and compact to achieve the full selection and nonselection of word or bit lines in a test mode. This decoder circuit is suitable for high integration.

According to a first aspect of the present invention, there is provided a semiconductor memory device comprising $2^n$ word lines, a plurality of bit lines, a plurality of nonvolatile memory cells each formed of a MIS transistor disposed at each intersection of the word lines and the bit lines, and a threshold voltage of the MIS transistor being externally electrically controllable, a write circuit for writing data to a memory cell located at an intersection of selected ones of the word lines and the bit lines, a sense amplifier for reading data out of the memory cells, a first unit for simultaneously selecting a block of $2^m$ (n>m) word lines among the $2^n$ word lines, and a second unit for not selecting a block of $2^k$ (m>k) word lines among the $2^m$ word lines, the second unit not selecting the block of $2^k$ word lines and selecting a block of $2^k$ word lines prepared outside the $2^n$ word lines when any one of the $2^k$ word lines among the $2^m$ word lines is defective.

The selected word lines may receive a negative voltage, and the unselected word lines receive a zero or positive voltage. The block of $2^n$ word lines may form a real cell block, the block of $2^m$ word lines may form an erase block, and the block of $2^k$ word lines outside the block of $2^n$ word lines may form a redundant cell block.

Further, according to a first aspect of the present invention, there is provided a semiconductor memory device comprising $2^n$ word lines, a plurality of bit lines, a plurality of nonvolatile memory cells each formed of a MIS transistor disposed at each intersection of the word lines and the bit lines, and a threshold voltage of the MIS transistor being externally electrically controllable, a write circuit for writing data to a memory cell located at an intersection of selected ones of the word lines and the bit lines, a sense amplifier for reading data out of the memory cells, a first unit for simultaneously selecting a block of $2^m$ (n>m) word lines among the $2^n$ word lines, and a second unit for not selecting a block of $2^k$ (m>k) word lines among the $2^m$ word lines, data being written to any memory cell transistor, which is contained in the $2^k$ word lines and whose threshold voltage is lower than the potential of an unselected word line, so that the threshold voltage of the memory cell transistor exceeds the potential of the unselected word line, and a block of $2^k$ word lines prepared outside the $2^n$ word lines being used as redundant word lines.

Further, according to a first aspect of the present invention, there is also provided a semiconductor memory device comprising a plurality of word lines, a plurality of bit lines, a plurality of nonvolatile memory cells each formed of a MIS transistor disposed at each intersection of the word lines and the bit lines, and a threshold voltage of the MIS transistor being externally electrically controllable, a write circuit for writing data to a memory cell located at an intersection of selected ones of the word lines and the bit lines, and a sense amplifier for reading data out of the memory cells, wherein each word line is controlled such that a drain current of a memory cell transistor connected to the word line is lower than a channel current thereof, when writing data to the cell transistor to increase the threshold voltage of the memory cell transistor to be higher than the potential of an unselected word line.

Each word line may be controlled by applying a signal in accordance with a pulse signal.

Furthermore, according to a first aspect of the present invention, there is also provided a semiconductor memory device comprising a plurality of word lines, a plurality of bit lines, a plurality of nonvolatile memory cells each formed of a MIS transistor disposed at each intersection of the word lines and the bit lines, and a threshold voltage of the MIS transistor being externally electrically controllable, a write circuit for writing data to a memory cell located at an intersection of selected ones of the word lines and the bit lines, and a sense amplifier for reading data out of the memory cells, wherein an output current of the sense amplifier is changed according to a combination of ON states of two load transistors having different capacities, to realize a normal data read operation, an erase verify operation, and a write verify operation.

A reference voltage may be increased to provide a word line with a voltage, which is used to carry out the write verify or erase verify operations on any cell transistor connected to the word line. P-channel type and n-channel type transistors fabricated in the same process may be connected in series like diodes to provide a word line with a voltage which is used to carry out the write verify or erase verify operations on any cell transistor connected to the word line.

The semiconductor memory device may be constituted by a flash memory.

According to a second aspect of the present invention, there is provided a semiconductor memory device comprising a plurality of real memory cells divided into blocks, a plurality of redundant memory cells to be replaced with defective ones of the real memory cells, a plurality of defective address specifying units for specifying defective addresses of the respective blocks of the real memory cells, and an address comparing unit shared by the defective address specifying unit, for comparing the defective addresses with addresses in the blocks of the real memory cells.

Further, according to a second aspect of the present invention, there is also provided a semiconductor memory device comprising a real cell array having a plurality of memory cells, and a plurality of redundant cells to be replaced with defective memory cells of the real cell array, a redundant information storing cell array for writing data to a defective address according to an externally provided address, a cell selection circuit for selecting the redundant information storing cell array according to the externally provided address, and a read circuit for reading an output of the redundant information storing cell array selected by the cell selection circuit, and providing a redundancy signal.

According to a third aspect of the present invention, there is provided a semiconductor memory device comprising electrically erasable nonvolatile memory cells to and from which data is automatically written and erased according to an internal algorithm incorporated in the semiconductor memory device, wherein the allowable value of write or erase operations is carried out according to the internal algorithm being variable.

According to a fourth aspect of the present invention, there is provided a semiconductor memory device comprising a plurality of word lines, a plurality of bit lines, a plurality of memory cells each formed of a MIS transistor disposed at each intersection of the word lines and the bit lines, and a threshold voltage of the MIS transistor being externally electrically controllable, and a write voltage supply transistor for supplying a write voltage to a drain of the memory cell, wherein the write voltage supply transistor is formed of a p-channel type MIS transistor, which effectively applies the write voltage to the drain of the memory cell.

Further, according to a fourth aspect of the present invention, there is also provided a semiconductor memory device comprising a plurality of word lines, a plurality of bit lines, a plurality of memory cells each formed of a MIS transistor disposed at each intersection of the word lines and the bit lines, and a threshold voltage of the MIS transistor being externally electrically controllable, and a write voltage supply transistor for supplying a write voltage to a drain of the memory cell, wherein the write voltage supply transistor is formed of an n-channel type MIS transistor, and the semiconductor memory device comprises a step-up unit being disposed to increase a gate voltage of the write voltage supply transistor at least up to a sum of the write voltage and a threshold voltage of the write voltage supply transistor.

According to a fifth aspect of the present invention, there is provided a semiconductor memory device comprising a plurality of word lines, a plurality of bit lines, a memory cell array including a plurality of memory cells each formed of a MIS transistor disposed at each intersection of the word lines and the bit lines, a threshold voltage of the MIS transistor being externally electrically controllable according to charges to be injected to a floating gate thereof, and the floating gates of the MIS transistors being simultaneously discharged to collectively erase the memory cells, a first power source for applying a normal selection voltage to a selected word line to select memory cells connected to the word line, when reading data, and a second power source for establishing an unselected state on unselected word lines including memory cells that have been overerased by the collective erasing, when reading data.

Further, according to a fifth aspect of the present invention, there is also provided a semiconductor memory device comprising a plurality of word lines, a plurality of bit lines, a memory cell array including a plurality of memory cells each formed of a MIS transistor disposed at each intersection of the word lines and the bit lines, a threshold voltage of the MIS transistor being externally electrically controllable according to charges to be injected to a floating gate thereof, and the floating gates of the MIS transistors being simultaneously discharged to collectively erase the memory cells, a first row decoder for applying a normal voltage to a selected word line to select memory cells connected to the word line, when reading data, and a second row decoder for applying a predetermined source voltage to the source of each memory cell connected to the selected word line, and applying an unselected state establishing voltage to the sources of memory cells, including those overerased by the collective erasing, connected to unselected word lines, when reading data.

According to a sixth aspect of the present invention, there is provided a semiconductor memory device comprising a plurality of word lines, a plurality of bit lines, a memory cell array including a plurality of memory cells each formed of a MIS transistor disposed at each intersection of the word lines and the bit lines, a threshold voltage of the MIS transistor being externally electrically controllable according to charges to be injected to a floating gate thereof, and the floating gates of the MIS transistors being simultaneously discharged to collectively erase the memory cells, wherein a method of saving overerased memory cells of the semiconductor memory device detects memory cells that have been overerased by the collective erasing, and writing data to the overerased memory cells, thereby saving the overerased memory cells.

Further, according to a sixth aspect of the present invention, there is also provided a semiconductor memory device comprising a plurality of word lines, a plurality of bit lines, a memory cell array including a plurality of memory cells each formed of a MIS transistor disposed at each intersection of the word lines and the bit lines, and a threshold voltage of the MIS transistor being externally electrically controllable according to charges to be injected to a floating gate thereof, a write-before-erase unit for writing all memory cells of the memory cell array before erasing them, an erase unit for erasing all of the written memory cells by the write-before-erase unit and for verifying the erasing, an overerased cell detecting unit for detecting overerased memory cells among the erased and verified memory cells by the erase unit, and an overerased cell saving unit for writing the overerased memory cells detected by the overerased cell detecting unit, thereby saving the overerased memory cells.

According to a seventh aspect of the present invention, there is provided a semiconductor memory device comprising a plurality of word lines, a plurality of bit lines, and a plurality of nonvolatile memory cells each formed of a MIS transistor disposed at each intersection of the word lines and the bit lines, and a threshold voltage of the MIS transistor being externally electrically controllable, wherein the nonvolatile memory cells areg divided into a plurality of cell blocks to be selected according to a block selection signal provided by a block address buffer, each of the cell blocks has a data erasing unit and a latching unit for latching the block selection signal, and thereby data of the cell blocks that have latched the block selection signal are simultaneously erased.

According to an eighth aspect of the present invention, there is provided a semiconductor memory device comprising a first terminal for receiving a normal voltage, a second terminal for receiving a high voltage from a high-voltage supply unit, and the high voltage being required to write or erase data and higher than the normal voltage required to read data, a third terminal for providing the high-voltage supply unit with a control signal that controls the supply of the high voltage.

Further, according to an eighth aspect of the present invention, there is also provided a semiconductor memory device comprising a step-up circuit for supplying a high voltage that is required to write or erase data and higher than a normal voltage required to read data, a command determination unit that determines whether or not an operation specified by an input command to the semiconductor memory device requires the high voltage, and provides a control signal to start the supply of the high voltage if the operation requires the high voltage, and if not, a control signal to stop the high voltage.

Furthermore, according to an eighth aspect of the present invention, there is also provided a computer system having a semiconductor memory device as a part of a storage unit and a step-up circuit for generating a high voltage required to write and erase data to and from the semiconductor memory device, wherein the computer system comprises a control unit for automatically generating a control signal to control the step-up circuit, in response to an access operation to the semiconductor memory device.

According to a ninth aspect of the present invention, there is provided a semiconductor memory device comprising a plurality of word lines, a plurality of bit lines, a plurality of memory cells disposed at each intersection of the word lines and the bit lines, and a decoder circuit for selecting the memory cell according to an address signal in a normal decoding function and for carrying out a full selection operation or a nonselection operation of the word lines or the bit lines in a test function, and an output row or a decoding row connected to a first power source and a second power source, the first power source supplying a high voltage, and the second power source supplying a reference voltage or the high voltage in response to a control signal.

Further, according to a ninth aspect of the present invention, there is also provided a semiconductor memory device comprising a plurality of word lines, a plurality of bit lines, a plurality of memory cells disposed at each intersection of the word lines and the bit lines, a decoder circuit for selecting the memory cell according to an address signal in a normal decoding function and for carrying out a full selection operation or a nonselection operation of the word lines or the bit lines in a test function, and an output row or a decoding row connected to a first power source and a second power source, the first power source supplying a reference voltage, and the second power source supplying a reference voltage or the high voltage in response to a control signal.

BRIEF DESCRIPTION OF THE DRAWINGS

The present invention will be more clearly understood from the description of the preferred embodiments as set forth below with reference to the accompanying drawings, wherein:

FIGS. 84A and 84B are circuit diagrams showing the details of the decoder circuit of FIG. 79;

DESCRIPTION OF THE PREFERRED EMBODIMENTS

For a better understanding of the preferred embodiments, the problems of the related art will be explained, with reference to FIGS. 1 to 10.

Figure 1:
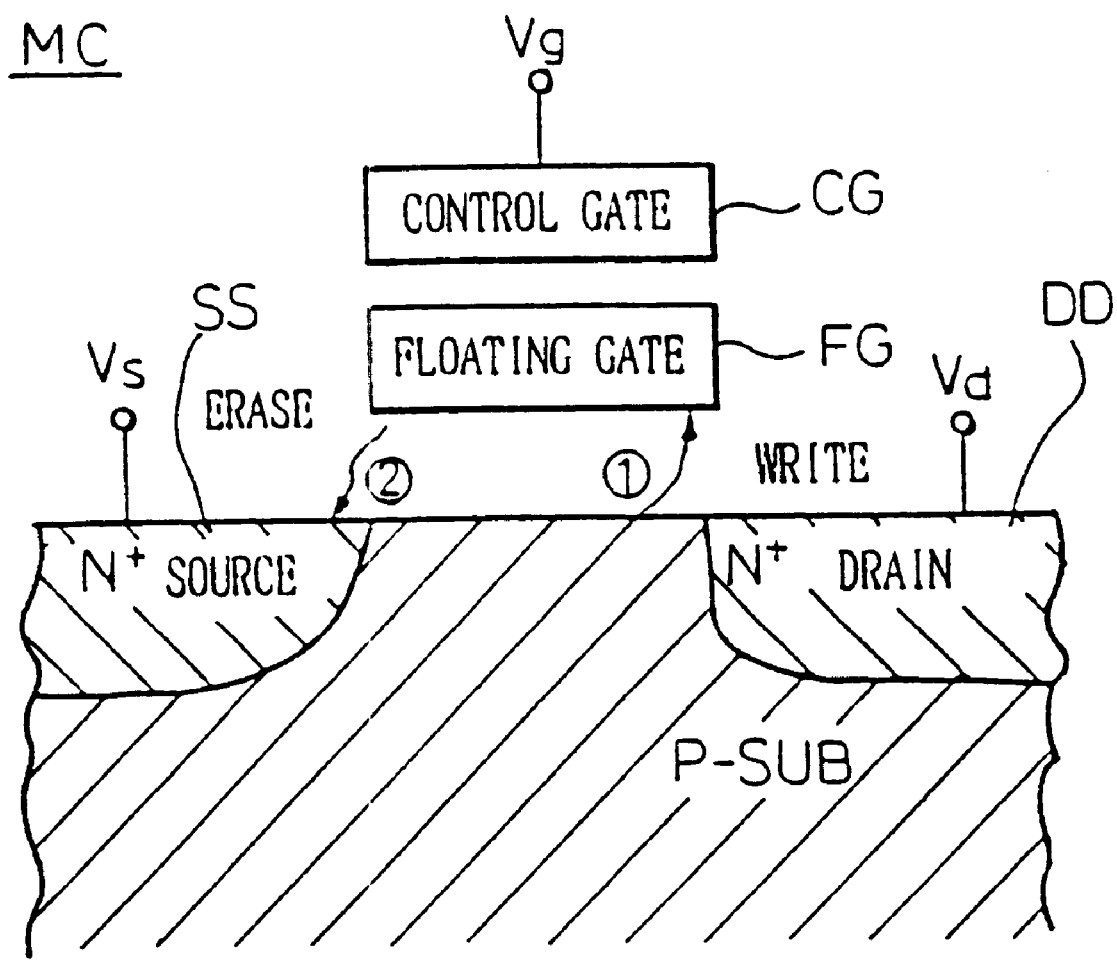
FIG. 1 is diagram for explaining the operation of a memory cell used for a semiconductor memory device related to the first aspect of the present invention.

FIG. 1 shows a memory cell (MC) of an electrically collectively erasable nonvolatile semiconductor memory device (a flash memory) for which a first aspect of the present invention is applied. The memory cell (cell transistor) MC has a floating gate FG. The floating gate FG is located between a source and a drain and is insulated from other regions. A control gate CG is formed above the floating gate FG.

To write data to the cell transistor MC, a drain voltage Vd applied to a drain DD is substantially equalized with a power source voltage Vcc. A gate voltage Vg applied to the control gate CG is a positive high voltage (about +10 volts at the maximum). A source voltage Vs applied to a source SS is zero. Electrons are injected from the drain DD to the floating gate FG, to write data "0" to the cell transistor MC. The drain voltage Vd may be a write voltage Vpp, if the voltage Vpp is available. The high gate voltage Vg may be the write voltage Vpp, or may be produced by increasing the power source voltage Vcc.

To erase data from the cell transistor MC, the gate voltage Vg is set to a high negative value (about −10 volts at the lowest). The drain voltage Vd is opened to put the drain DD in a floating state. The source voltage Vs is equalized with the power source voltage Vcc. Electrons are pulled from the floating gate FG to the source SS, to erase data from the cell transistor MC, i.e., to write data "1" to the cell transistor. To read data from the cell transistor MC, the gate voltage Vg is equalized to the power source voltage Vcc, the drain voltage Vd to about one volt, and the source voltage Vs to zero. Then, it is checked to see whether or not a drain current flows, to determine if the data stored in the cell transistor MC is "1" or "0".

Figure 2:
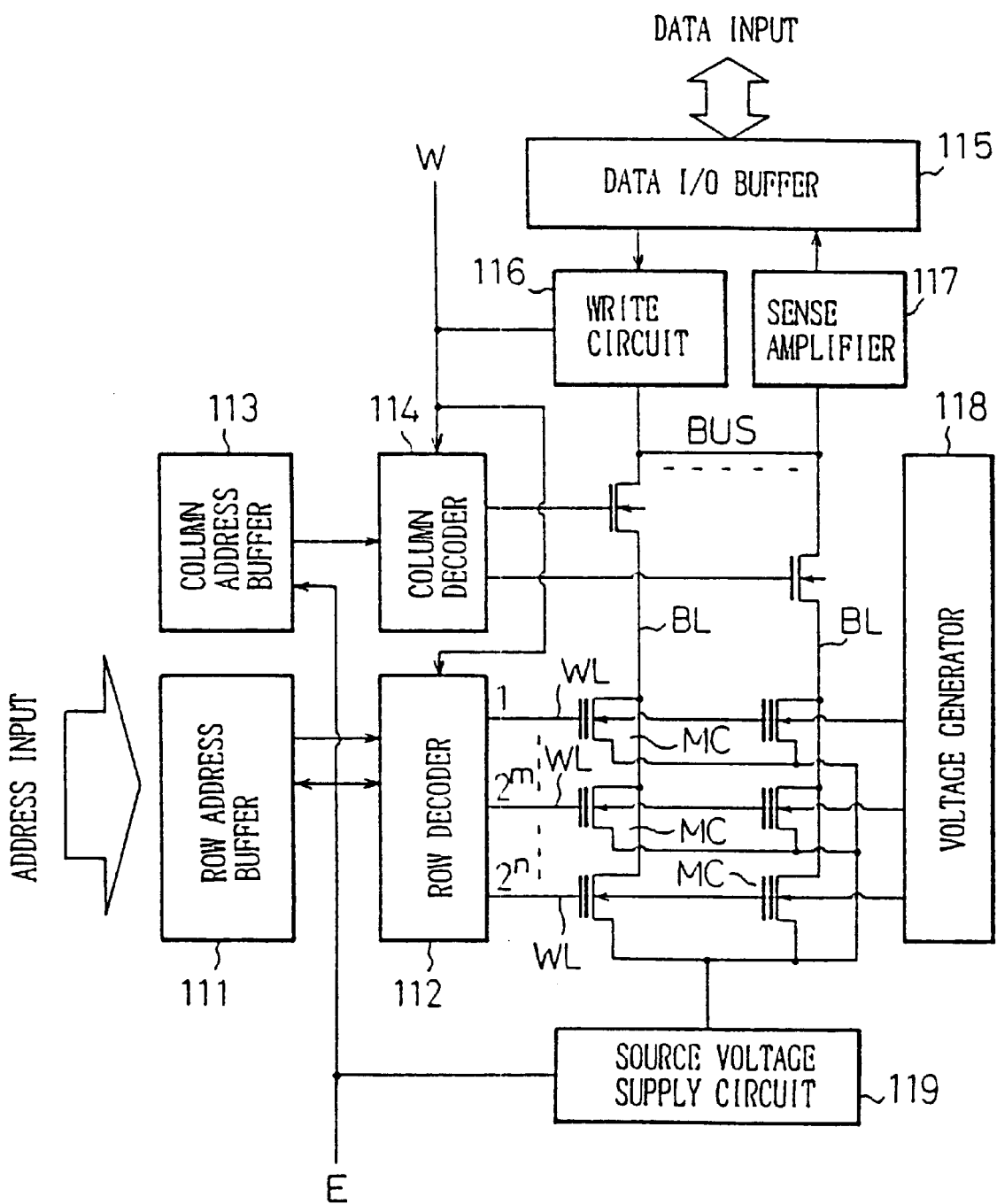
FIG. 2 is a block diagram showing a conventional semiconductor memory device related to the first aspect of the present invention.
Figure 3:
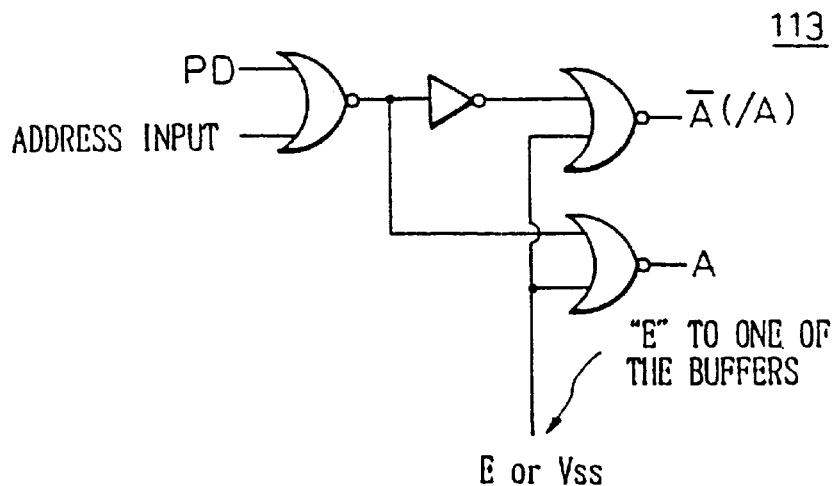
FIG. 3 is a circuit diagram showing a column address buffer of the semiconductor memory device of FIG. 2.

FIG. 2 shows a conventional semiconductor memory device related to the first aspect of the present invention. This semiconductor memory device has a row address buffer 111, a row decoder 112, a column address buffer 113, a column decoder 114, a data I/O buffer 115, a write circuit 116, a sense amplifier 117, a negative voltage generator 118, and a source voltage supply circuit 119. The semiconductor memory device involves bit lines BLs, word lines WLs, a write control signal W that will be high level H when writing data, and an erase control signal E that will be high level H when erasing data.

When reading data from a memory cell (cell transistor) MC, a row address is given to select a word line WL, and a column address to select a bit line BL, thereby selecting the memory cell. The sense amplifier 117 senses whether or not a current flows through the selected memory cell, to determine whether data stored in the cell is "1" or "0".

When writing data to a memory cell MC, the write control signal W is set to high level H. The write circuit 116 provides a bus BUS with a write voltage, and the column decoder 114 connects the bus BUS to a given bit line BL. The row decoder 112 applies the write voltage to a selected word line WL. When erasing data from memory cells MCs, the erase control signal E is set to high level H. The source voltage supply circuit 119 applies an erase voltage to source lines of the memory cells MCs, and the column address buffer 113 puts the bit lines BLs in an unselected state. The row address buffer 111 simultaneously selects a given number of word lines WLs, and the row decoder 112 sets the selected word lines WLs to low level L and the unselected word lines WLs to high level H. The negative voltage generator 118 applies a negative voltage to the word lines WLs of low level L.

FIGS. 3 to 6 show examples of the column address buffer 113, row address buffer 111, row decoder 112, column decoder 114 of the semiconductor memory device of FIG. 2, respectively.

Figure 4:
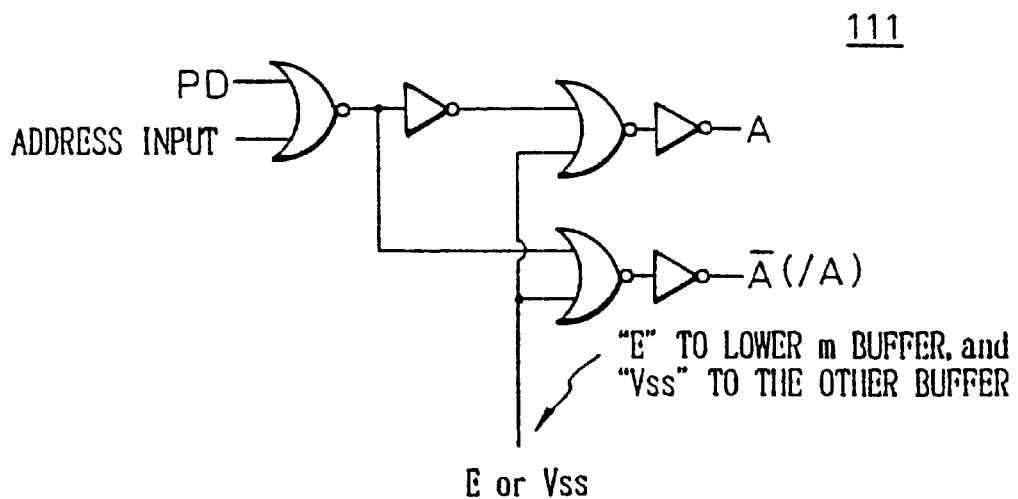
FIG. 4 is a circuit diagram showing a row address buffer of the semiconductor memory device of FIG. 2.

When reading data from a memory cell MC, the erase control signal E is at low level L. The column address buffer 113 of FIG. 3 and row address buffer 111 of FIG. 4 provide positive and negative logic values with respect to an input address. The row decoder 112 of FIG. 5 involves a signal $\phi$ oscillates at a given frequency when erasing or writing data, and a signal $\phi R$ that is at high level H for some period of time after the reception of the input address.

When reading data, the write control signal W is at low level L. Transistors $T_1$ and $T_2$ of the row decoder 112 of FIG. 5 introduce the power source voltage Vcc. According to an address input (an output of the row address buffer 111), a predetermined decoder is selected. For example, a node $N_3$ of FIG. 5 becomes high level H. If the signal $\phi R$ provides a pulse of high level H in this state, nodes $N_2$ and $N_4$ are reset to zero. When the signal $\phi R$ restores low level L, the node $N_2$ is charged to the power source voltage Vcc. Due to the self-bootstrap effect of transistors $T_4$ and $T_7$, the node $N_4$ is also charged to the level of the power source voltage Vcc. The column decoder 114 operates similarly to the row decoder 112. As a result, the power source voltage Vcc is applied to a predetermined word line WL, and a predetermined bit line BL is connected to the sense amplifier 117.

Figure 7:
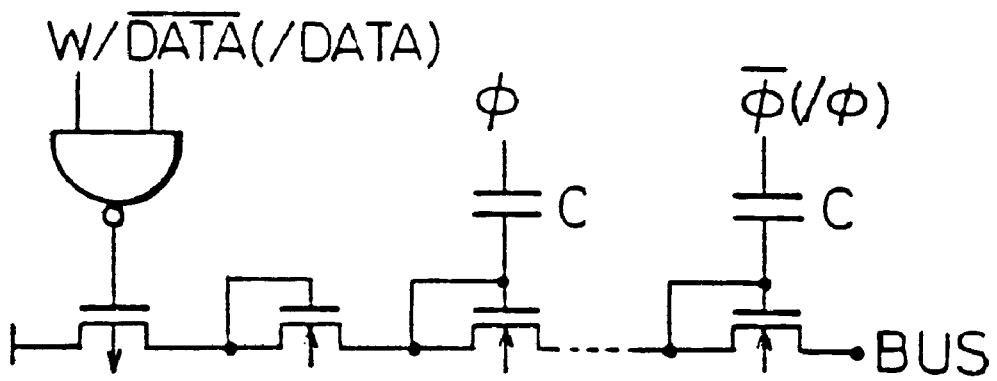
FIG. 7 is a circuit diagram showing a write circuit of the semiconductor memory device of FIG. 2.
Figure 8:
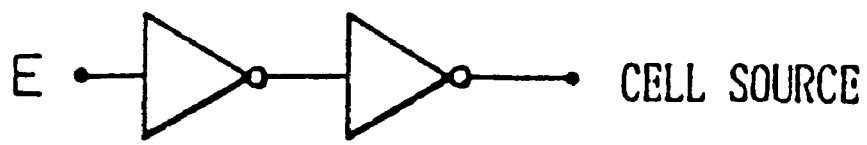
FIG. 8 is a circuit diagram showing a source voltage supply circuit of the semiconductor memory device of FIG. 2.

FIGS. 7 and 8 show examples of the write circuit 116 and source voltage supply circuit 119 of the semiconductor memory device of FIG. 2, respectively.

With the write control signal W of high level H, data of low level L, and an inverted data signal /DATA of high level H, the write circuit 116 of FIG. 7 increases the power source voltage Vcc to provide the bus BUS with a high voltage. With this high voltage, data is written to a given cell transistor. The signal /DATA is transferred as a write signal from the data I/O buffer 115 to the write circuit 116. Note, a mark "/" denotes an inverted level or inverted signal, and thus, for example, the signal /DATA denotes an inverted level of signal DATA.

When erasing data, the erase control signal E is raised to high level H. In the column address buffer 113 of FIG. 3, both outputs A and /A are set to low level L. These outputs A and /A are applied to the column decoder 114 to put the columns (bit lines BLs) in an unselected state. Namely, the bit lines BLs are electrically disconnected from every node. In the row address buffer 111, the erase control signal E is applied to "m" buffer elements among "n" buffer elements in total. As a result, the row decoder 112 of FIG. 5 simultaneously selects $2^m$ word lines. In the row decoder 112, the erase control signal E is at high level H, so that the node $N_2$ receives zero volts and the node $N_5$ receives high level H. As a result, the selected word lines WLs are set to low level L, and the unselected word lines WLs are set to high level H.

Figure 5:
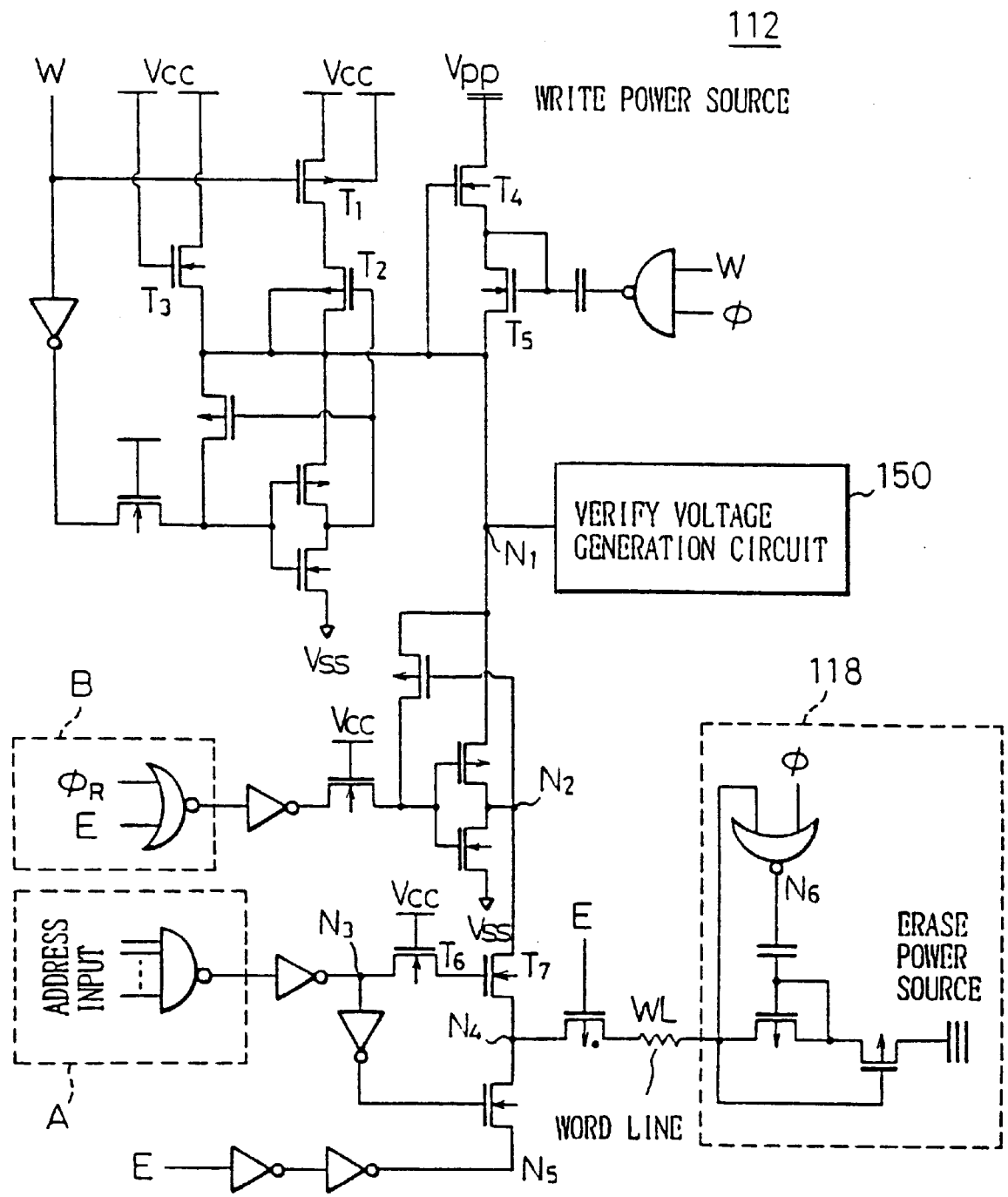
FIG. 5 is a circuit diagram showing a row decoder of the semiconductor memory device of FIG. 2.
Figure 6:
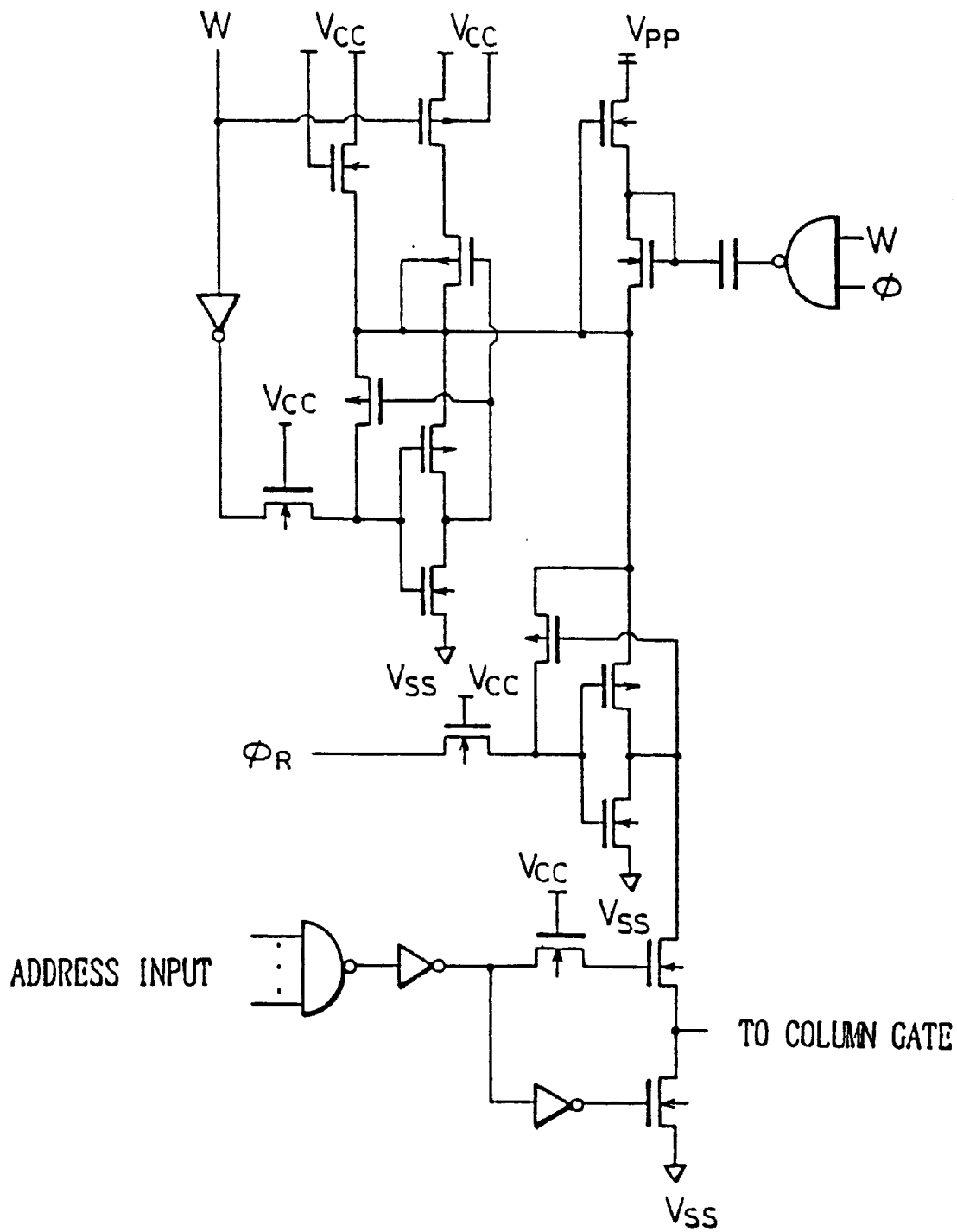
FIG. 6 is a circuit diagram showing a column decoder of the semiconductor memory device of FIG. 2.

The negative voltage generator 118 provides an erase voltage to the word lines WLs of low level L. The word lines WLs at high level H are maintained at high level H because the potential of an output $N_6$ of a NOR gate of FIG. 5 is always at low level L, and therefore, the signal $\phi$ is not transmitted to a capacitance element connected to the node $N_6$. At this time, the source voltage supply circuit 119 of FIG. 8 applies the power source voltage Vcc to the source SS of each cell transistor MC. As a result, the cell transistors of the $2^m$ word lines are simultaneously erased.

Figure 9:
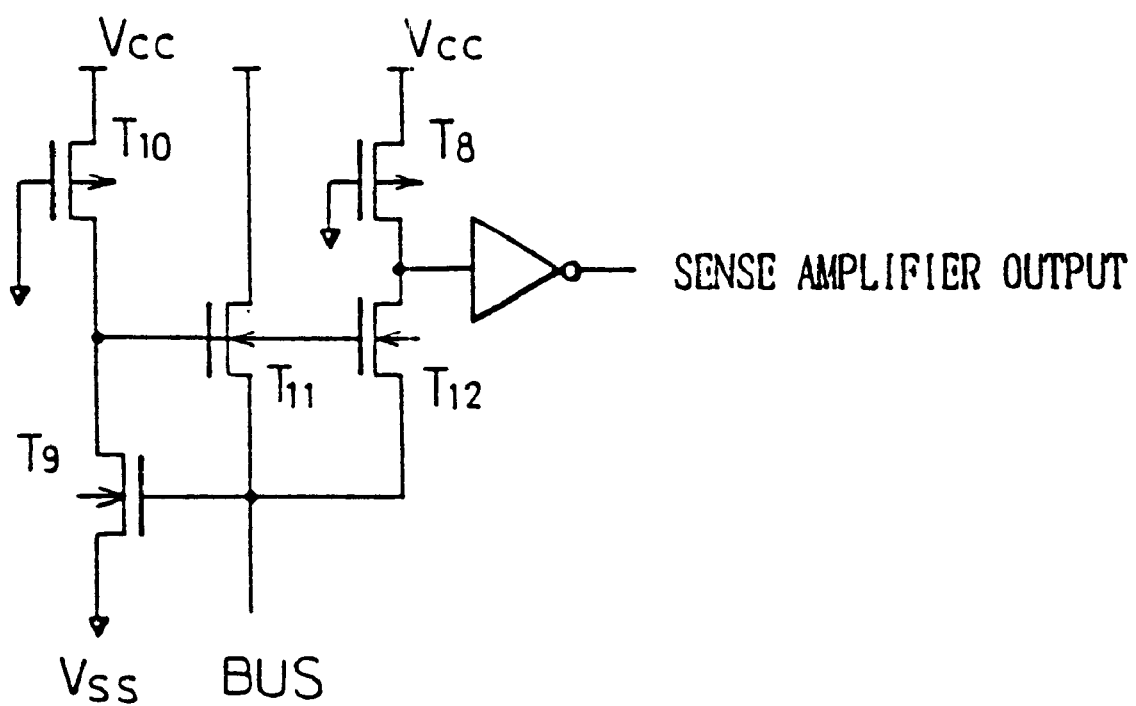
FIG. 9 is a circuit diagram showing a sense amplifier of the semiconductor memory device of FIG. 2.

FIG. 9 shows an example of the sense amplifier 117 of the semiconductor memory device of FIG. 2.

An output of the sense amplifier 117 of FIG. 9 will be high level H or low level L depending on whether or not the drain current of a selected cell transistor MC is larger than the allowable current of a transistor $T_8$. Transistors $T_9$, $T_{10}$, $T_{11}$, and $T_{12}$ form a bias circuit that sets the potential of the bus BUS to about one volt.

When writing data, the write control signal W is set to high level H, and the signal $\phi$ is oscillated at a predetermined frequency. The transistors $T_4$ and $T_5$ provide the node $N_1$ with a write voltage. Similar to the read operation with the signal $\phi R$, a pulse of high level H is applied to charge the node $N_2$ to the write voltage. The node $N_4$ is also charged to the same level as the node $N_2$ due to the self-bootstrap effect of the transistors $T_6$ and $T_7$. The column decoder 114 operates in the same manner. Consequently, the write voltage is supplied to a selected word line WL, and a selected bit line BL is connected to the write circuit 116

As explained with reference to FIGS. 2 to 9, the semiconductor memory device (flash memory) of the related art collectively erases a block containing a large number of memory cells, e.g., 512 kilobits. If this large block includes a defective cell, the block as a whole must be replaced with a block containing a large number of redundant memory cells. This sort of replacement deteriorates the efficiency of redundancy. Namely, it is difficult for the related art to replace many defective cells with a small number of redundant cells. If the memory cell MC11 of FIG. 1 is overerased, a current will always flow to the bit line BL1 through the memory cell MC11, to hinder correct read and write operations.

Figure 10:
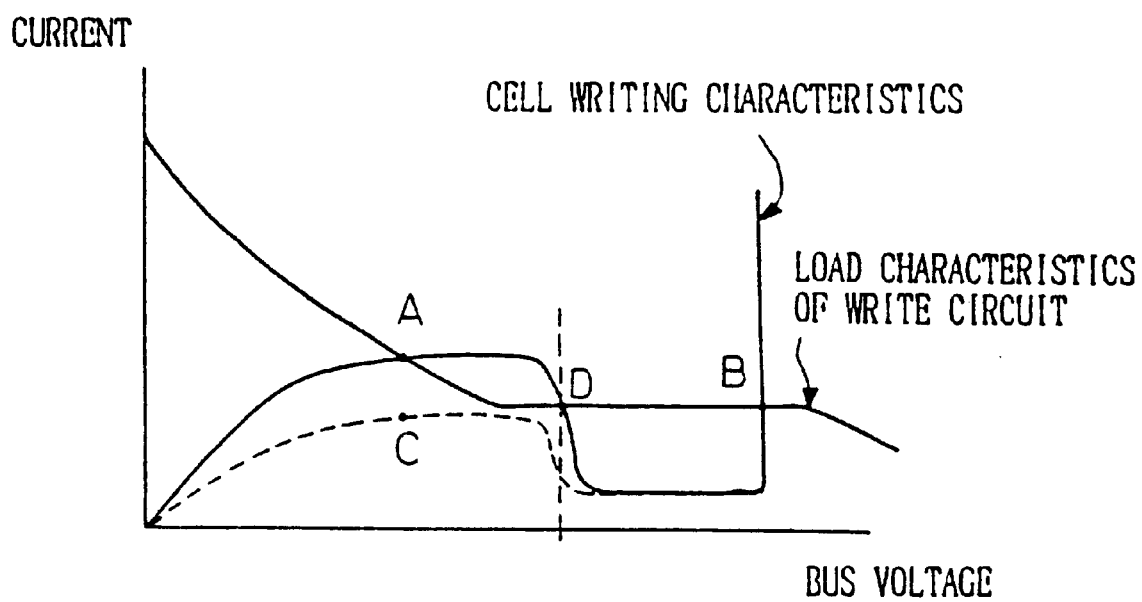
FIG. 10 is a diagram showing an example of write characteristics curves of the semiconductor memory device of FIG. 2.

FIG. 10 shows the write characteristics of a semiconductor memory device (a flash memory).

The related art mentioned above provides a write drain voltage by increasing the power source voltage Vcc. Meanwhile, the bit line driving capacity of the write circuit 116 is limited, so that the potential of a bit line decreases when a large current is supplied to the bit line. When an overerased cell transistor is present, the write characteristic curve of the overerased cell transistor may cross a load curve of the write circuit 116 in a write impossible region A, as indicated with continuous lines in FIG. 10. If this happens, a write operation will be disabled. The write operation is enabled only between points D and B. A word line voltage for an erase or write verify operation is usually provided by dropping the external write voltage. Since the related art employs no external write voltage, it is difficult for the related art to carry out the verify operation. If some cell transistors are overerased, it is difficult to restore normal operation by replacing the overerased cell transistors with spare cell transistors. Namely, the normal operation will never resume by replacing word lines containing the overerased cells with redundant word lines. In this case, the overerased cells may be rewritten to cancel the overerased state and restore the normal operation. The overerased cells, however, pass a larger current around a point A of FIG. 10 to make such writing difficult.

Below, the preferred embodiments of a semiconductor memory device according to the present invention will be explained, with reference to the accompanying drawings.

First, a semiconductor memory device according to a first aspect of the present invention will be explained with reference to FIGS. 11 to 19.

Figure 11:
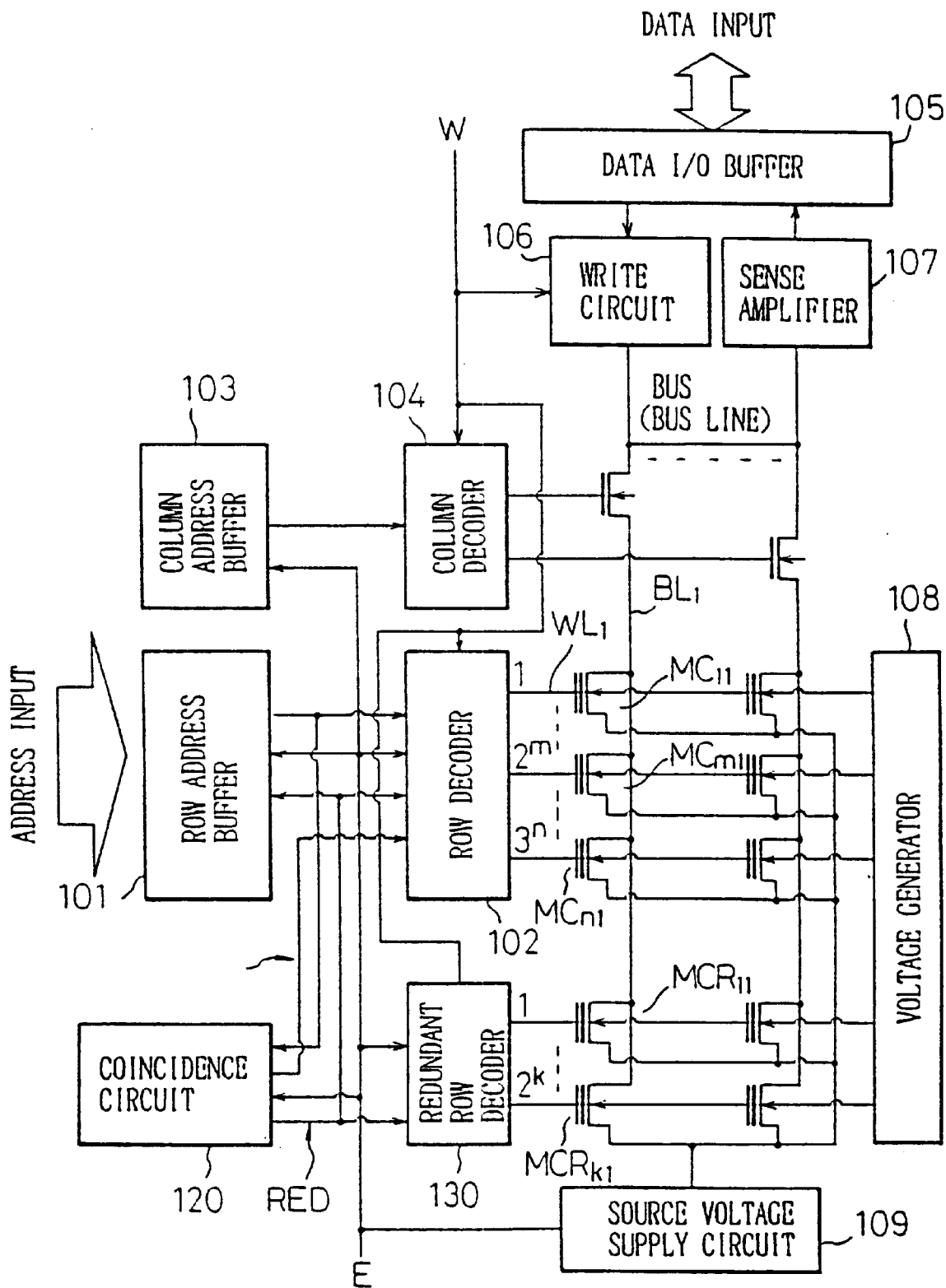
FIG. 11 is a circuit block diagram showing an embodiment of a semiconductor memory device according to the first aspect of the present invention.

FIG. 11 shows the semiconductor memory device (flash memory) according to the first aspect of the present invention. This memory differs from the conventional semiconductor memory device of FIG. 2 in that it additionally has a coincidence circuit 120 for comparing an input address with a defective address, and a redundant row decoder 130. A row address buffer 101, a row decoder 102, a column address buffer 103, a column decoder 104, a data I/O buffer 105, a write circuit 106, a sense amplifier 107, a negative voltage generator 108, and a source voltage supply circuit 109 of this embodiment correspond to the row address buffer 111, row decoder 112, column address buffer 113, column decoder 114, data I/O buffer 115, write circuit 116, sense amplifier 117, negative voltage generator 118, and source voltage supply circuit 119 of the related art of FIG. 2. The row address buffer 101, the row decoder 102, and the coincidence circuit 120 act as a first means for simultaneously selecting a block of word lines. Row address buffer 101, row decoder 102, coincidence circuit 120, and redundant row decoder 130 act as a second means for deselecting a first block of word line, as will be discussed below.

The operation of the embodiment will now be explained. When writing or reading data to or from a memory cell (cell transistor) of the semiconductor memory device, the coincidence circuit 120 compares an input address with each defective address stored therein. If they agree with each other, the coincidence circuit 120 provides the row address buffer 101 and redundant row decoder 130 with an output signal to put the row decoder 102 in an unselected state and the redundant row decoder 130 in a selected state. This enables a redundant cell to be accessed instead of a defective cell. When erasing data from the semiconductor memory device, an erase control signal E of high level H is provided to the column address buffer 103, row address buffer 101, row decoder 102, coincidence circuit 120, and redundant row decoder 130.

If there is no defective cell (transistor) in a memory cell array, i.e., if the redundancy is not used, a normal erase operation is carried out as previously explained. A redundancy control signal RED from the coincidence circuit 120 indicates no redundancy.

If there is a defective cell, the coincidence circuit 120 stores the address of the defective cell. In this embodiment, there are $2^n$ word lines in total, and $2^m$ word lines among the $2^n$ word lines form an erase block. The embodiment employs $2^k$ redundant (spare) word lines. To write or read data, the number of bits of defective address storage elements in the coincidence circuit 120 must be "n–k." Since an erase block includes $2^m$ word lines, the number of address bits necessary for selecting the erase block is "n–m." When erasing data, "n–m" addresses are provided to select a block of $2^m$ word lines. The input addresses are compared with upper "n–m" address bits among the "n–k" address bits stored in the coincidence circuit 120. If they agree with each other, it is determined that the erase block of $2^k$ word lines includes a defective cell.

Address information representing the block of $2^k$ word lines including the defective cell among the block of $2^m$ word lines is given by the remaining "m–k" address bits stored in the coincidence circuit 120. Consequently, the row decoder 102 sets the block of $2^k$ word lines specified with the "m–k" address bits among the block of $2^m$ word lines to be unselected. When the coincidence of "n–m" address bits is found in erasing $2^m$ word lines, the redundant row decoder 130 is activated to erase the $2^k$ redundant word lines.

Figure 12:
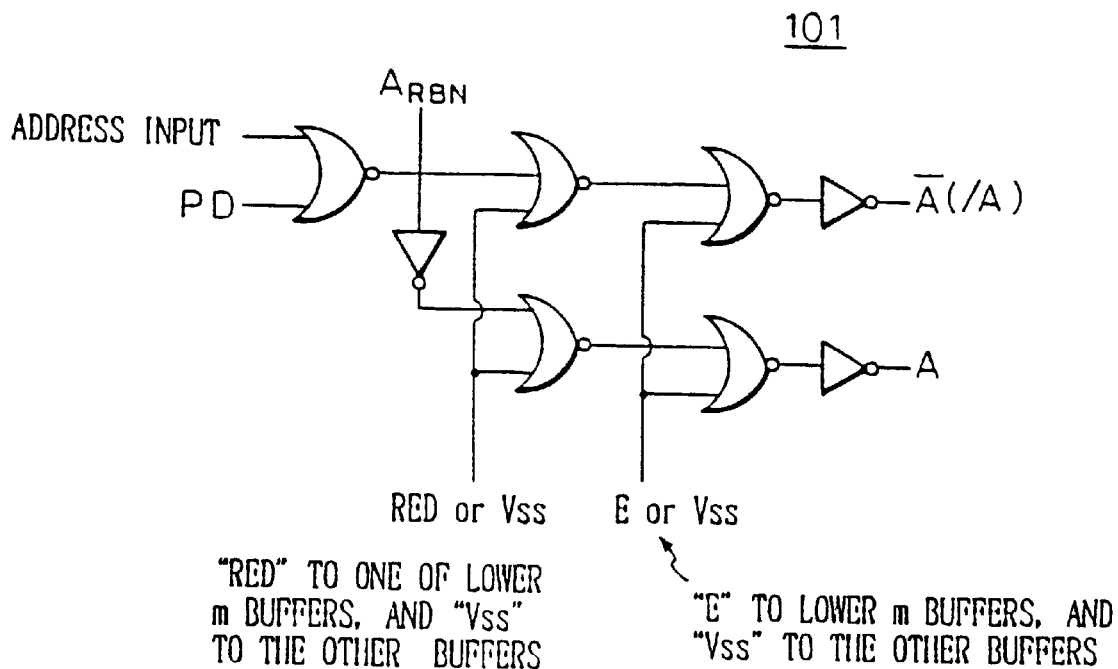
FIG. 12 is a circuit diagram showing a row address buffer of the semiconductor memory device of FIG. 11.
Figure 13:
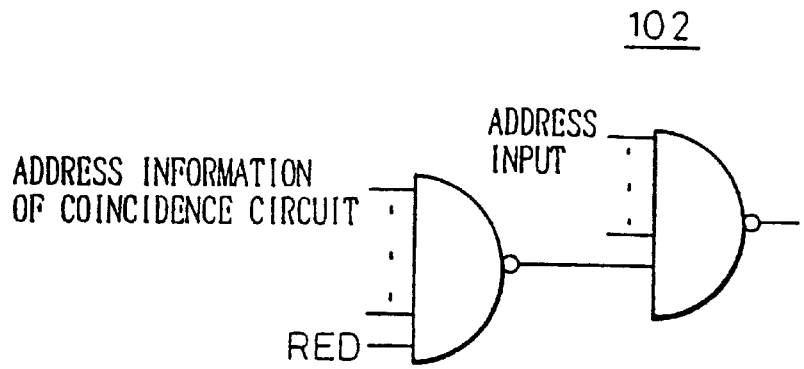
FIG. 13 is a circuit diagram showing a row decoder of the semiconductor memory device of FIG. 11.
Figure 14:
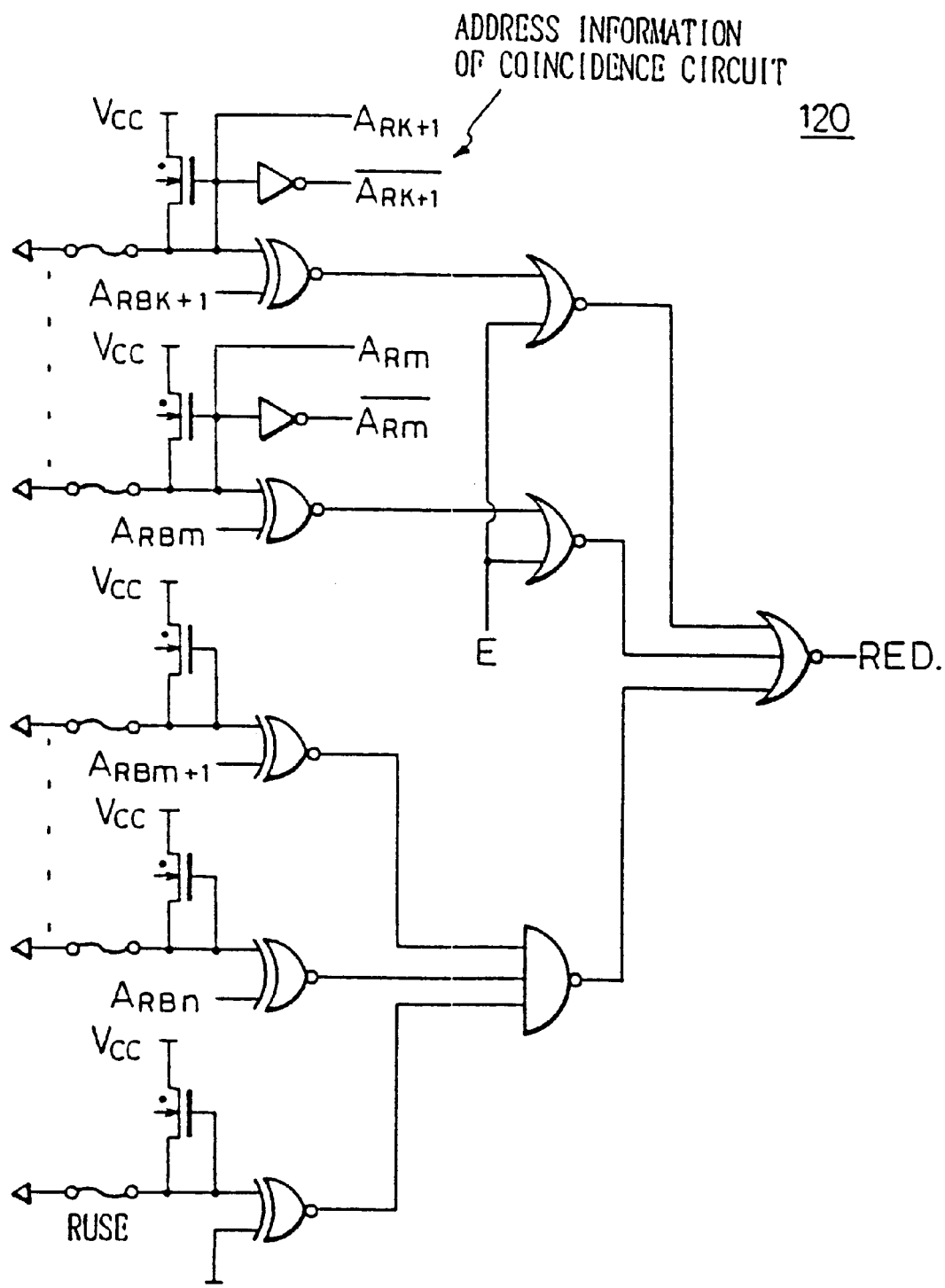
FIG. 14 is a circuit diagram showing a coincidence circuit of the semiconductor memory device of FIG. 11.

FIGS. 12 to 14 show essential parts of the row address buffer 101, row decoder 102, and coincidence circuit 120 of the semiconductor memory device of FIG. 11.

In FIG. 12, there are "n" buffers in the row address buffer 101. Lower "m" buffers receive the erase control signal E to select $2^m$ word lines in an erase operation. Any one of the m buffers receives the redundancy control signal RED. If this signal is high level H in a write or read operation, it means that an input address agrees with a defective address, and therefore, the word line WL is set to be unselected.

The redundancy control signal RED is an output signal of the coincidence circuit 120 of FIG. 14. The coincidence circuit 120 includes address storage fuses used to specify a block of $2^k$ word lines among the $2^n$ word lines, and a fuse RUSE used to store the state of use of redundancy. Since the erase control signal E is at low level L except in an erase operation, the redundancy control signal RED becomes high level H only when all pieces of fuse information agree with input information pieces. In the erase operation, the redundancy control signal RED becomes high level H if upper "n–m" addresses $A_{RBm+1}$ to $A_{RBa}$ coincide with input addresses. Fuse data of "m–k" addresses $A_{RBk+1}$ to $A_{RBm}$ are provided directly to a NAND gate of FIG. 13. As a result, a block of $2^k$ word lines among a block of $2^m$ word lines is set to be unselected. The redundancy control signal RED is also provided to the redundant row decoder 130. In this way, an optional block of $2^k$ word lines in an erase block of $2^m$ word lines is replaceable with a block of redundant (spare) word lines.

If a memory cell is overerased in the semiconductor memory device (flash memory), it deteriorates the yield. The bit lines of the semiconductor memory device are shared by the redundant cells and real cells, and therefore, it is impossible to save the overerased cell by replacing it with the redundant cell. For example, if a memory cell (cell transistor) $MC_{11}$ is overerased in FIG. 11, the cell $MC_{11}$ may be replaced with a redundant cell $MCR_{11}$. In this case, however, the overerased cell $MC_{11}$ passes current even when a word line WL1 is at low level L. If this happens, data "0" of a cell existing on the bit line BL1 will not be correctly read. This problem is easily solved by writing data "0" in the overerased cell $MC_{11}$ before replacing it with the redundant cell $MCR_{11}$. Namely, electrons are injected into the floating gate of the cell $MC_{11}$ before replacing it with the redundant cell.

The overerasing of a memory cell will be explained with reference to FIG. 10, which shows the write characteristics curve of a semiconductor memory device. The floating gate of an overerased cell is positively charged to increase a current at a point A on the curve, thus disabling data write. To solve this problem, it is necessary to control the gate level of any cell when writing data to the cell, such that a current flowing through the cell does not exceed the load curve of the write circuit 106 around the point A. This is easily achieved by continuously providing pulses to a corresponding word line WL during the data write. When the word line WL receives the pulses, it surely realizes a curve C indicated with a dotted line in FIG. 10 when moving from low level L to high level H, or from high level H to low level L. Consequently, the data write is enabled irrespective of the condition of the floating gate.

Figure 15:
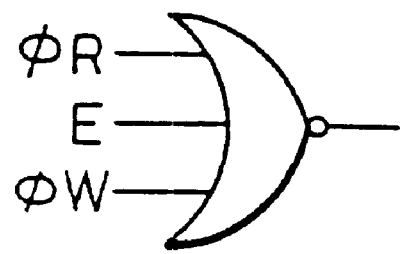
FIG. 15 is a circuit diagram showing an essential part of a row decoder of the semiconductor memory device of FIG. 11.
Figure 16:
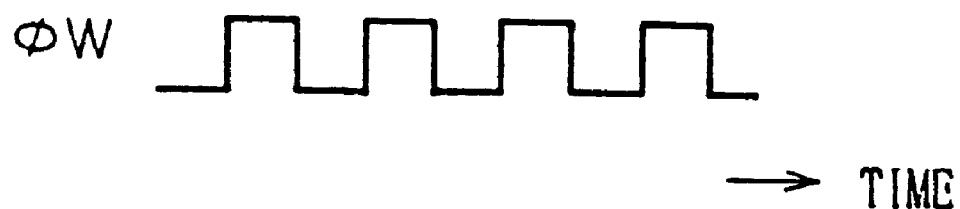
FIG. 16 is a diagram showing a waveform of a signal applied to the circuit of FIG. 15.

FIG. 15 shows an essential part of an example of the row decoder 102 of the semiconductor memory device of FIG. 11, and corresponds to the input portion B of the row decoder 112 of the conventional semiconductor memory device of FIG. 5. A NOR gate of FIG. 15 receives a signal φW whose waveform is shown in FIG. 16. With this signal, the potential of the node $N_2$ of FIG. 5 is continuously oscillated between zero and a write potential, to continuously provide pulses to a word line WL. Instead of applying the pulses, it is possible to employ a circuit for applying an intermediate voltage to a word line. Generally, a write or erase operation of a semiconductor memory device is followed by a verify operation, which is achieved by applying a verify voltage to read data from a word line. The verify voltage must be constant irrespective of changes in environmental conditions of the semiconductor memory device such as a change in a power source voltage. Accordingly, it is practical to provide the verify voltage by increasing a reference potential (Vss) of the semiconductor memory device.

Figure 17:
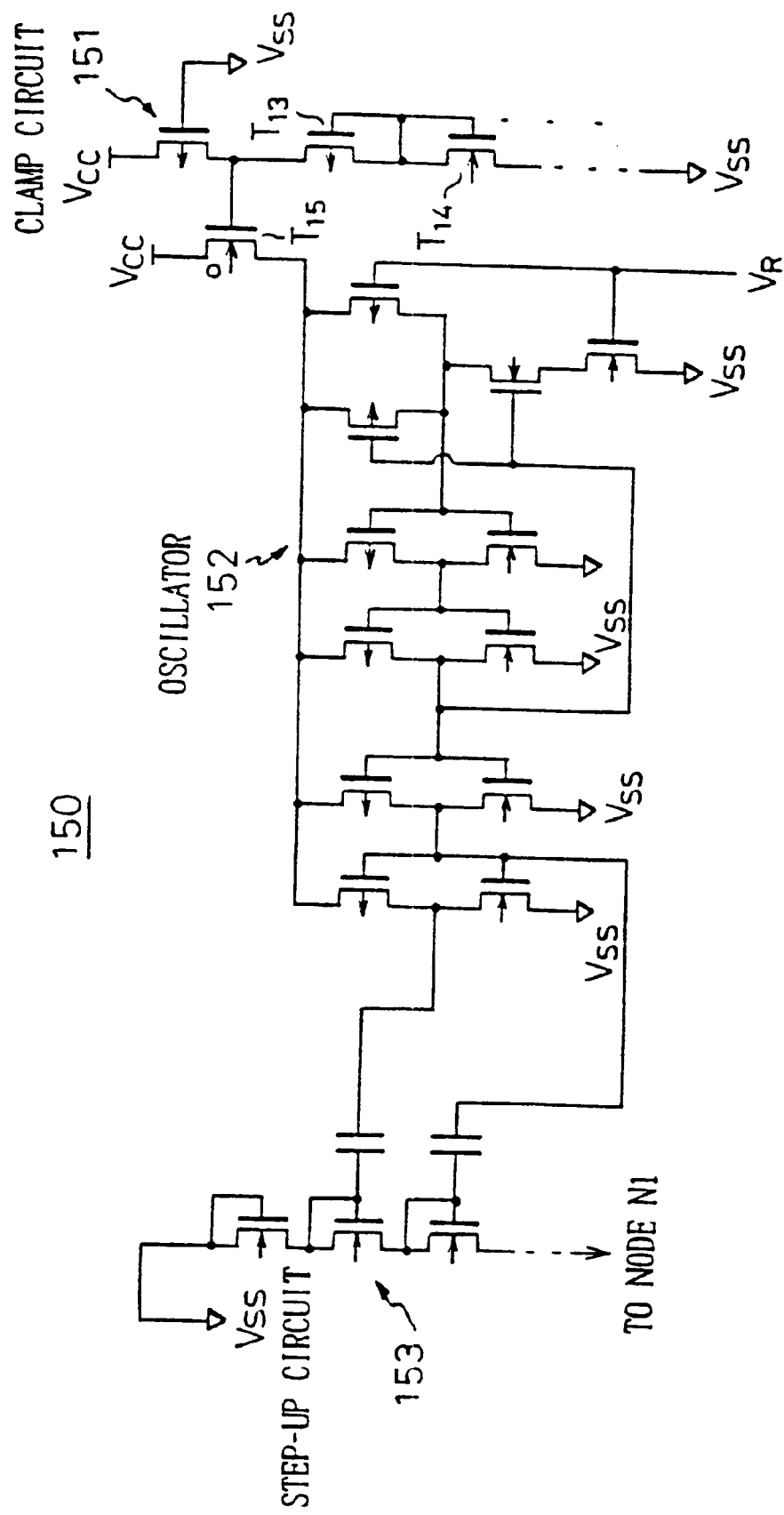
FIG. 17 is a circuit diagram showing a verify voltage generator of the semiconductor memory device of FIG. 11.

FIG. 17 shows an example of a verify voltage generator 150 of the semiconductor memory device of FIG. 11. This circuit generates a verify voltage applied to the node $N_1$ of the row decoder circuit 112 (102) of FIG. 5.

The verify voltage generator 150 of FIG. 17 includes a clamp circuit 151, an oscillator 152, and a step-up circuit 153. The clamp circuit 151 has transistors $T_{13}$ and $T_{14}$ for determining a clamp voltage. These transistors are p-channel type and n-channel type MOS (MIS) transistors connected in series as diodes. According to a CMOS process, the channel regions of transistors are simultaneously fabricated to cancel fluctuations in the thresholds of the transistors. This results in stabilizing the clamp voltage.

An n-channel type MOS transistor $T_{15}$ has a threshold of about zero volts. This transistor provides the oscillator 152 with the clamp voltage. The step-up circuit 153 operates according to a low power source voltage (ground voltage) Vss. A verify voltage at the node $N_1$, therefore, is stable regardless of the power source voltage. Erase and write verify operations are carried out with different voltages. Different clamp voltages are easily produced by changing the number of transistors ($T_{13}$, $T_{14}$, ...) of the clamp circuit 151. A signal VR becomes high level H when carrying out the verify operation. The verify operation may be carried out by changing a decision current of the sense amplifier.

Figure 18:
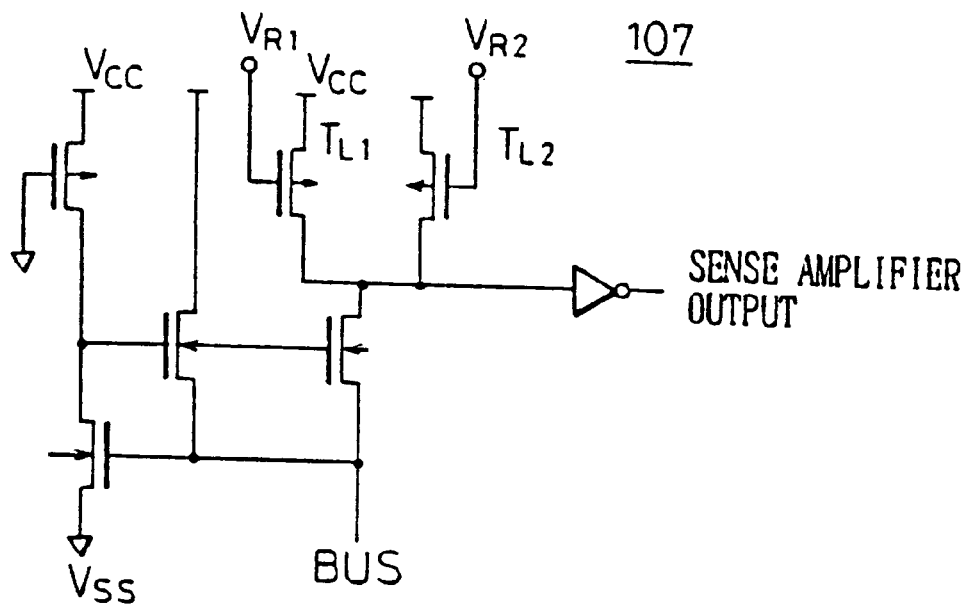
FIG. 18 is a circuit diagram showing a sense amplifier of the semiconductor memory device of FIG. 11.

FIG. 18 shows an example of the sense amplifier 107 of the flash memory of FIG. 11. The sense amplifier 107 has p-channel type transistors $T_{L^1}$ and $T_{L^2}$ serving as load transistors. The current supply capacities of these transistors are $T_{L^1} > T_{L^2}$. The flash memory has three modes, i.e., an erase verify mode, a normal read mode, and a write verify mode. The total capacity of the load transistors for these modes must be the erase verify mode>the normal read mode>the write verify mode. The circuit of FIG. 18 realizes this relationship with $V_{R^1} = V_{R^2} = L$ for the erase verify mode, $V_{R^1} = L$ and $V_{R^2} = H$ for the normal read mode, and $V_{R^1} = H$ and $V_{R^2} = L$ for the write verify mode.

Figure 19:
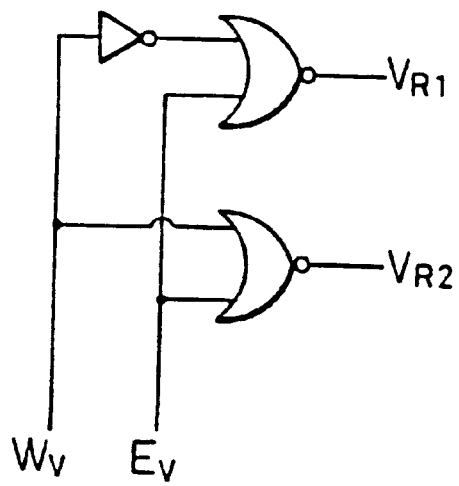
FIG. 19 is a circuit diagram showing a logic circuit for producing a control signal to the sense amplifier of FIG. 18.

FIG. 19 shows an example of a logic circuit for providing the control signals $V_{R^1}$ and $V_{R^2}$ to the sense amplifier of FIG. 18. The logic circuit of FIG. 19 involves a write verify signal WV and an erase verify signal EV. This circuit is advantageous in simplifying the power source of the row decoder when producing the verify voltage. The load control logic circuit is applicable for the erase verify operation of the flash memory.

A semiconductor memory device according to a second aspect of the present invention will be explained with reference to FIGS. 20 to 28.

Figure 20:
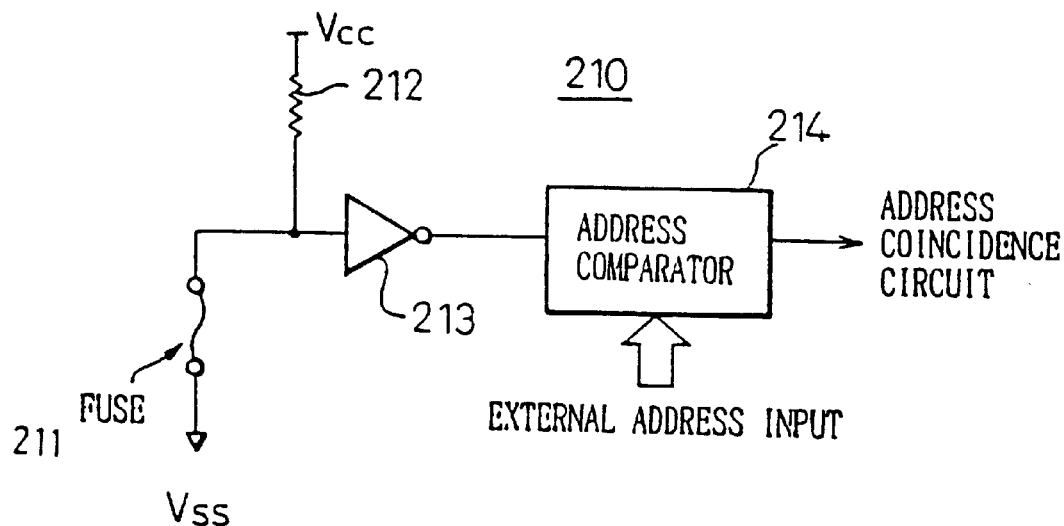
FIG. 20 is a circuit block diagram showing a redundant circuit of a conventional semiconductor memory device related to the second aspect of the present invention.

FIG. 20 shows a redundant circuit 210 of a conventional semiconductor memory device related to the second aspect of the present invention. The redundant circuit 210 has a fuse 211 serving as defective address specifying means for storing a defective address. The fuse 211 is connected or disconnected to provide high (H) or low (L) level. A comparator 214 compares the information of the fuse 211 with an external input address, and if they agree with each other, provides an address coincidence signal of, for example, high level H.

Figure 21:
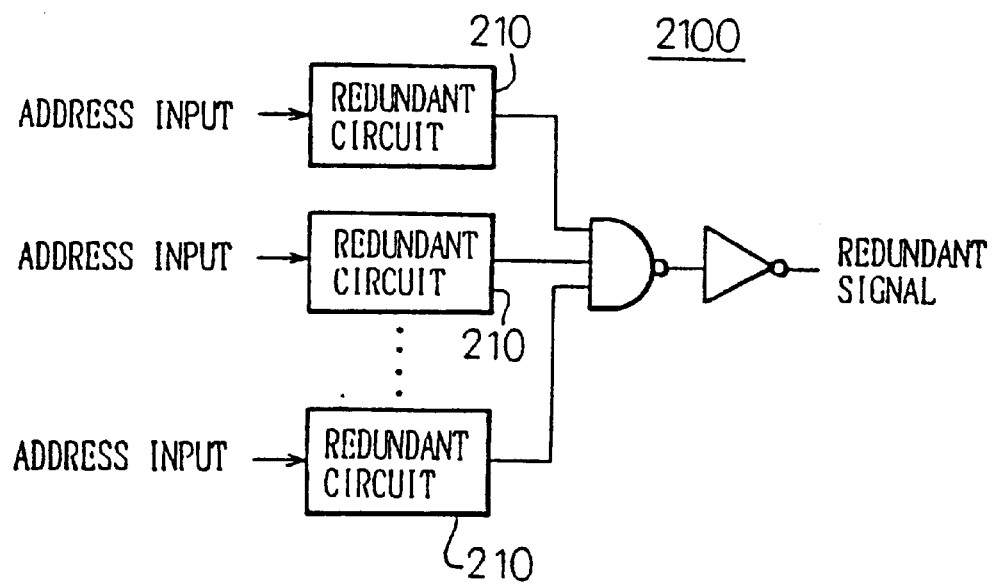
FIG. 21 is a circuit block diagram showing an arrangement of the conventional redundant circuits of FIG. 20.

FIG. 21 shows a redundant arrangement 2100, which contains a plurality of the conventional redundant circuits of FIG. 20. Outputs of the redundant circuits 210 are passed through a NAND gate and an inverter, to provide a redundancy signal. Only when each input address agrees with the information of the fuse 211 in every redundant circuit 210, is a redundancy signal of high level H provided to read data from redundant cells.

Figure 22:
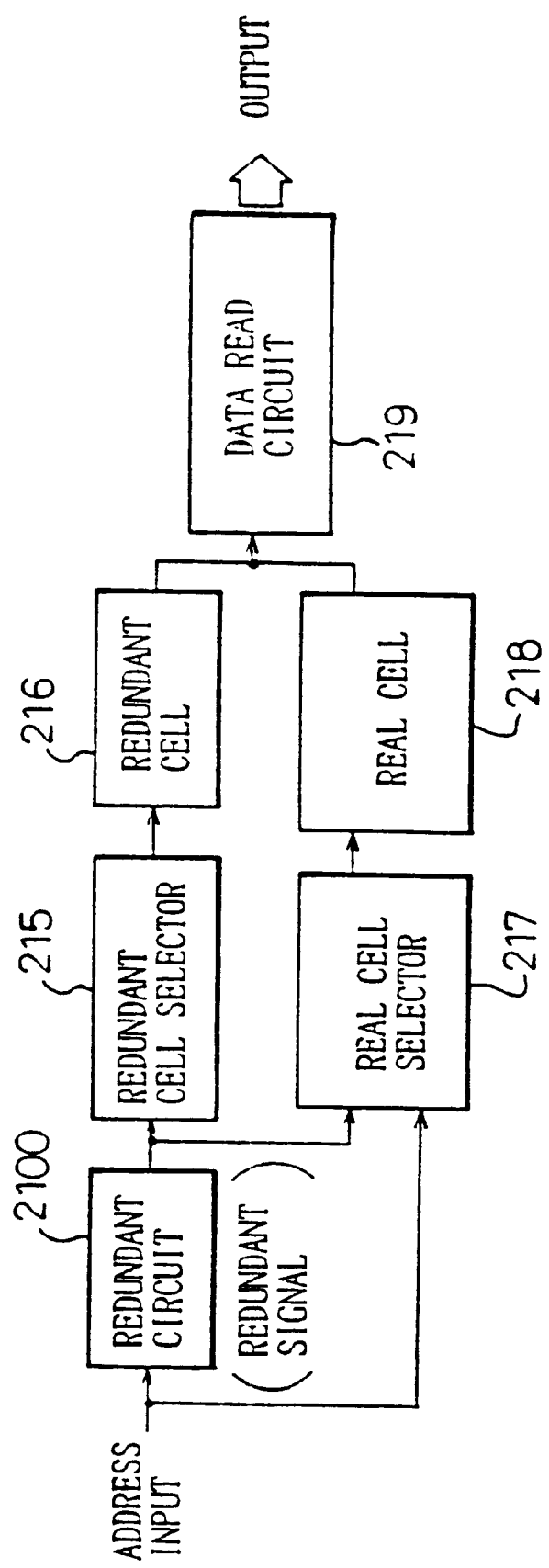
FIG. 22 is a block diagram showing a semiconductor memory device employing the conventional redundant circuit of FIG. 20.

FIG. 22 shows a semiconductor memory device employing the conventional redundant arrangement 2100 of FIG. 21. When the redundant arrangement 2100 provides a redundancy signal, a real cell selector 217 prohibits reading of a real cell 218, and a redundant cell selector 215 reads a redundant cell 216, thereby replacing a defective real cell with a redundant cell. A data read circuit 219 reads data out of a selected one of the redundant cell 216 and real cell 218.

According to the prior art of FIGS. 20 to 22, each fuse (211) requires one address comparator (214). When many defective memory cells must be replaced with redundant cells, a corresponding numbers of fuses and address comparators must be prepared. This results in increase in the size and cost of a semiconductor chip.

In this way, the conventional redundant technique has a problem of increasing the size and cost of a semiconductor memory device when the numbers of memory cells and redundant cells increase.

An object of a second aspect of the present invention is to provide a semiconductor memory device for reducing the size of the semiconductor memory device, to improve the yield of large capacity semiconductor memories and reduce the cost thereof.

Figure 23:
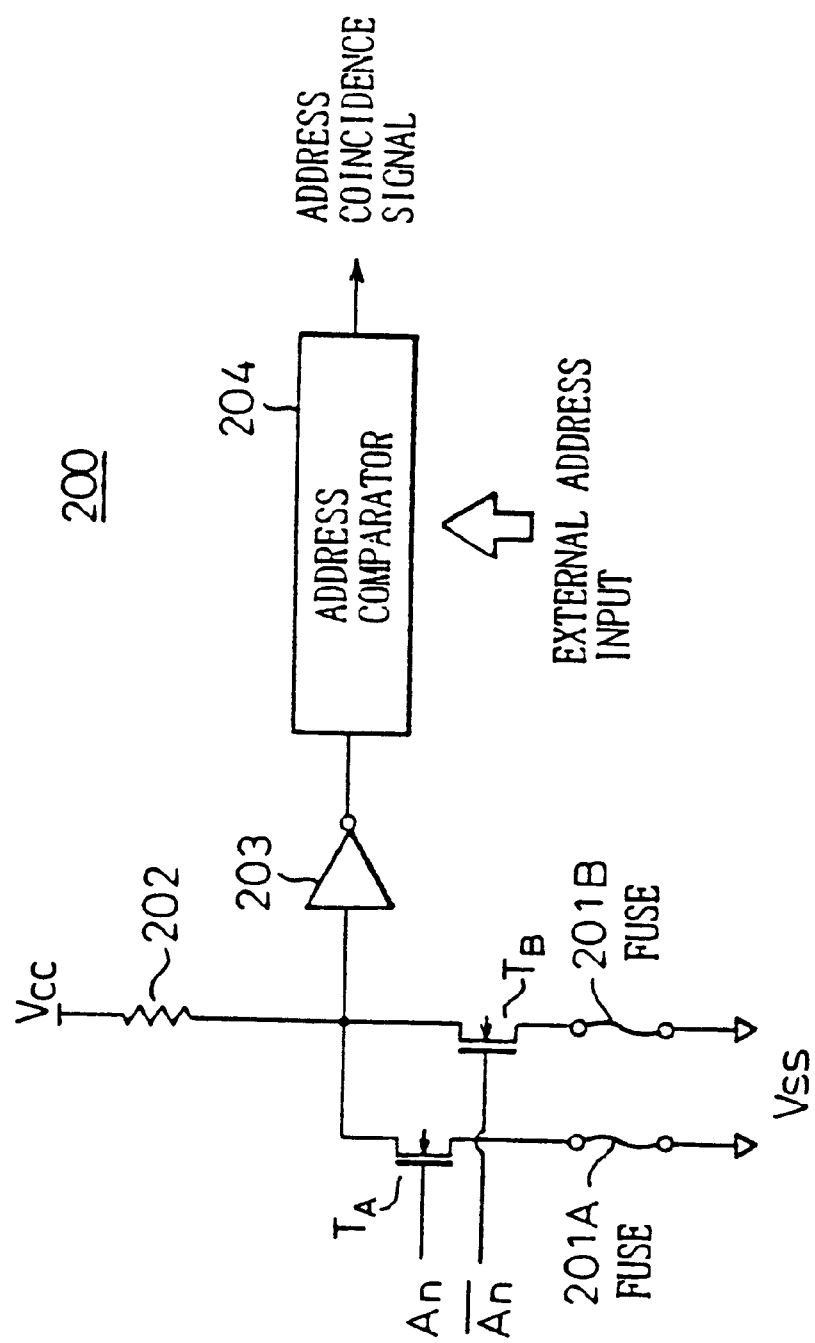
FIG. 23 is a circuit block diagram showing an embodiment of a redundant circuit for the semiconductor memory device according to the second aspect of the present invention.

FIG. 23 shows a redundant circuit of a semiconductor memory device according to the second aspect of the present invention. This redundant circuit 200 employs a transistor $T_A$, a fuse 201A, a transistor $T_B$, and a fuse 201B in place of the fuse 211 of the conventional redundant circuit 210 of FIG. 20. The fuses 201A and 201B are selected according to the logic of an external input address An (/An, an inversion of the address An). The address An (/An) is an upper address for selecting one of the blocks of real cells. The fuses 201A and 201B of the redundant circuit 200 share an address comparator 204, to reduce the total number of the address comparators 204 and the size and cost of the semiconductor memory device.

Figure 24:
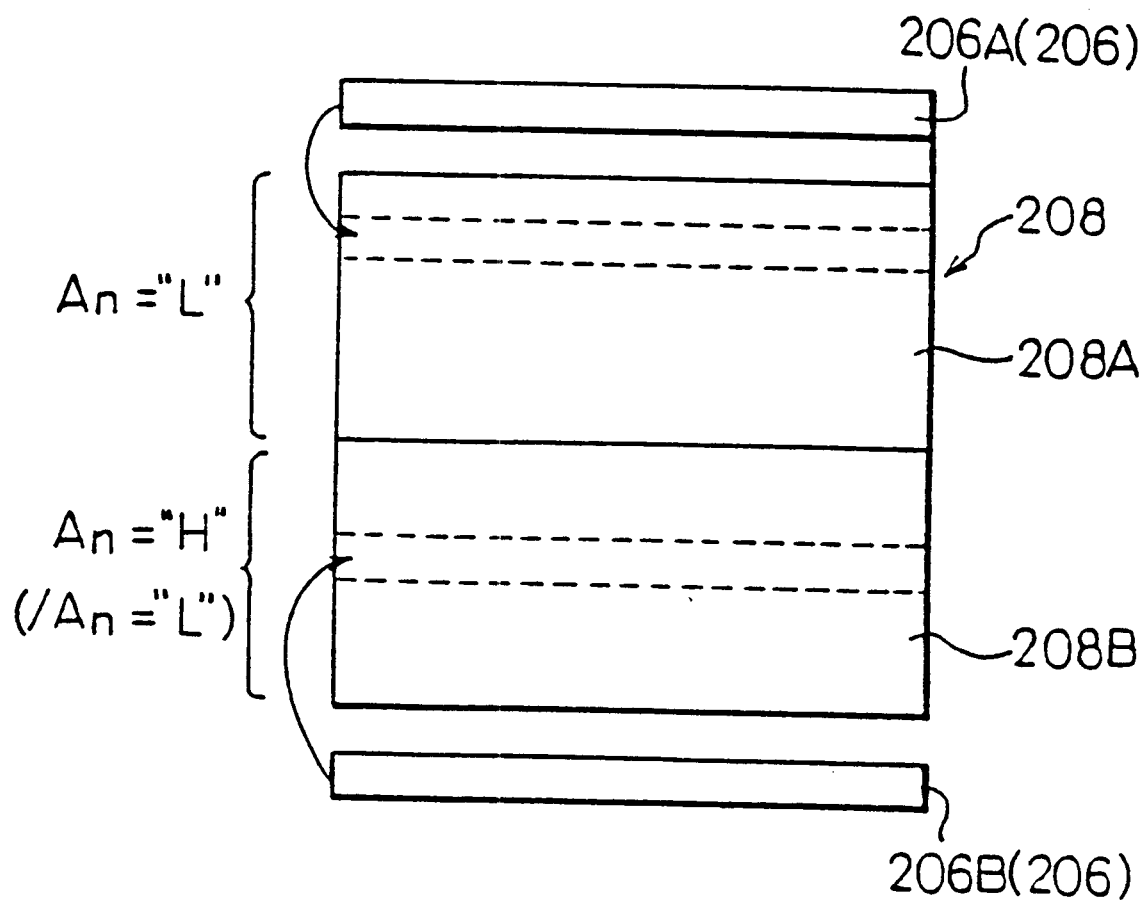
FIG. 24 is a diagram showing real cells and redundant cells of a semiconductor memory device employing the redundant circuit of FIG. 23.

FIG. 24 shows an arrangement of real cells 208 and redundant cells 206 in the semiconductor memory device employing the redundant circuit of FIG. 23. The real cells 208 are divided into a first real cell block 208A to be selected with a block selection address An of low level L, and a second real cell block 208B to be selected with a block selection address An of high level H and an inverted address /An of low level L. The redundant cells 206 are divided into a first redundant cell block 206A to be replaced with some cells of the first real cell block 208A, and a second redundant cell block 206B to be replaced with some cells of the second real cell block 208B. When an address (An-1, An-2, . . . , etc) that is common for the real cell blocks 206A and 206B includes a defective cell, a predetermined number of real cells including the defective cell among the block specified by the block address An are replaced with the redundant cells.

Figure 25:
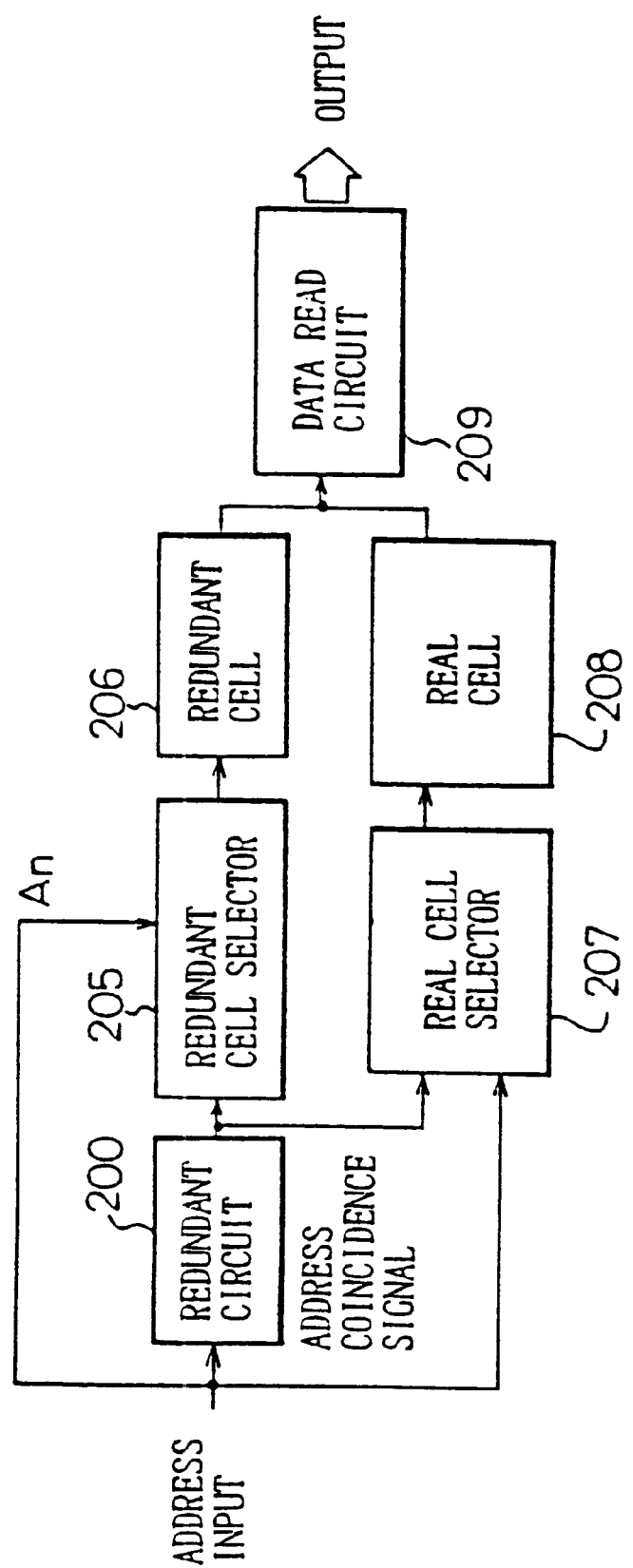
FIG. 25 is a block diagram showing a semiconductor memory device employing the redundant circuit of FIG. 23.

FIG. 25 shows a semiconductor memory device employing the redundant circuit of FIG. 23 according to the present invention. When the redundant circuit 200 provides a redundancy signal, a real cell selector 207 prohibits the reading of a real cell 208, and a redundant cell selector 205 reads a redundant cell 206. Unlike the semiconductor memory device of FIG. 22, the semiconductor memory device of FIG. 25 provides an address (a block selection address An) input to the redundant cell selector 205 as well, which selects one of the redundant cells 206A and 206B corresponding to the fuses 201A and 201B of the redundant circuit 200 in response to a logic of the address An. Namely, the redundant cell selector 205 receives the block address An and selects one of the redundant cells 206A and 206B corresponding to one of the real cell blocks 208A and 208B that is selected according to the block address An. In FIG. 25, a data read circuit 209 reads data out of a selected one of the redundant cell 206 and real cell 208.

As explained above, the address comparator 204 is shared by the redundant cell blocks 206A and 206B when replacing a defective real cell with a redundant cell. In the above explanation, the block selection address An is of one bit for selecting one of the two real cell blocks. The block selection address may involve two bits An and An-1 to select one of the four real cell blocks and one of the four redundant cell blocks.

Figure 26:
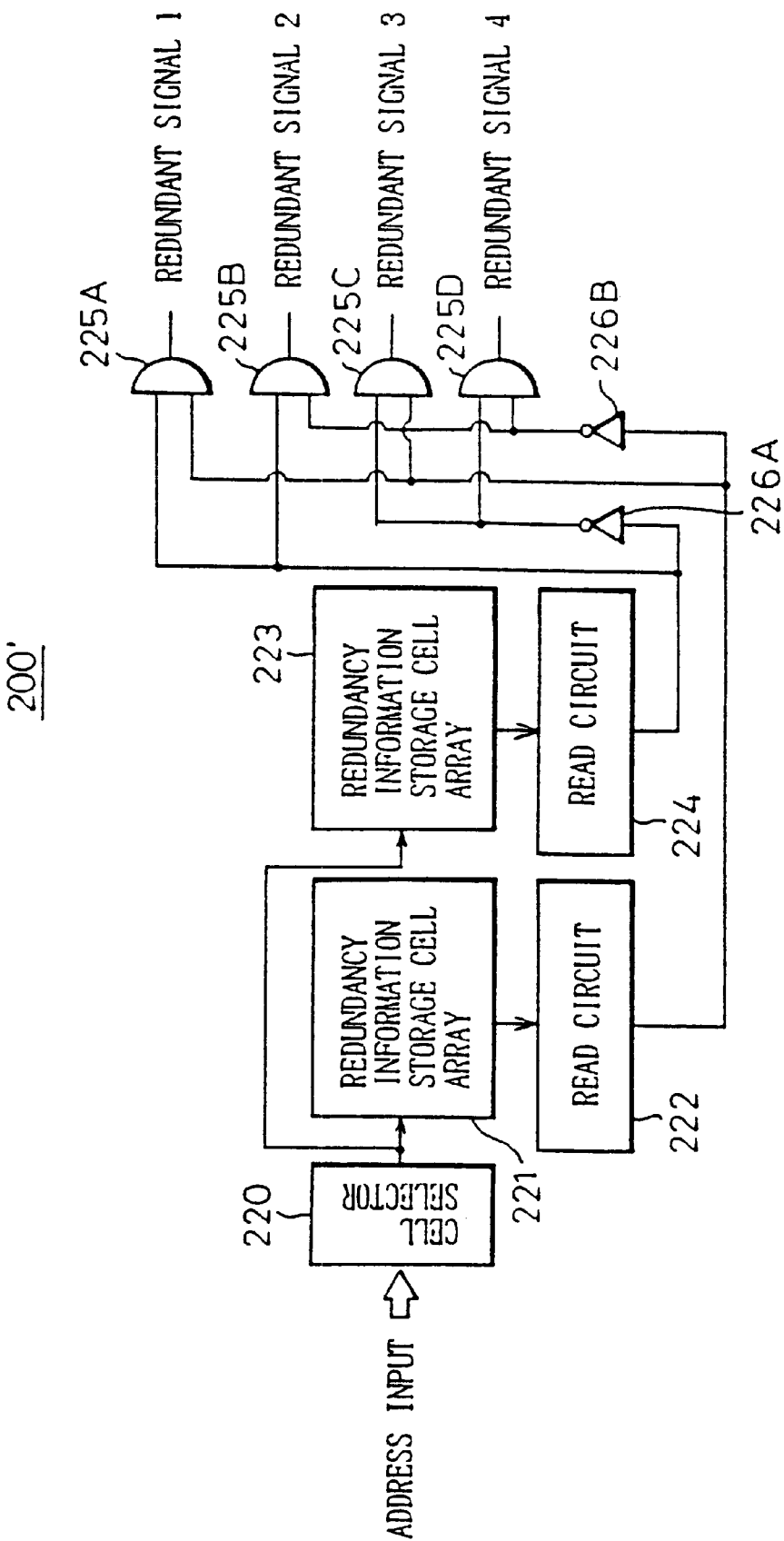
FIG. 26 is a circuit block diagram showing another embodiment of a redundant circuit for the semiconductor memory device according to the second aspect of the present invention.

FIG. 26 shows another redundant circuit 200' for a semiconductor memory device according to the second aspect of the present invention. The redundant circuit 200' includes a cell selector 220, redundant information storing cell arrays 221 and 223, and read circuits 222 and 224.

The redundant circuit 200' has the two redundant information storing cell arrays 221 and 223 and the two read circuits 222 and 224.

Each of the redundant information storing cell arrays 221 and 223 includes nonvolatile memory cell transistors such as EPROMs and is used to write data to defective addresses according to external input addresses. The cell selector 220 selects one of the cell arrays 221 and 223 according to an address input. The read circuits 222 and 224 provide four redundancy signals through AND gates 225A, 225B, 225C, and 225D, and through inverters 226A and 226B. This embodiment provides two-bit data from the two cell arrays 221 and 223 in parallel, so that four defective cells can be replaced with redundant cells. It is also possible to provide data of three bits or more in parallel.

Figure 27:
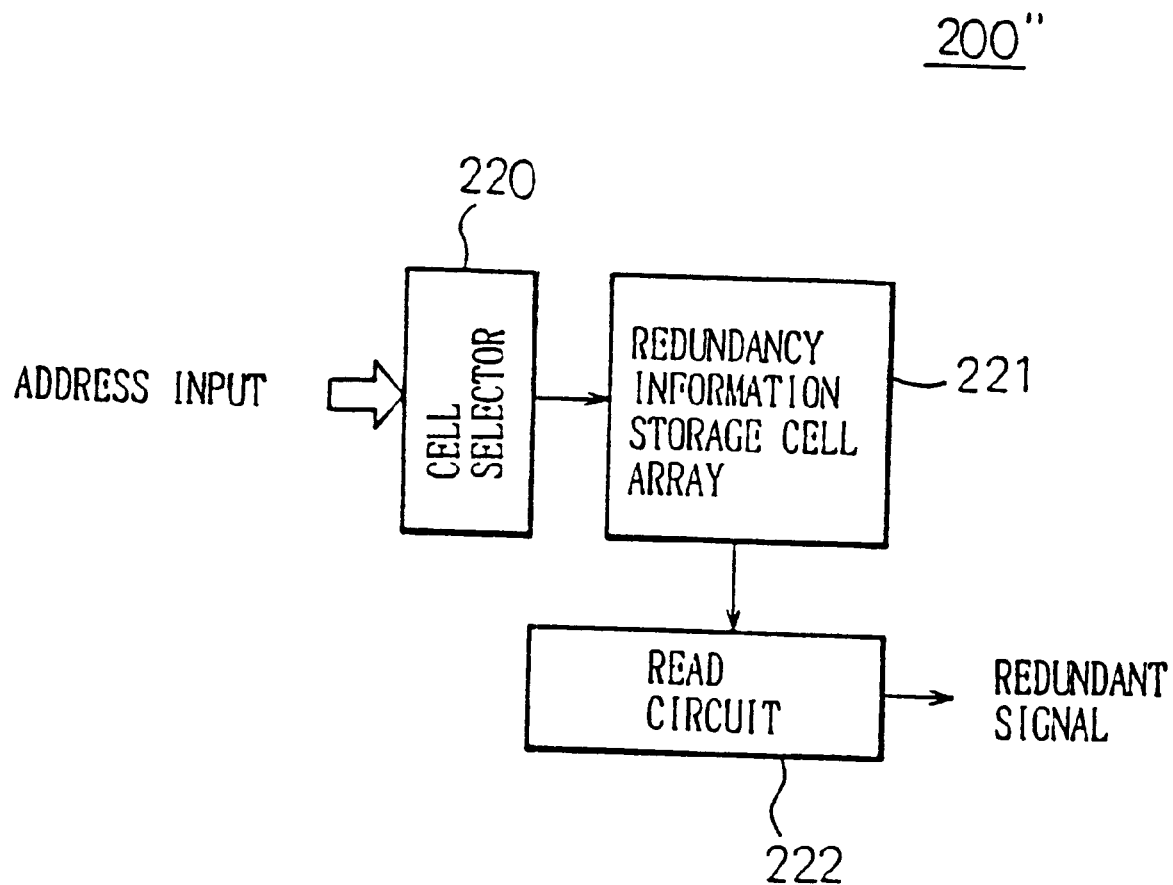
FIG. 27 is a circuit block diagram showing still another embodiment of a redundant circuit for the semiconductor memory device according to the second aspect of the present invention.
Figure 28:
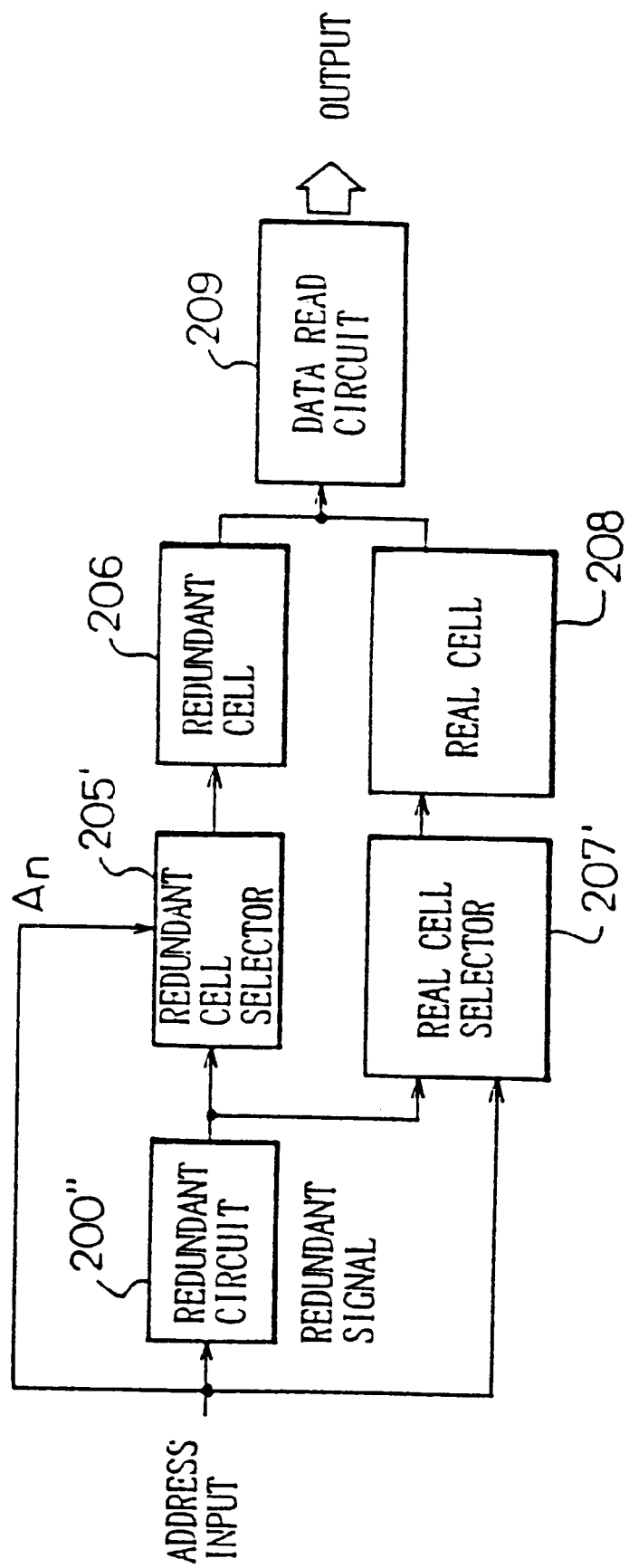
FIG. 28 is a block diagram showing a semiconductor memory device employing the redundant circuit of FIG. 27.

FIG. 27 shows still another redundant circuit 200" according to the second aspect of the present invention, and FIG. 28 shows a semiconductor memory device employing the redundant circuit of FIG. 27.

Unlike the redundant circuit 200' of FIG. 26 that provides a plurality of bits (two bits) in parallel, the embodiment of FIG. 27 provides a single bit to replace a plurality of defective real cells 208 with redundant cells 206.

The redundant circuit 200" reads a single bit according to an address input, and according to a logic of the bit, provides a redundancy signal. In the semiconductor memory device of FIG. 28, the redundant circuit 200" provides a redundancy signal to a redundant cell selector 205' and to a real cell selector 207'. A part (a real cell block selecting address An) of an address input is also supplied to the selectors 205' and 207', to determine redundant cells to be replaced with defective real cells.

A semiconductor memory device according to a third aspect of the present invention will be explained with reference to FIGS. 29 to 32.

Some electrically erasable programmable nonvolatile semiconductor memories such as flash memories have an internal algorithm for automatically writing or erasing data.

The writing or erasing of data to a flash memory is carried out by applying a write pulse and by executing a read operation (a verify operation). If the read operation determines that the writing is insufficient, the write pulse is again applied to repeat the writing or erasing. The maximum number of write pulses applied, i.e., the number of verify operations is prescribed in specifications. These write, erase, and verify operations are externally controlled.

Some flash memories incorporate an algorithm for automatically carrying out the write or erase operation. A user of this kind of flash memories is usually provided with the allowable number of write or erase operations.

Delivery tests of the flash memories sometimes require repetitive rewrite operations. This results in deteriorating the number of write or erase operations guaranteed for a user. In this case, the flash memories that have passed the delivery test may fail on the user side before reaching the guaranteed number of write or erase operations.

An object of a third aspect of the present invention is to provide a semiconductor memory device for carrying out a delivery test of a semiconductor memory device with "n" rewrite operations at the maximum, and taking into account deterioration due to an increase in the number of rewrite operations, to guarantee the maximum rewrite operations N (N>n) for a user.

Figure 29:
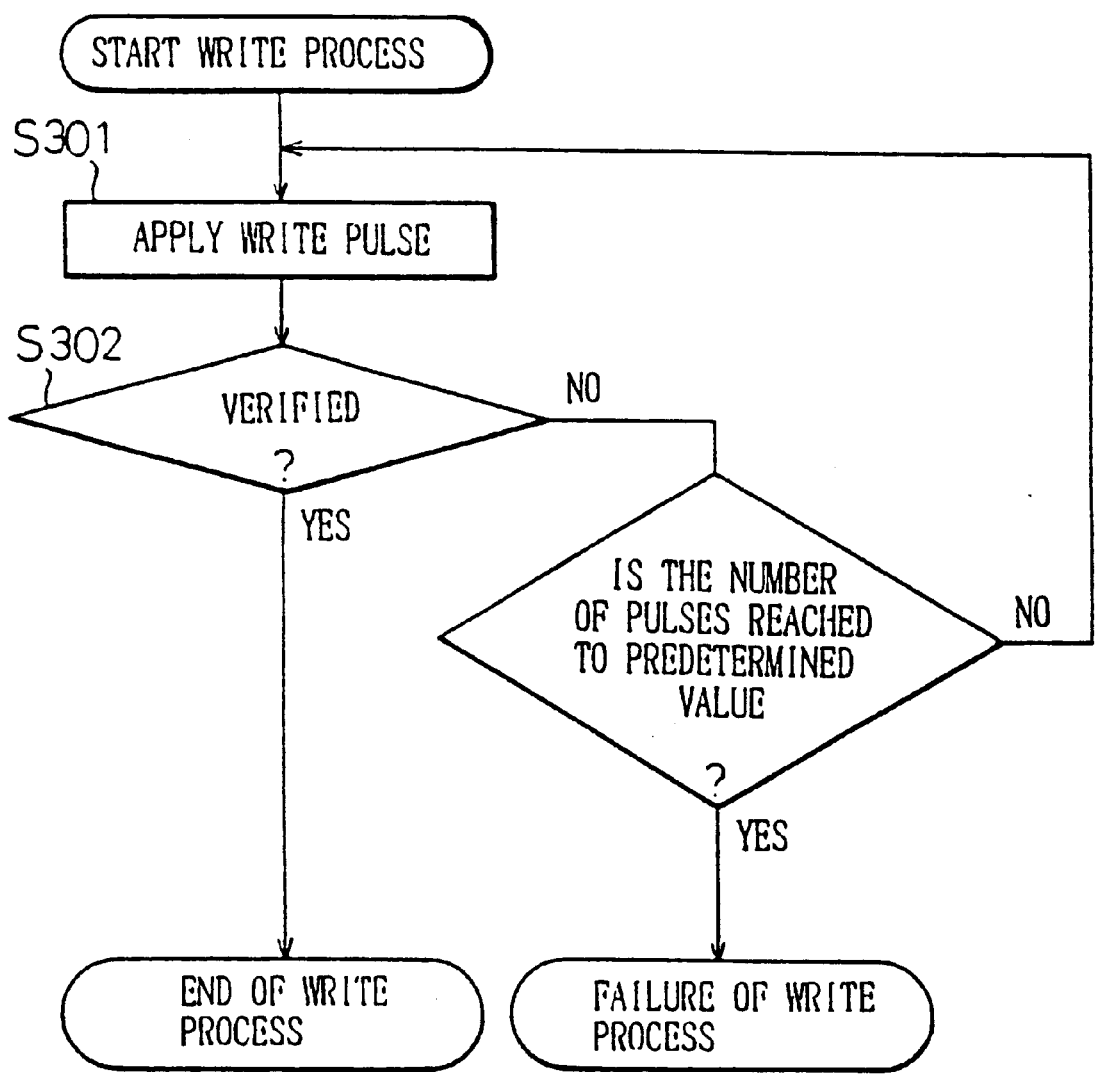
FIG. 29 is a flowchart showing an example of an internal write algorithm for a semiconductor memory device according to the third aspect of the present invention.

FIG. 29 is a flowchart showing an algorithm to be stored in a semiconductor memory device according to the third aspect of the present invention.

After the start of a write process, step S301 applies a write pulse. Step S302 carries out a verify operation. Namely, step S302 reads written data and determines whether or not the data has been sufficiently written. If the result is sufficient, the write process ends. If it is insufficient, step S303 checks to see whether or not the number of applied write pulses has reached a predetermined number N. If it is NO, steps S301 and S302 are repeated. If it is YES, the write process aborts. Namely, it is determined that the data has not been correctly written to a cell transistor after the application of N write pulses.

In this way, the third aspect of the present invention carries out a delivery test of a semiconductor memory device with "n" write pulses at the maximum, which is smaller than an allowable number "N". Namely, the delivery test is carried out under severer conditions than normal conditions, thereby guaranteeing the allowable number N for a user.

Figure 30:
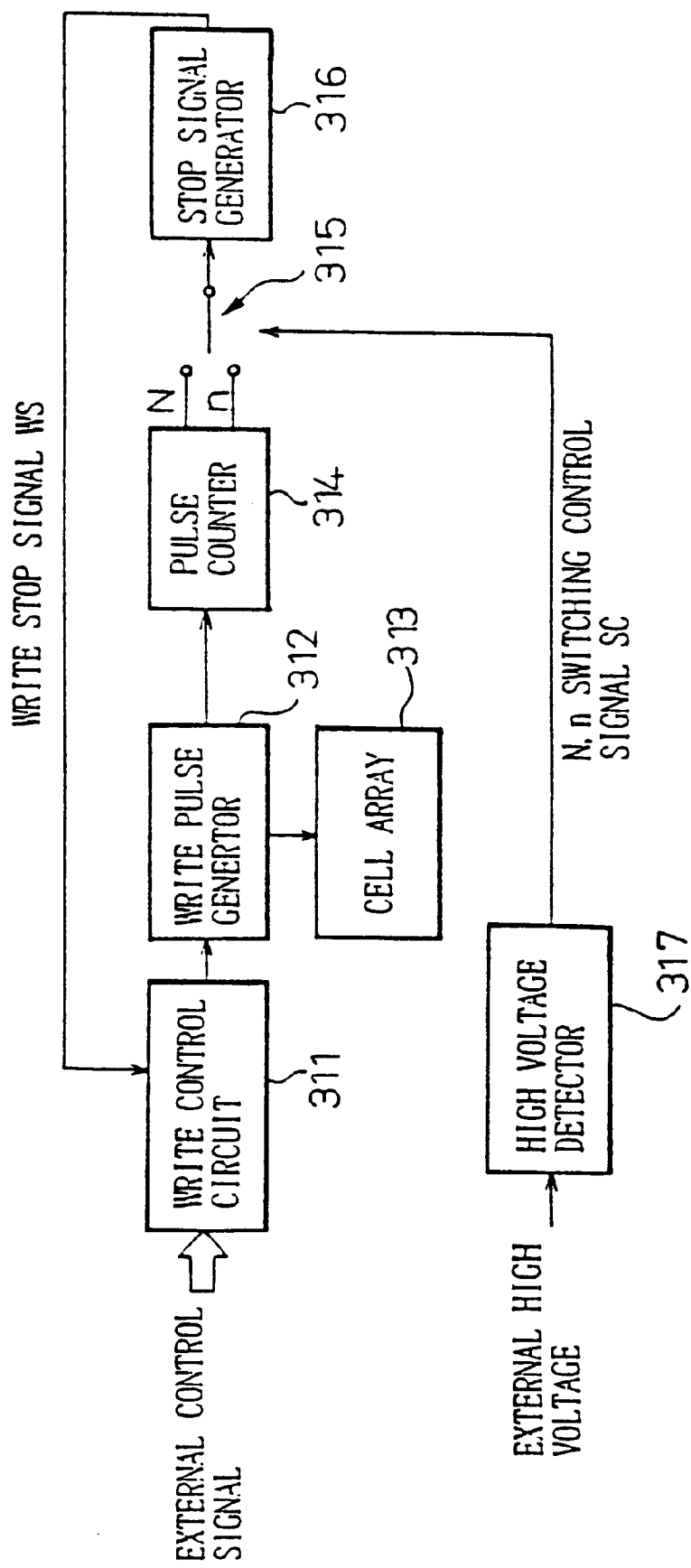
FIG. 30 is a block diagram showing an embodiment of a semiconductor memory device according to the third aspect of the present invention.

FIG. 30 shows a semiconductor memory device according to the third aspect of the present invention. This memory includes a write controller 311, a write pulse generator 312, a cell array 313, a pulse counter 314, a switch 315, a stop signal generator 316, and a high voltage detector 317.

The write controller 311 receives an external control signal and a write stop signal WS, to control the write pulse generator 312 to write data into cell transistors of the cell array 313. The write pulse generator 312 provides a write pulse to the cell array 313 and to the pulse counter 314, which counts the number of write pulses, i.e., the number of verify operations. To easily change a count in the pulse counter 314, direct input wiring to a NAND circuit and output wiring of an inverter may be fabricated in advance, to selectively connect the NAND circuit to the wiring during manufacturing.

The switch 315 is connected to the standard number "N" of pulse applications or to the delivery test maximum "n" (n<N) of pulse applications. According to the number N or n, the stop signal generator 316 provides the write controller 311 with a write stop signal WS. The switching of the switch 315 is controlled in response to a switch control signal SC provided by the high voltage detector 317 depending on whether or not an external high voltage is applied thereto.

Figure 31:
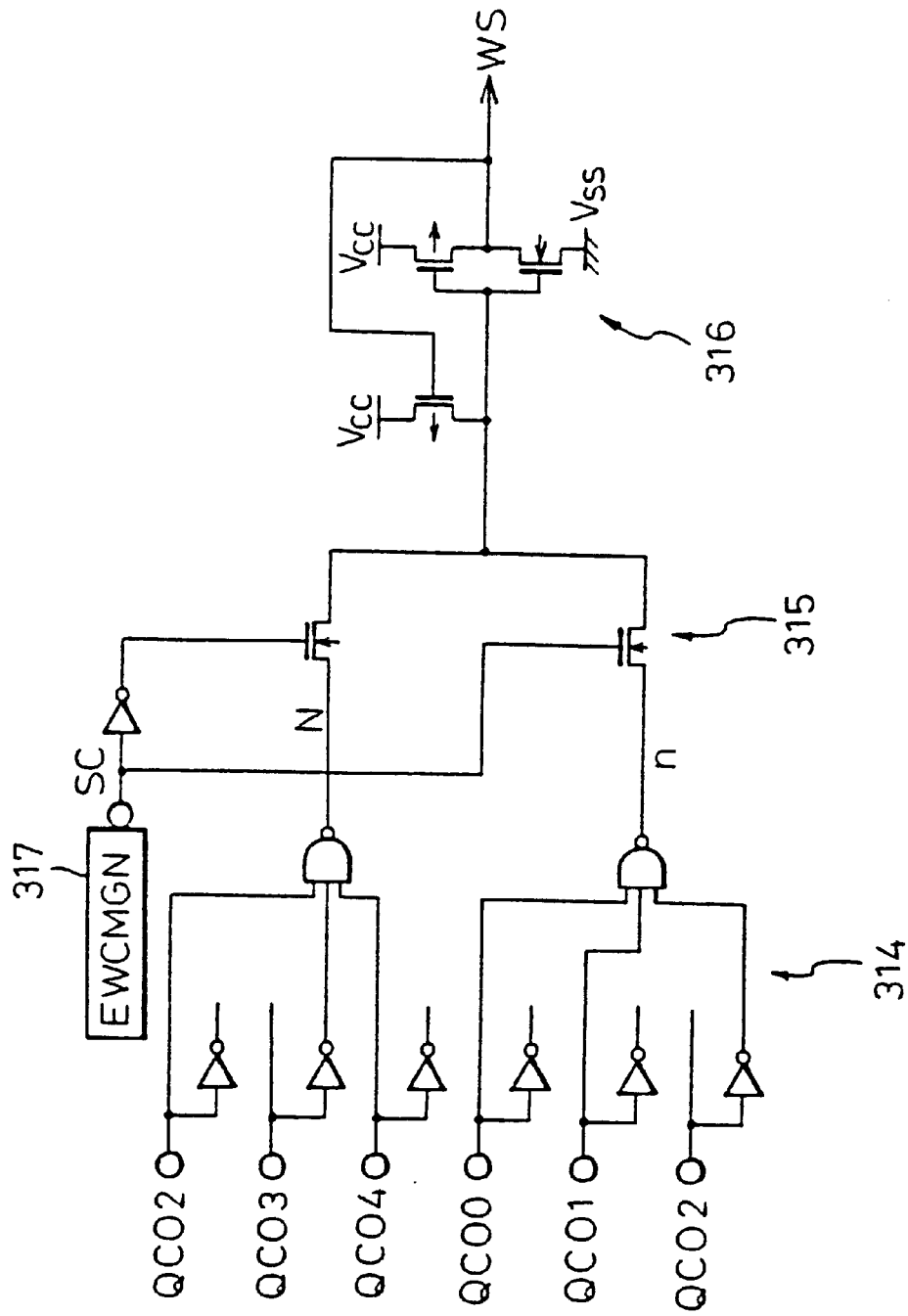
FIG. 31 is a circuit diagram showing an essential part of the semiconductor memory device of FIG. 30.
Figure 32:
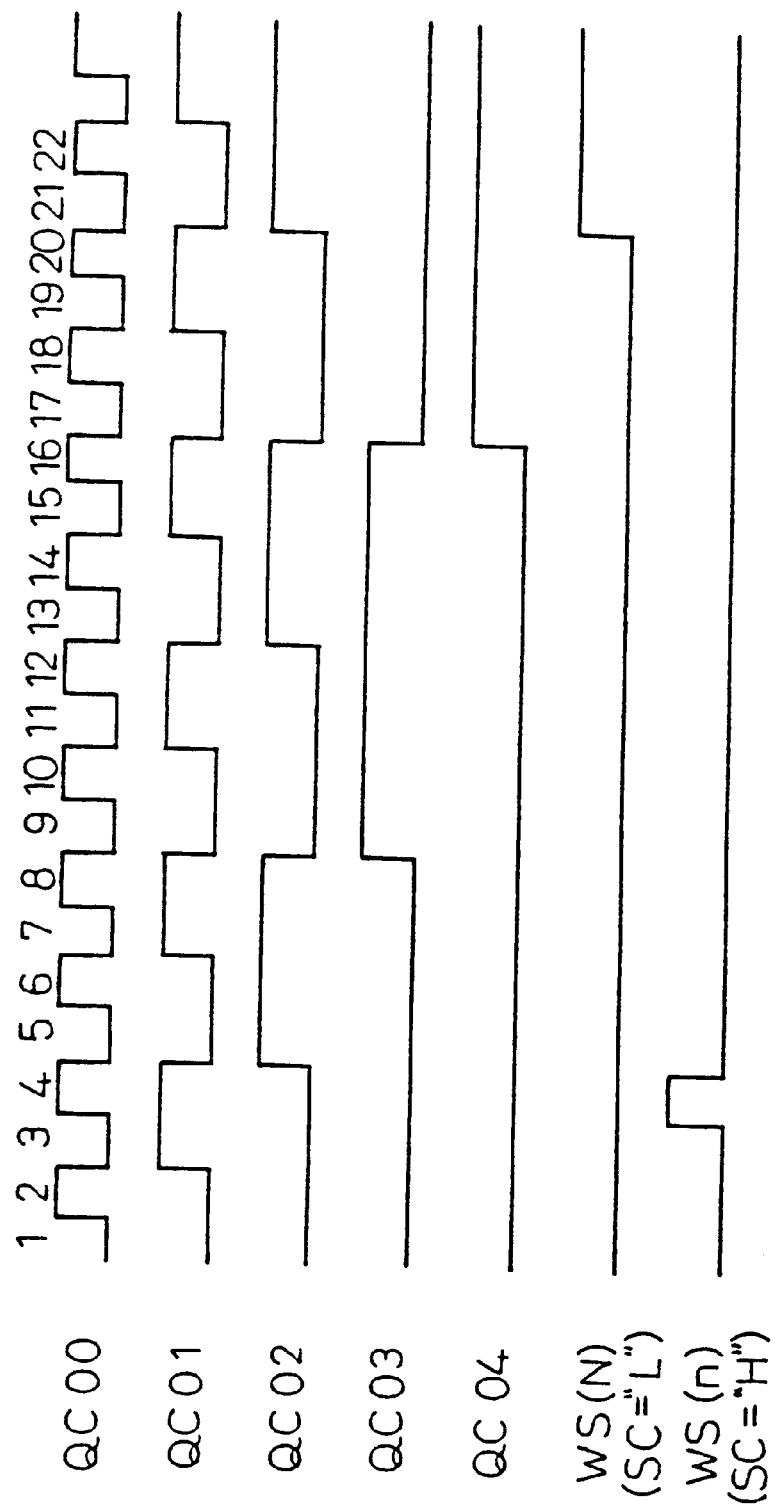
FIG. 32 is a timing chart for explaining the operation of the circuit of FIG. 31.

FIG. 31 shows an essential part of the semiconductor memory device of FIG. 30, and FIG. 32 explains the operation of the circuit of FIG. 31. In FIGS. 31 and 32, a reference mark QCOi is a pulse count signal of each stage.

A stop signal WS(N) corresponding to the standard maximum of pulse applications is prepared according to the pulse count signals QCO2, QCO3, and QCO4. A stop signal WS(n) corresponding to the delivery test maximum of pulse applications is prepared according to the pulse count signals QCO0, QCO1, and QCO2. When switch control signal SC from the high voltage detector (EWCMGN) 317 is at low level L, i.e., when no high voltage is applied, the stop signal WS(N) corresponding to the standard number N is provided with the 21st pulse of the pulse signal QCO0. When the signal SC from the detector 317 is at high level H, i.e., when a high voltage is applied to a given terminal, the stop signal WS(n) corresponding to the delivery test maximum n is provided with the 4th pulse of the pulse signal QCO0.

In the above explanation, the maximum number of write pulses applied until the stop signal WS is provided is changed between the standard number guaranteed for a user and the number for a delivery test. Instead of changing the pulse application numbers, the width of a write pulse may be changed. For example, the width of a write pulse for a delivery test may be shorter than that of a write pulse for standard use, to impose severer conditions on the delivery test. The width of a write pulse for the delivery test may be narrowed once a high voltage is applied to a given terminal. Although the above explanation is related to a write operation, the same is applicable for an erase operation.

In this way, a semiconductor memory device according to the third aspect of the present invention incorporates an internal algorithm that is capable of changing the number of write or erase operations of memory cells. Semiconductor memory devices with this arrangement will rarely fail on the user side once passing a delivery test.

A semiconductor memory device according to a fourth aspect of the present invention will be explained with reference to FIGS. 33 to 36.

Figure 33:
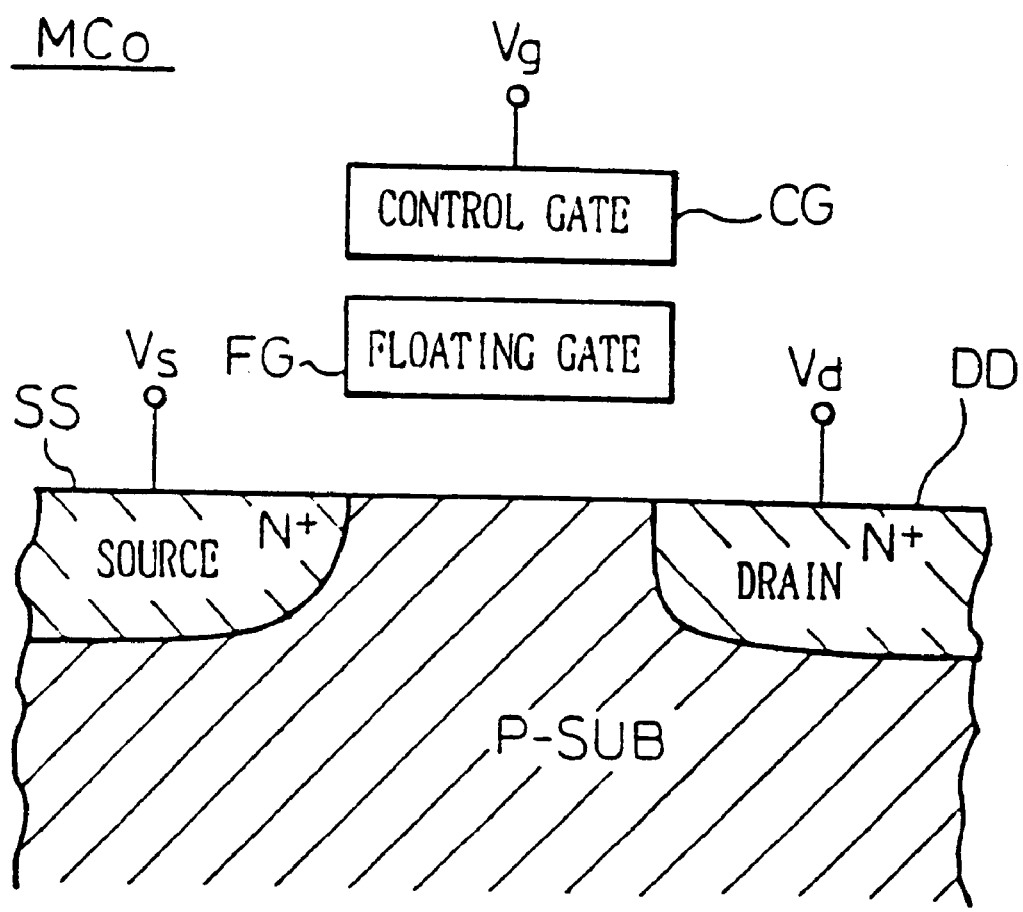
FIG. 33 is diagram for explaining the operation of a memory cell of a semiconductor memory device according to the fourth aspect of the present invention.

FIG. 33 shows a memory cell (MCo) of the semiconductor memory device (flash memory) according to the fourth aspect of the present invention. The memory cell (cell transistor) has a floating gate FG. The floating gate is disposed between a source and a drain and is insulated from other regions. A control gate CG is formed above the floating gate FG.

To read data from the cell transistor, a gate voltage Vg is equalized with a power source voltage Vcc, a drain voltage Vd to about one volt, and a source voltage Vs to a ground level Vss. The data is determined to be "1" or "0" depending on whether or not a drain current flows.

To write data to the cell transistor, the drain voltage Vd applied to a drain DD is set to a high voltage (usually Vcc<high voltage<Vpp), the gate voltage Vg applied to the control gate CG to the write voltage Vpp (up to about +10 volts), and the source voltage Vs applied to a source SS to the ground level Vss. Charges are injected from the drain DD to the floating gate FG, to write data of "0." The write voltage is becoming lower in these days. Accordingly, it is required to effectively apply such low write voltage to the drain.

Figure 34:
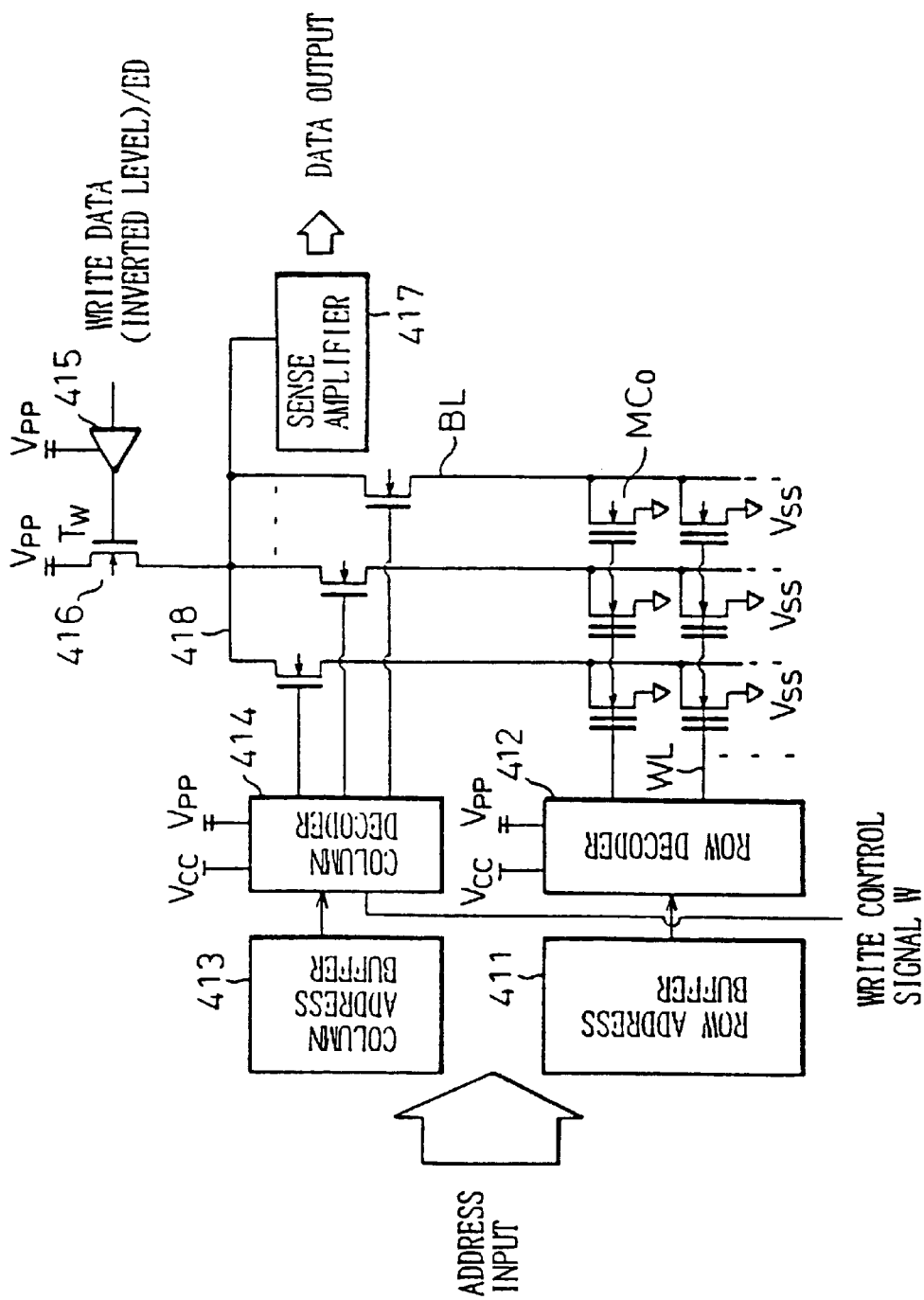
FIG. 34 is a circuit block diagram showing an example of a conventional semiconductor memory device related to the fourth aspect of the present invention.

FIG. 34 shows a conventional flash memory related to the fourth aspect of the present invention. The flash memory includes a row address buffer 411, a row decoder 412, a column address buffer 413, a column decoder 414, a buffer 415, a write voltage supply transistor 416, a sense amplifier 417, and a bus 418. The flash memory also includes bit lines BLs, word lines WLs, write data /WD (inverted level), and a write control signal W.

To read data from a memory cell MCo, a word line WL and a bit line xL are selected according to a row address and a column address, respectively. The sense amplifier 417 checks to see whether or not a current flows through the selected memory cell (cell transistor) MCo, to determine whether data stored in the memory cell is "1" or "0."

To write data to a memory cell MCo, the write control signal W sets word and bit line selection signals to a write voltage Vpp. When write data /WD is provided, the transistor 416 is turned ON so that the write voltage Vpp (decreased by the threshold voltage of the transistor 416) is applied to the bus 418 and to the drain of the memory cell. The flash memory of FIG. 34 employs a sufficiently high voltage as the write voltage Vpp, so that the write voltage supply transistor 416 may be an n-channel type MOS transistor. In this case, the write voltage Vpp is decreased by the threshold voltage of the transistor and is applied to the drain of the cell transistor MCo.

Recent flash memories employ a single power source of, for example, five volts, which requires a reduced write voltage. With such a five-volt single power source, the threshold voltage of the write voltage supply transistor 416 may decrease a supply voltage lower than the write voltage Vpp, to supply an insufficient write voltage to the drain of a memory cell.

An object of the fourth aspect of the present invention is to provide a semiconductor memory device that is capable of supplying a write drain voltage with no influence of the threshold voltage of a write voltage supply transistor, thereby correctly writing data to a memory cell even with a low write voltage.

Figure 35:
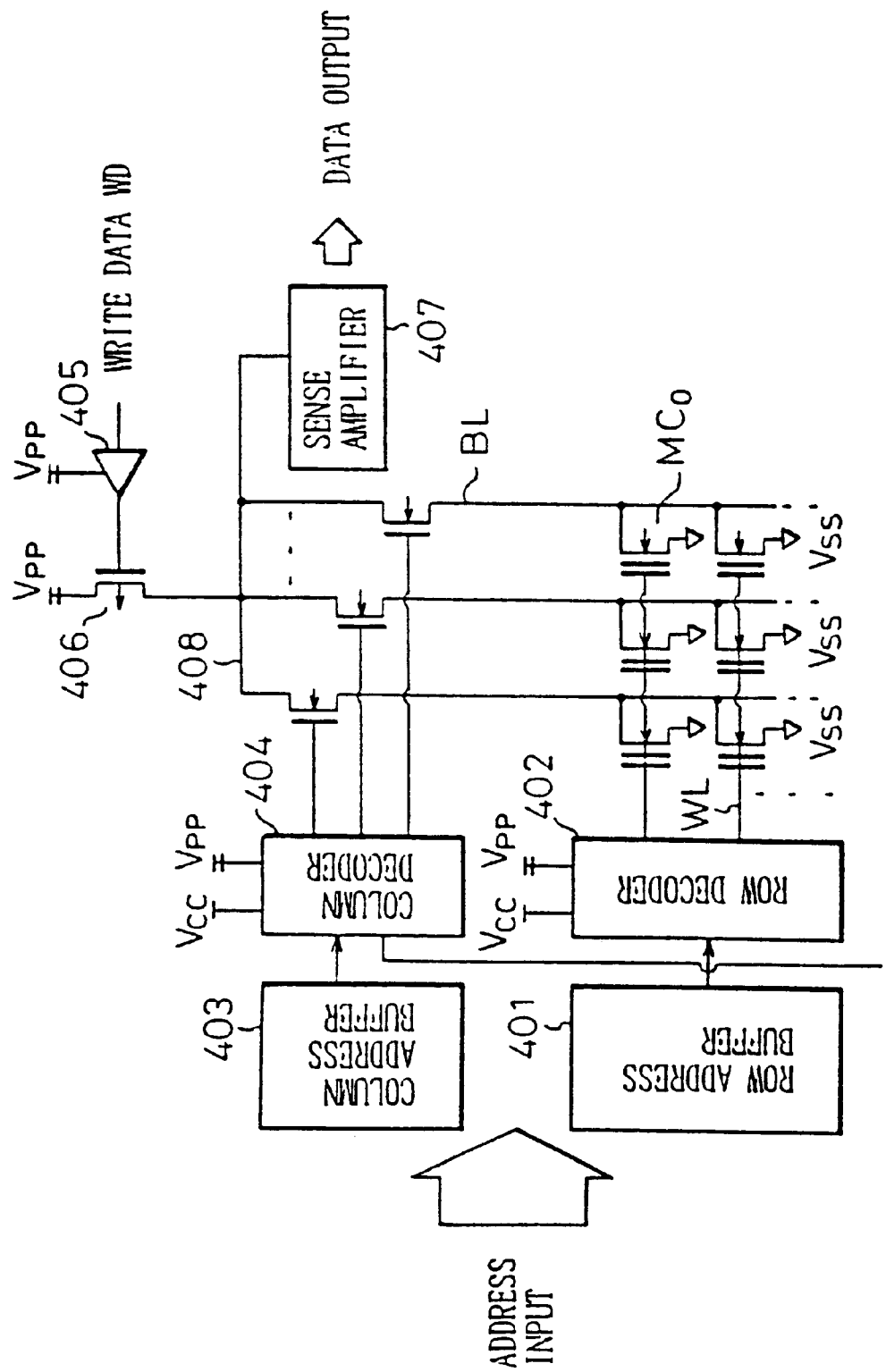
FIG. 35 is a circuit block diagram showing an embodiment of a semiconductor memory device according to the fourth aspect of the present invention.

FIG. 35 shows a semiconductor memory device according to an embodiment of the fourth aspect of the present invention. Unlike the conventional semiconductor memory device of FIG. 34, the semiconductor memory device of FIG. 35 employs a p-channel type MOS transistor 406 as a write voltage supply transistor, and a buffer 405 receives a positive logic signal WD as write data. A row address buffer 401, a row decoder 402, a column address buffer 403, a column decoder 404, and the buffer 405 of FIG. 35 correspond to the row address buffer 411, row decoder 412, column address buffer 413, column decoder 414, and buffer 415 of the related art of FIG. 34, respectively.

The semiconductor memory device of FIG. 35 involves bit lines BLs, word lines WLs, and a write control signal W.

To read data from a memory cell MCo of the semiconductor memory device of FIG. 35, a word line WL and a bit line BL are selected according to a row address and a column address, respectively. A sense amplifier 407 checks to see whether or not a current flows through the selected memory cell (cell transistor) MCo, to determine whether the memory cell stores data "1" or "0."

To write data to a memory cell, the write control signal W sets word and bit line selection signals to a write voltage Vpp. The buffer 405 converts write data WD into a signal having the write voltage Vpp. When the gate signal to the write voltage supply transistor 406 becomes low level L, the transistor 406 is turned ON to supply the write voltage Vpp to a bus 408. Since the transistor 406 is a p-channel type MOS transistor, the write voltage Vpp applied to the source of the transistor 406 is not dropped by the threshold voltage of the transistor 406. As a result, the potential of the bus 408 is increased to nearly the write voltage Vpp, thereby effectively applying the write voltage Vpp to the drain of the selected cell transistor MCo. Even when this flash memory is driven with a single five-volt power source, the low write voltage Vpp is sufficient to write data to memory cells.

Figure 36:
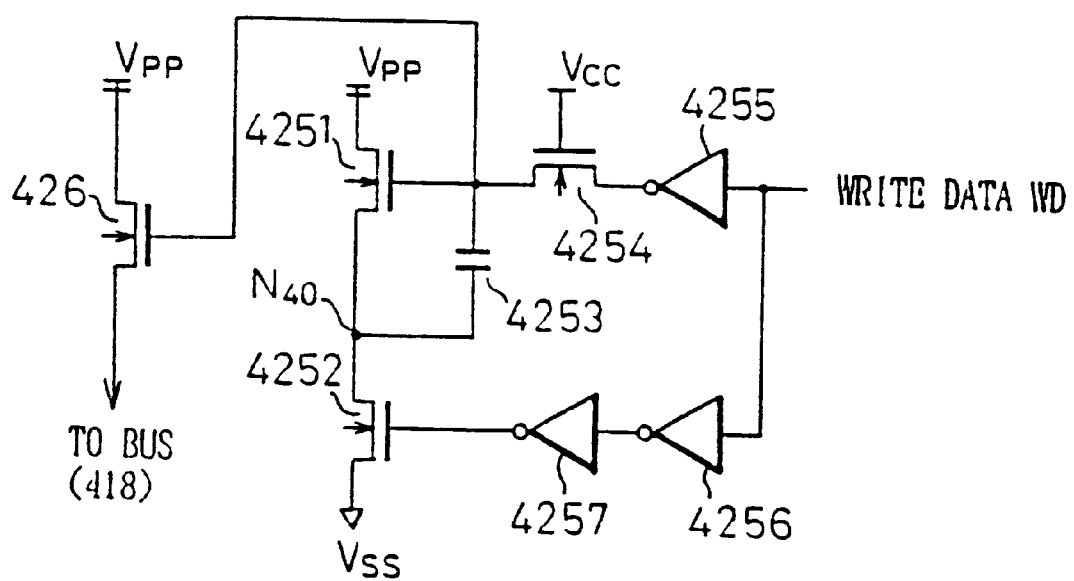
FIG. 36 is a circuit diagram showing an essential part of another embodiment of a semiconductor memory device according to the fourth aspect of the present invention.

FIG. 36 is a circuit diagram showing an essential part of a semiconductor memory device according to another embodiment of the fourth aspect of the present invention. The part shown in FIG. 36 corresponds to the voltage supply transistor 416 and buffer 415 of the conventional semiconductor memory device of FIG. 34.

The embodiment of FIG. 36 employs an n-channel type MOS transistor as a write voltage supply transistor 426, similar to the prior art of FIG. 34. Instead of the buffer 415 of FIG. 34, however, the embodiment of FIG. 36 employs n-channel type MOS transistors 4251, 4252, and 4253, inverters 4255, 4256, and 4257, and a bootstrap circuit 4253 made of a capacitor. When write data WD changes from high level H to low level L, the bootstrap circuit 4253 sets the gate of the transistor 4251 to high level H. Then, the gate of the transistor 4252 changes to low level L, to increase the potential of a node N40. At this time, the capacitor 4253 further increases the level of the gate of the transistor 4251 up to about Vpp+Vcc. This potential is applied to the gate of the write voltage supply transistor 426, to increase the potential of a bus 418 to about the write voltage Vpp.

In this way, the gate of the write voltage supply transistor 426 made of an n-channel type MOS transistor receives the data signal increased to the write voltage Vpp or over, and the bus 418 receives a voltage equal to the write voltage Vpp, so that data is effectively written to a selected memory cell with the low write voltage Vpp.

As explained above, the semiconductor memory device according to the fourth aspect of the present invention provides a sufficient write drain voltage even under the influence of the threshold voltage of a write voltage supply transistor, to correctly write data to a selected memory cell even with a low write voltage.

A semiconductor memory device according to a fifth aspect of the present invention will be explained with reference to FIGS. 37 to 45.

Figure 37:
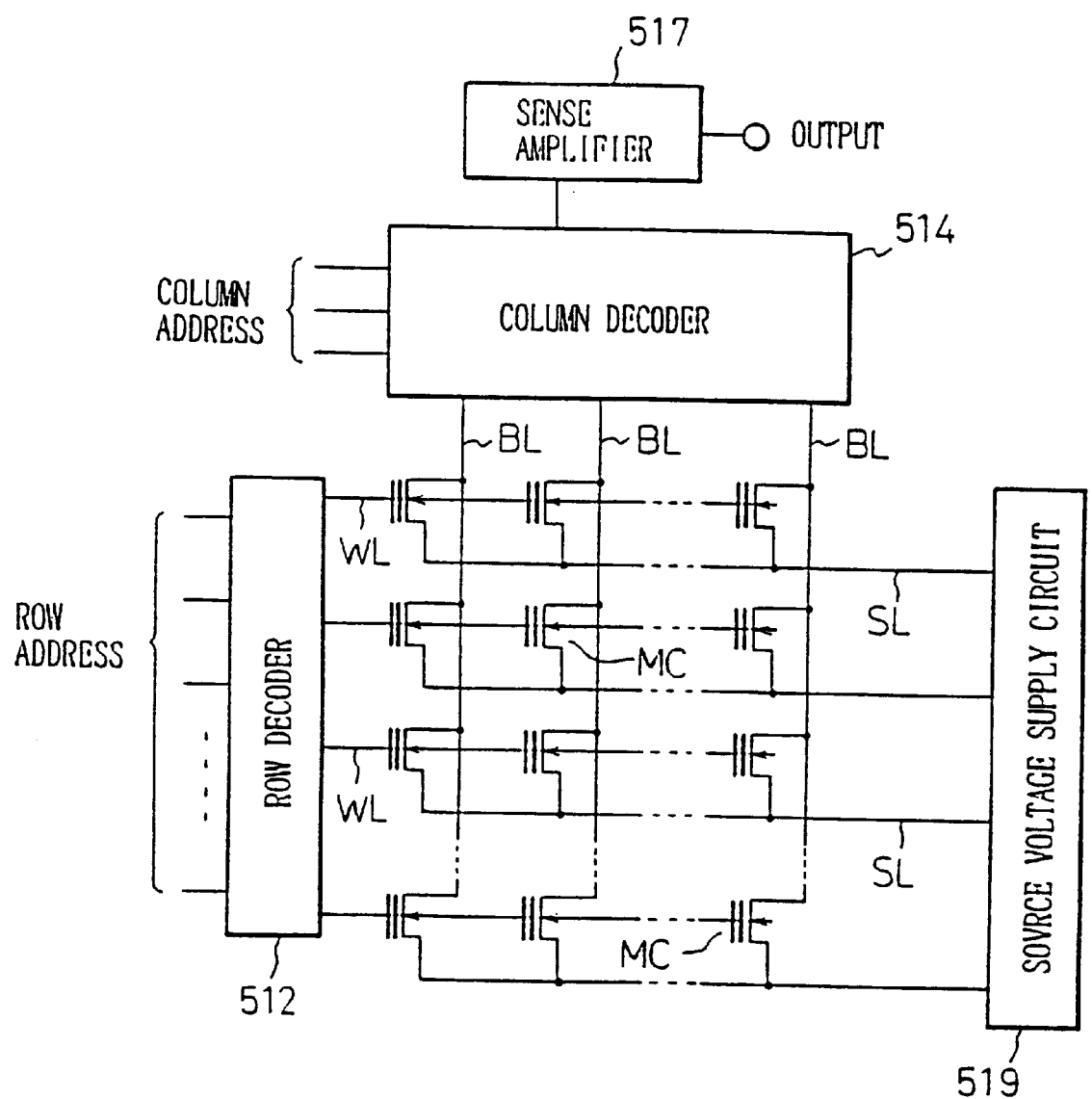
FIG. 37 is a circuit block diagram showing a conventional semiconductor memory device related to the fifth aspect of the present invention.

FIG. 37 shows a conventional semiconductor memory device (flash memory) related to the fifth aspect of the present invention. The semiconductor memory device of FIG. 37 includes a row decoder 512, a column decoder 514, a sense amplifier 517, and a source voltage supply circuit 519. The semiconductor memory device includes memory cells (cell transistor) MCs each made of an n-channel type MOS (MIS) transistor, word lines WLs, bit lines BLs, and source lines SLs. The source voltage supply circuit 519 is connected to the sources of the memory cells MCs in a memory cell array through the source lines SLs, to electrically collectively erase the memory cells. Each memory cell MC is the same as that shown in FIG. 33.

Figure 38:
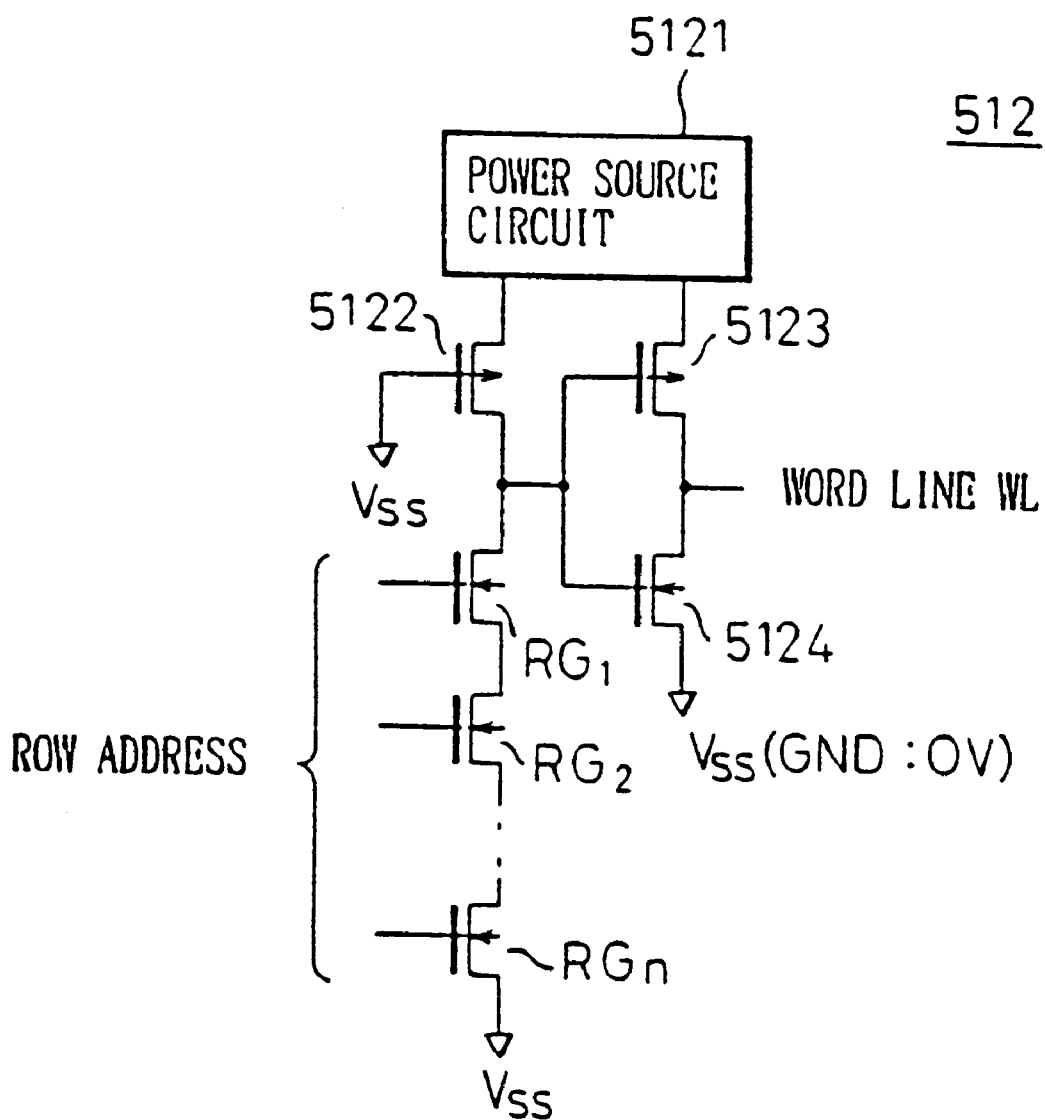
FIG. 38 is a circuit diagram showing a row decoder of the semiconductor memory device of FIG. 37.
Figure 39:
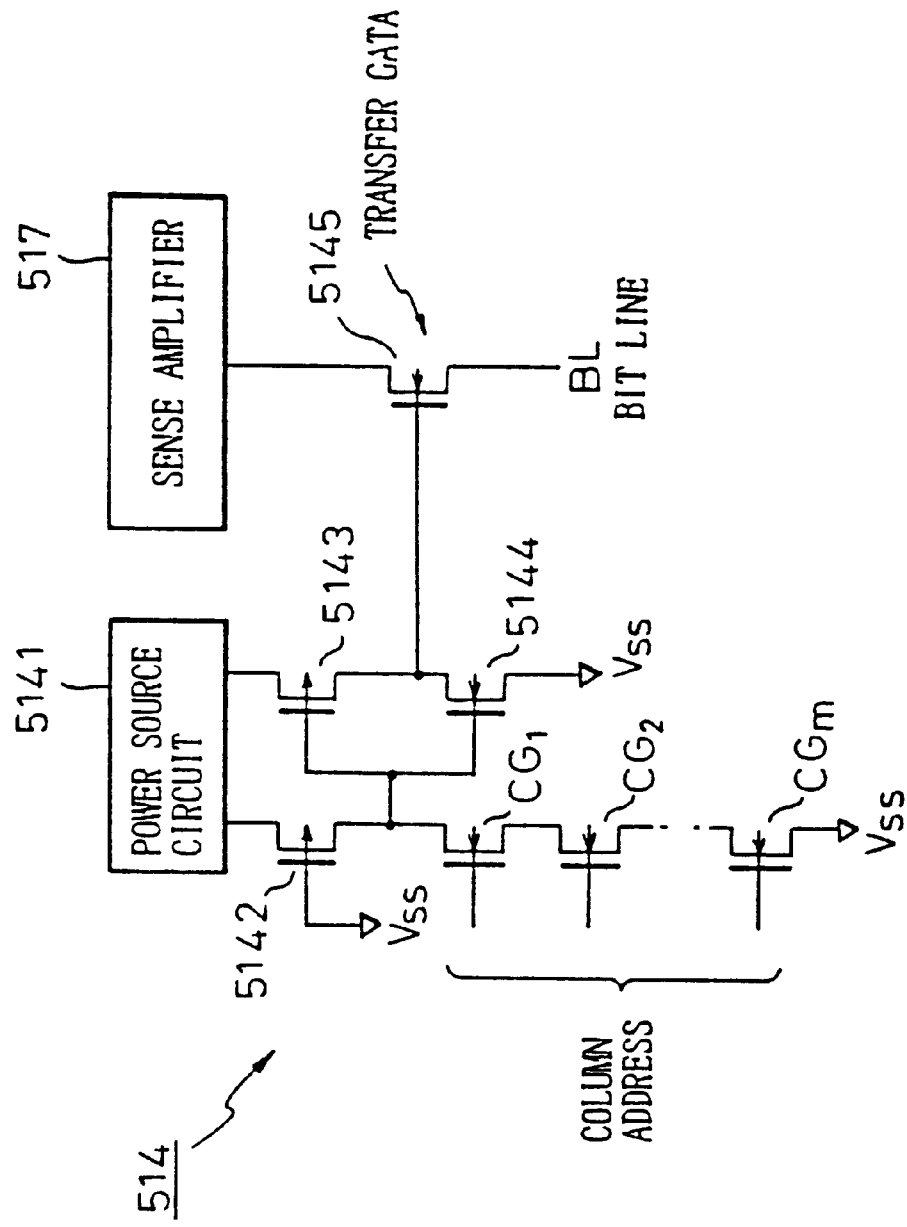
FIG. 39 is a circuit diagram showing a column decoder of the semiconductor memory device of FIG. 37.
Figure 40:
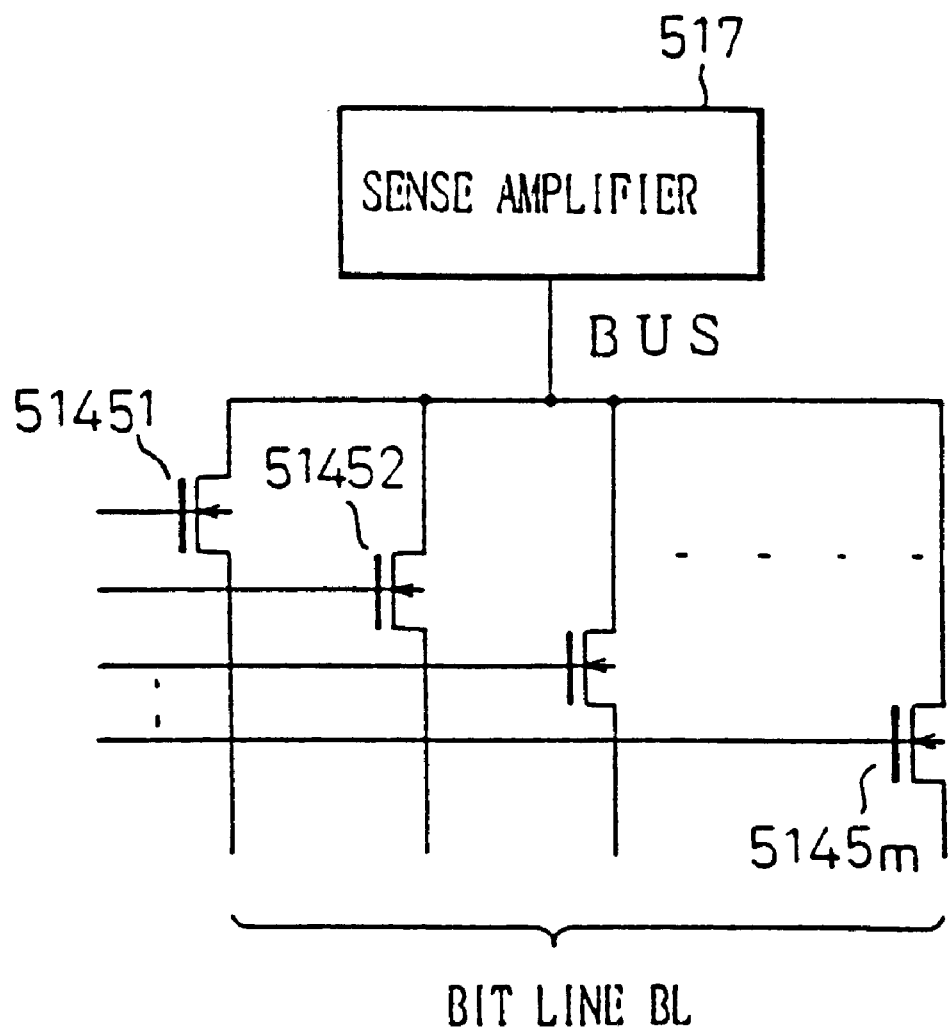
FIG. 40 is a circuit diagram showing bit line transfer gates of the column decoder of FIG. 39.

FIG. 38 shows an example of the row decoder 512, FIG. 39 shows an example of the column decoder 514, and FIG. 40 shows a bit line transfer gate 5145 of the column decoder 514 of FIG. 39.

In FIG. 38, the row decoder 512 has a power source 5121, gates RG1 to RGn for receiving a row address, a transistor 5122 connected between the gates RG1 to RGn and the power source 5121, and an inverter (transistors 5123 and 5124) connected between the power source 5121 and a low voltage supply source Vss (at a ground level GND of zero volts). The inverter controls the level of a word line WL. For example, a selected word line WL corresponding to a row address with all high level (H) bits to turn ON the gates RG1 to RGn receives the output Vcc of the power source 5121 through the transistor 5123, and every other unselected word line WL receives the low voltage Vss of zero volts through the transistor 5124.

In FIG. 39, the column decoder 514 has a power source 5141, gates CG1 to CGm for receiving a column address, a transistor 5142 between the gates CG1 to CGm and the power source 5141, a bit line transfer gate 5145, and an inverter (transistors 5143 and 5144) between the power source 5121 and the low voltage Vss. The inverter controls the bit line transfer gate 5145. When input column address bits are each of high level H to turn ON the gates CG1 to CGm, a selected bit line BL is connected to the sense amplifier 517.

In FIG. 40, bit line transfer gates 51451 to 5145m are connected to the sense amplifier 517 through a bus BUS. Only a bit line selected through the bit line transfer gates 51451 to 5145m is connected to the sense amplifier 517. Accordingly, the contents of a memory cell MC located at an intersection of the selected word and bit lines are provided outside through the sense amplifier 517.

Generally, all cell transistors (memory cells) MCs of a flash memory are simultaneously erased for the sake of simplicity of circuit design. The erasing is repeated until all the cell transistors are completely erased. Due to statistical reasons, some cell transistors in a flash memory are relatively easily erased and some are not. If a characteristic difference between these two kinds of memory cells is very large, the memory cells that are easily erased may be overerased. The characteristics of cell transistors easily deviate from one another during a wafer processing and through the repetition of write and erase operations.

To write or erase data to or from cell transistors of a flash memory, the floating gates of the cell transistors are charged or discharged. If a memory cell is overerased, the floating gate thereof holds charges whose polarity is opposite to a polarity formed when data is written thereto. Namely, when a memory cell has an oppositely charged floating gate, it is determined that the cell has been overerased.

Nonvolatile semiconductor memories (flash memories) usually have a NOR-type cell array. According to this type, drains of cell transistors (n-channel type MOS transistors) are connected to one another bit line by bit line. When selecting a cell transistor (memory cell), the commonly connected cell transistors are uniformly biased, and then, a positive bias voltage is applied only to the gate of the cell transistor to be selected and zero volts is applied to the gates of unselected cell transistors.

The sources of all cell transistors are grounded through the source voltage supply circuit 519 in FIG. 37. Since the cell transistors are enhancement MOS (MIS) transistors (n-channel type MOS transistors), the unselected cell transistors do not pass current, and only the selected cell transistor passes or does not pass a current depending on the quantity of charges accumulated in the floating gate thereof. According to the current flowing through the selected cell transistor, data "0" or "1" is determined.

When an enhancement cell transistor of the flash memory is overerased, the characteristics of the overerased transistor change to those of a depletion transistor. To solve this problem, the NOR-type flash memory supplies no current to unselected cell transistors when no bias is applied to the gates of the transistors. The overerased cell transistor, however, shows depletion characteristics, and therefore, passes a current even if it is unselected. Namely, even if a selected cell transistor passes no current, the overerased unselected cell transistor may pass a current, to erroneously determine data "0" as data "1," or data "1" as data "0."

An object of the fifth aspect of the present invention is to provide a semiconductor memory device that correctly reads data even if there is an overerased cell transistor.

Figure 41:
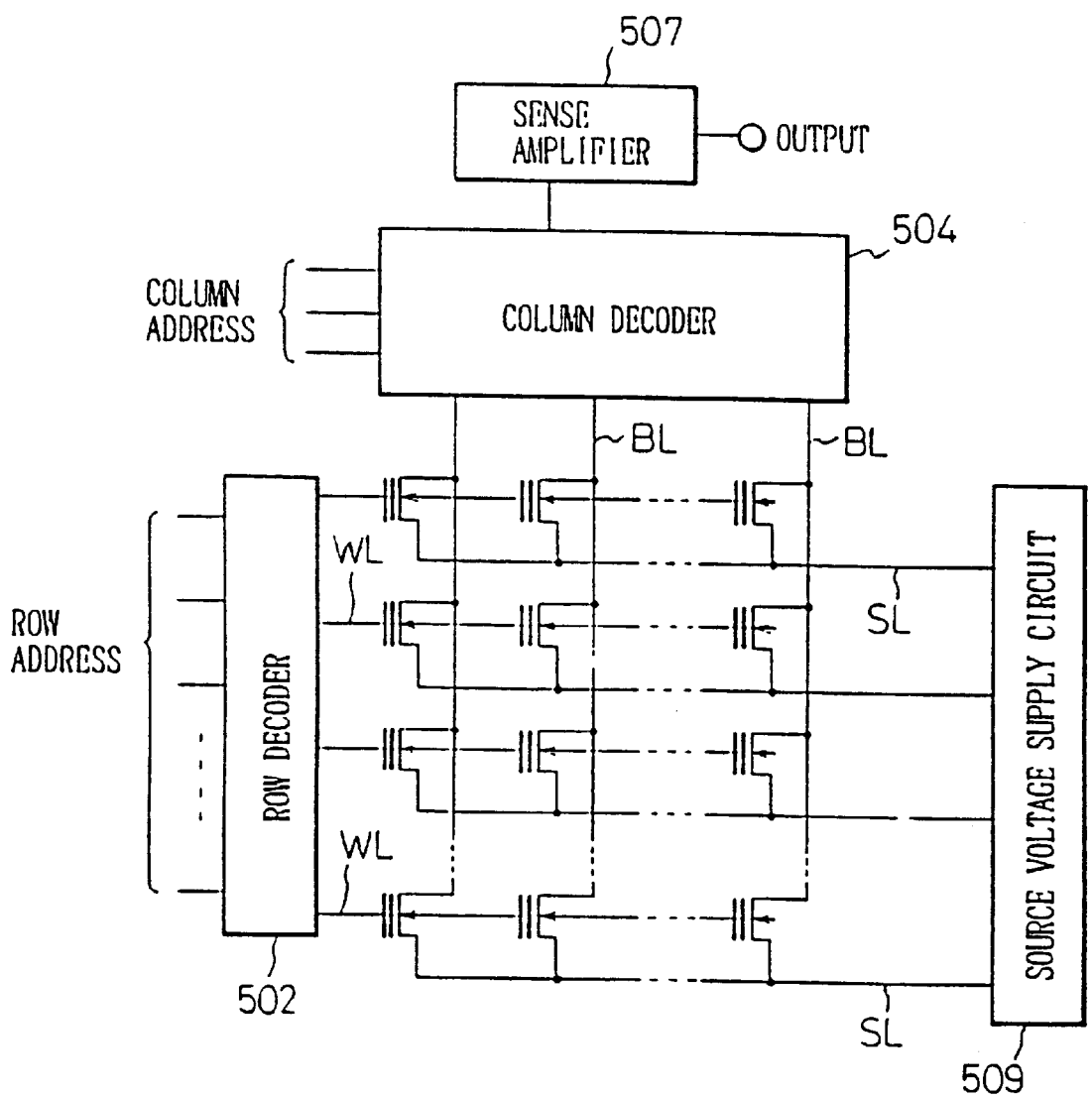
FIG. 41 is a circuit block diagram showing an embodiment of a semiconductor memory device according to the fifth aspect of the present invention.

FIG. 41 shows a flash memory according to an embodiment of the fifth aspect of the present invention. The flash memory has a row decoder 502, a column decoder 504, a sense amplifier 507, and a source voltage supply circuit 509. The arrangement of FIG. 41 is basically the same as that of FIG. 37 and is characterized by the row decoder 502.

Figure 42:
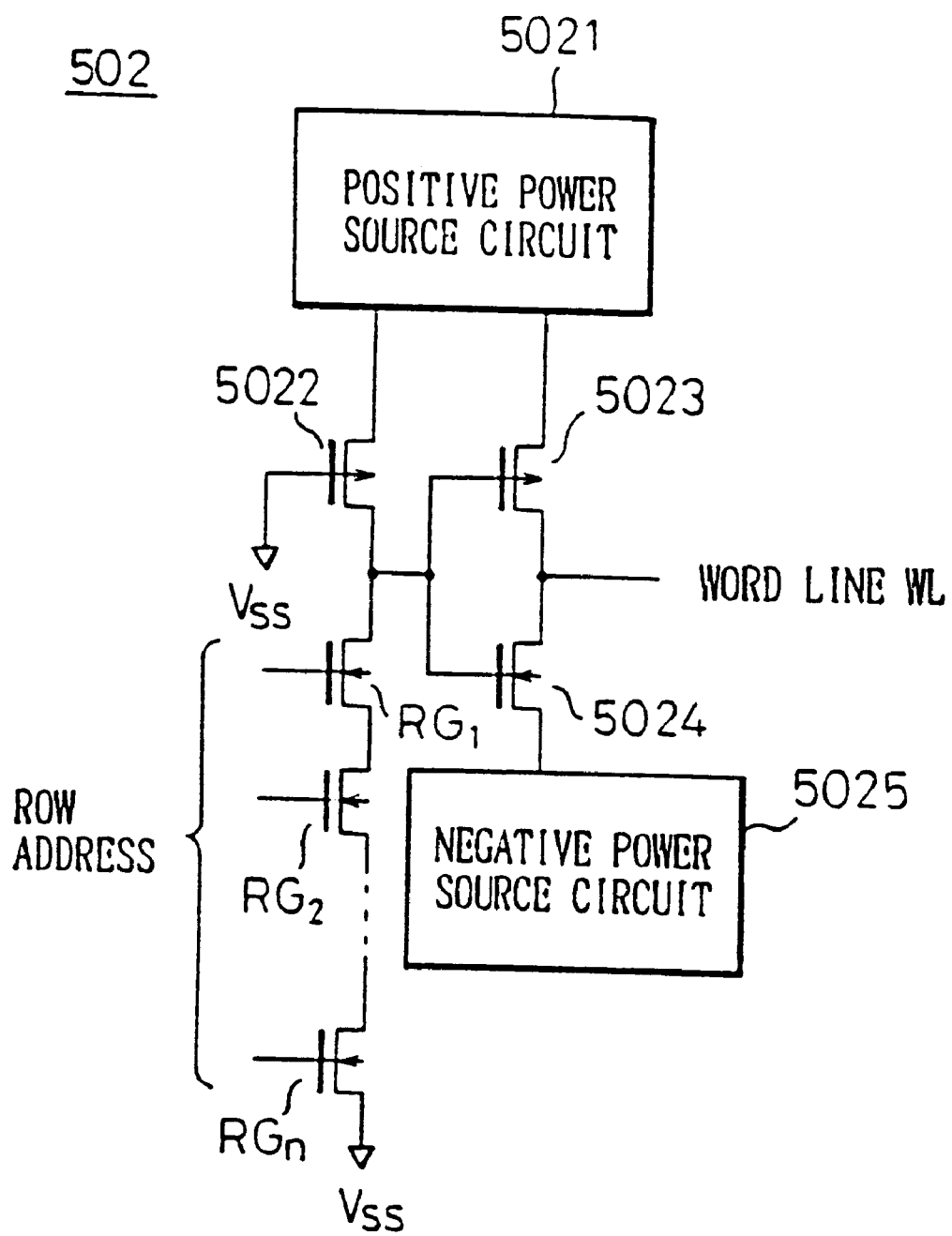
FIG. 42 is a circuit diagram showing a row decoder of the semiconductor memory device of FIG. 41.

FIG. 42 shows an example of the row decoder 502 of FIG. 41. The row decoder 502 has a positive power source 5021 for generating a given positive voltage, gates RG1 to RGn for receiving a row address, a transistor 5022 between the gates RG1 to RGn and the positive power source 5021, a negative power source 5025, and an inverter (transistors 5023 and 5024) between the positive power source 5021 and the negative power source 5025. The inverter controls the level of a word line WL. When an input row address has bits each of high level H, the gates RG1 to RGn are turned ON, and a corresponding word line (selected word line) WL receives an output Vcc of the positive power source 5021 through the transistor 5123. At this time, other unselected word lines WLs receive each an output (a negative voltage) of the negative power source 5025 through the transistor 5024. The negative power source 5025 may be the negative voltage generator 118 of the semiconductor memory device of the related art of FIG. 5.

When the output of the negative power source 5025 is applied to the gate of an overerased cell transistor MC showing depletion characteristics, the voltage causes the transistor to be unselected to pass no current. Namely, the negative output voltage of the negative power source 5025 suppresses the gate voltage of the overerased depletion n-channel type MOS transistor below a threshold voltage. Consequently, even if a selected bit line involves overerased cell transistors, the contents of a cell transistor selected by a word line are correctly read out through the sense amplifier 507.

Figure 43:
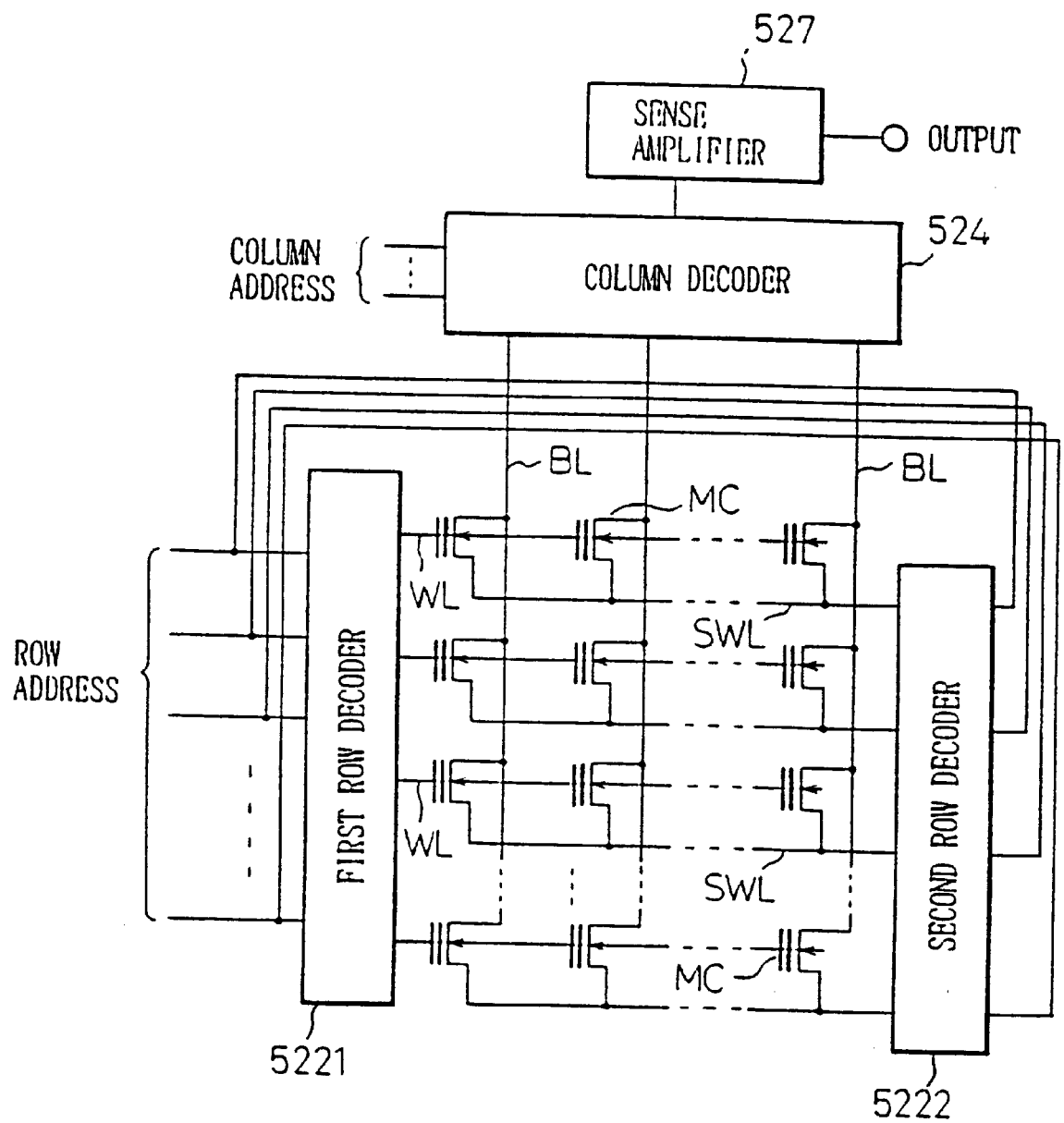
FIG. 43 is a circuit block diagram showing another embodiment of a semiconductor memory device according to the fifth aspect of the present invention.

FIG. 43 shows a semiconductor memory device according to another embodiment of the fifth aspect of the present invention. This semiconductor memory device has first and second row decoders 5221 and 5222 corresponding to the row decoder 502 and source voltage supply circuit 509 of FIG. 41. The second row decoder. 5222 applies a voltage equal to or greater than the level of a selected bit line to source lines SWLs corresponding to unselected word lines WLs. A column decoder 524, a sense amplifier 527, etc., of FIG. 43 are the same as those of FIG. 41.

When reading data from a memory cell MC, the first row decoder 5221 applies a normal voltage Vcc to a selected word line WL, to select memory cells (cell transistors) connected to the selected word line WL. The second row decoder 5222 applies a low power source voltage Vss of zero volts to the source line SWL of the cell transistors connected to the selected word line, and a voltage equal to or greater than the drain voltage of the selected bit line to the source lines of cell transistors connected to unselected word lines. Overerased cell transistors among the unselected transistors can be disconnected because the gate voltage thereof becomes lower than the source voltage thereof. A voltage applied to the sources of the memory cells connected to the unselected word lines in the read operation may be equal to the level of the selected bit line. Even if a channel is produced due to the overerasing, no current flows if there is no potential difference between the drain and source of each overerased cell. Accordingly, the overerased unselected cell transistors never influence the read operation.

Figure 44:
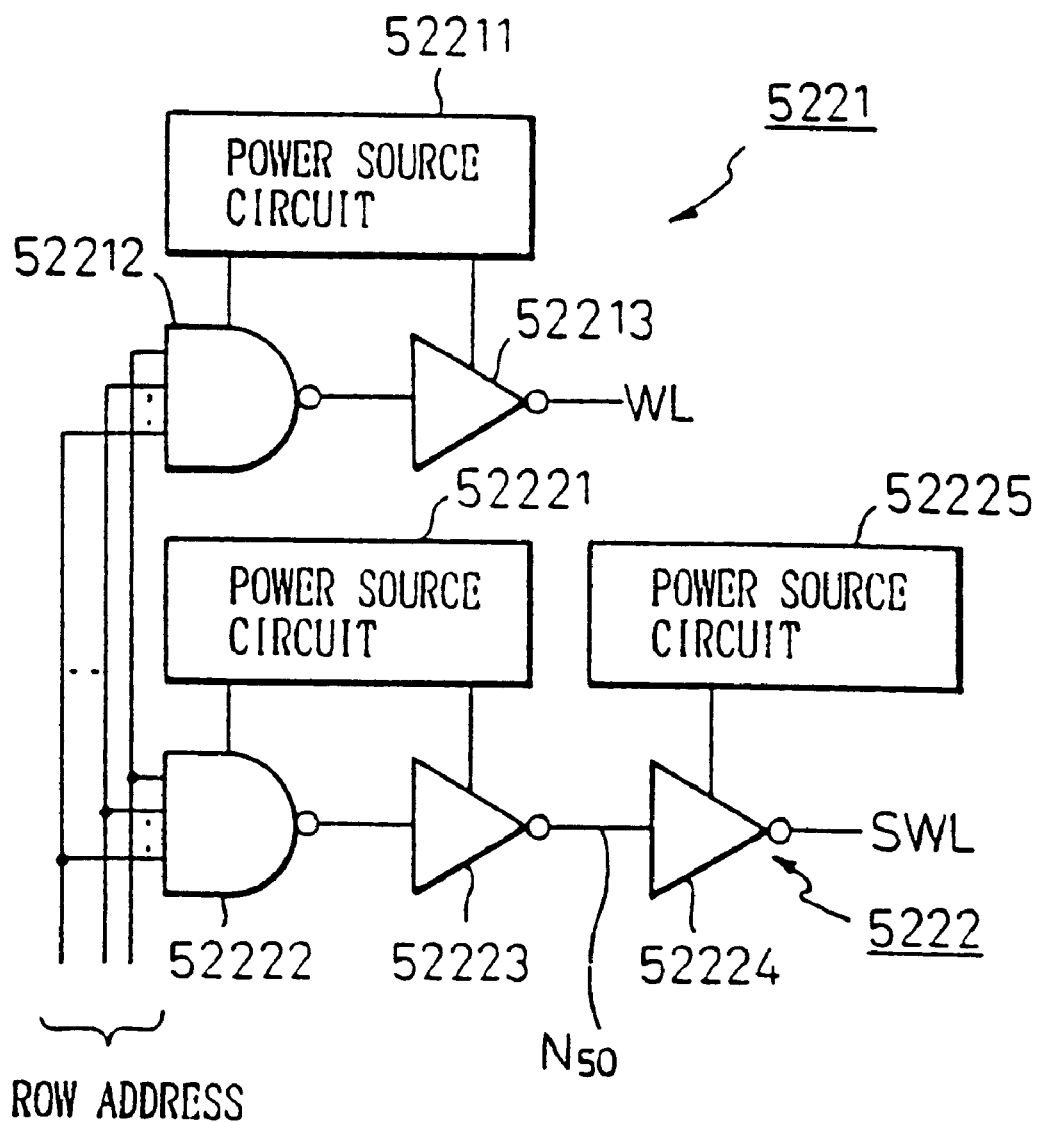
FIG. 44 is a circuit block diagram showing first and second row decoders of the semiconductor memory device of FIG. 43.
Figure 45:
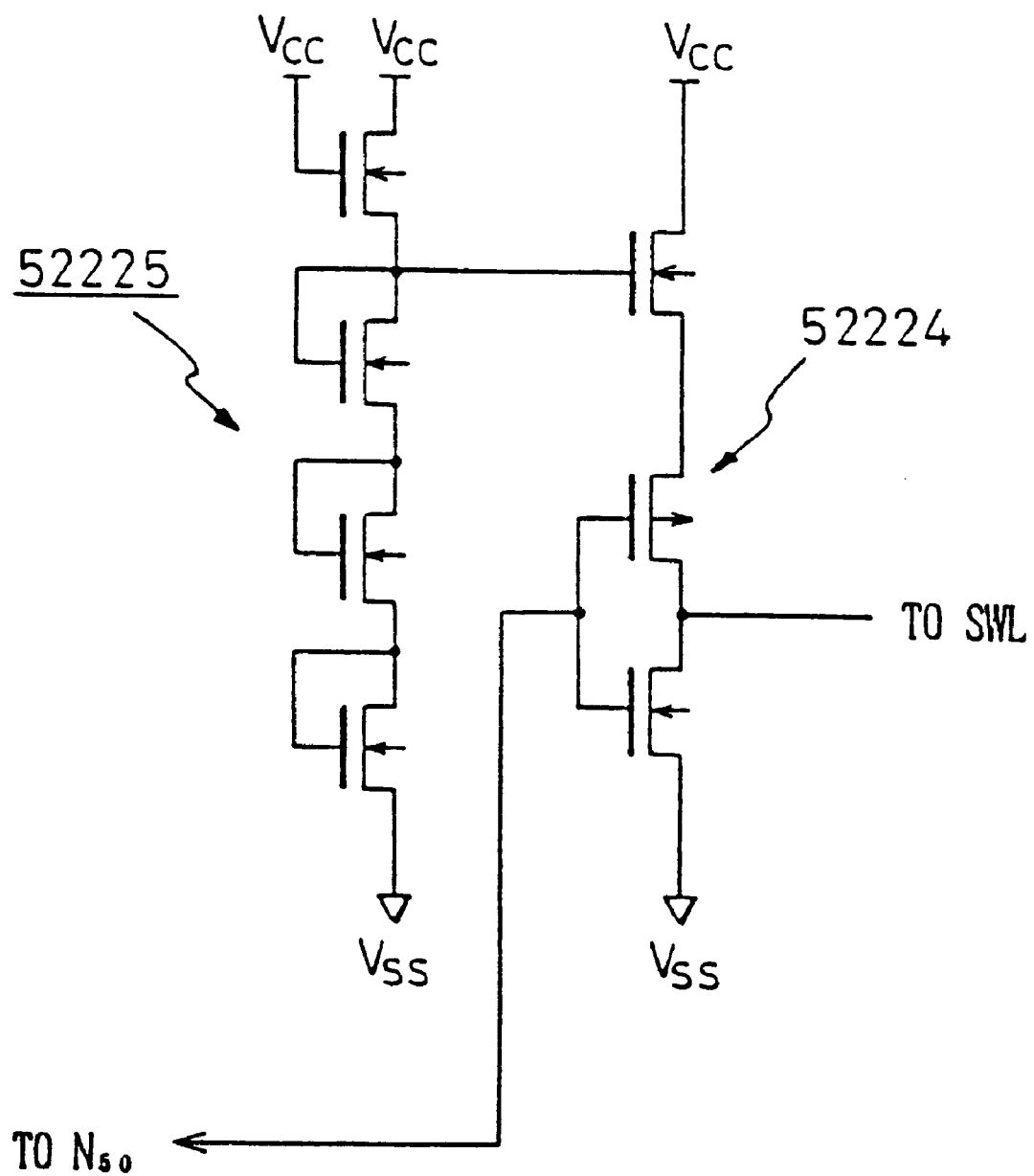
FIG. 45 is a circuit diagram showing a part of the second row decoder of FIG. 44.

FIG. 44 shows examples of the first and second row decoders 5221 and 5222 of FIG. 43, and FIG. 45 shows a part of the second row decoder 5222.

In FIG. 44, the first row decoder 5221 has a power source (Vcc) 52211, a NAND gate 52212 for receiving a row address, and an inverter 52213. The second row decoder 5222 has a power source (Vcc) 52221, a NAND gate 52222 for receiving the row address, inverters 52223 and 52224, and a power source 52225. The power source 52225 supplies a voltage higher than the drain voltage of a selected bit line to the sources of cell transistors connected to unselected word lines when reading data, as shown in FIG. 45.

As explained above, a flash memory according to the fifth aspect of the present invention correctly reads data of "0" or "1" even if some memory cells have been overerased during a wafer process or through repetitive write and read operations. The fifth aspect of the present invention thus improves the yield and reliability of flash memories.

A semiconductor memory device according to a sixth aspect of the present invention will be explained with reference to FIGS. 46 to 49. Similar to the fifth aspect, the sixth aspect correctly reads data from memory cells of a flash memory even if some memory cells are overerased during a collective erase operation.

As explained before with reference to FIGS. 37 to 40, cell transistors (memory cells) of a flash memory are simultaneously erased for the sake of simplicity of circuit designing. The erasing is repeated until all the cell transistors are completely erased. Some cell transistors of the flash memory are relatively easily erased and some are not. When the cells are collectively erased, the cells that are easily erased may be overerased. The characteristics of the cell transistors easily differ from one another during a wafer process and through the repetition of write and erase operations. Accordingly, the overerasing of cells frequently occurs.

Generally, flash memories have a NOR-type cell array. According to this type, drains of n-channel type MOS transistors (cell transistors) are connected to one another bit line by bit line. When selecting a cell transistor, the commonly connected cell transistors are uniformly biased, and then, a positive bias voltage is applied to only the gate of the cell transistor to be selected and zero volts is applied to the gates of unselected cell transistors. Since the cell transistors are enhancement n-channel type MOS transistors, the unselected cell transistors do not pass a current, and only the selected cell transistor passes or does not pass a current depending on the quantity of charges stored in the floating gate thereof. According to the current flowing through the selected cell transistor, data "0" or "1" is determined.

When an enhancement cell transistor of the flash memory is overerased, the characteristics of the overerased transistor change to those of a depletion transistor. To solve this problem, the NOR-type flash memory supplies no current to unselected cell transistors when no bias is applied to the gates of the transistors. The overerased cell transistor, however, shows depletion characteristics, and therefore, passes current even if it is unselected. Namely, even if a selected cell transistor passes no current, the overerased unselected cell transistor passes current, to erroneously determine data "0" as data "1," or data "1" as data "0."

An object of the sixth aspect of the present invention is to provide a semiconductor memory device that correctly reads data by saving overerased cell transistors.

Figure 46:
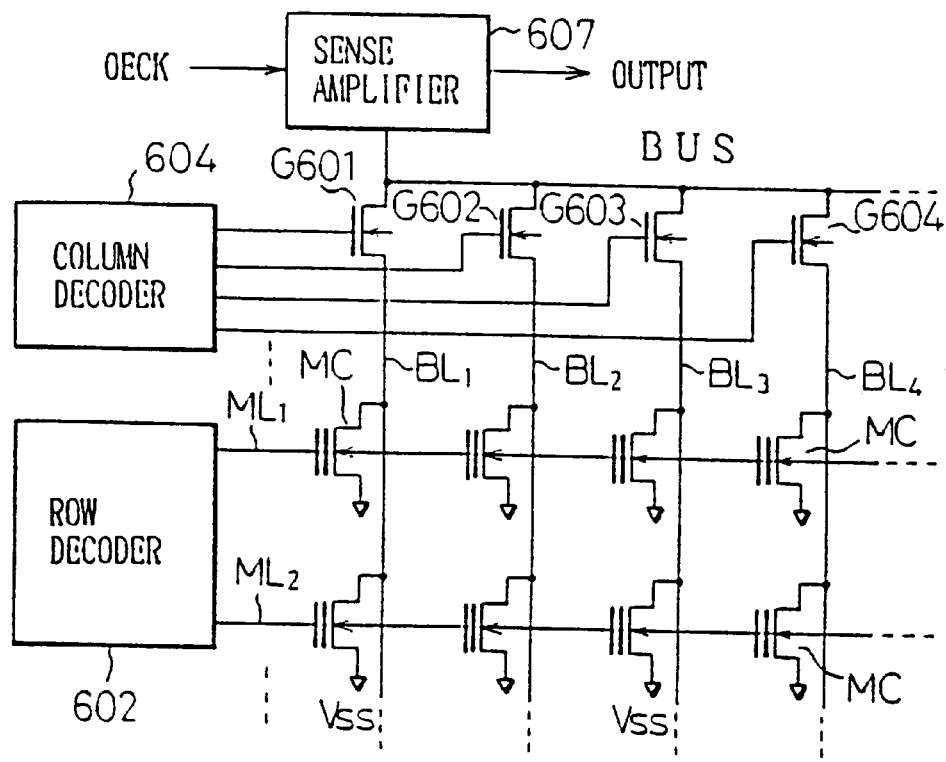
FIG. 46 is a circuit block diagram showing an essential part of an embodiment of a semiconductor memory device according to the sixth aspect of the present invention.

FIG. 46 shows an essential part of the semiconductor memory device according to the sixth aspect of the present invention. The semiconductor memory device includes a row decoder 602, a column decoder 604, a sense amplifier 607, memory cells (cell transistors) MCs each made of an n-channel type MOS transistor, word lines WLs, and bit lines BLs. Each memory cell MC is the same as that shown in FIG. 33. Note, the sense amplifier 607 receives a signal OECK which is changed to high level H when an erase verifying operation is carried out (with reference to Step 613 in FIG. 49).

Figure 47:
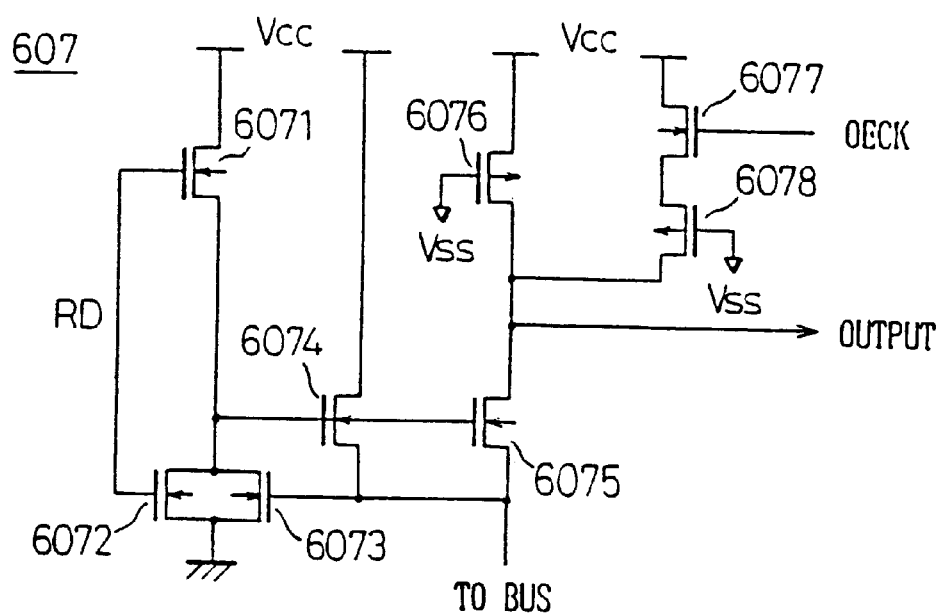
FIG. 47 is a circuit diagram showing a sense amplifier of the semiconductor memory device of FIG. 46.

FIG. 47 shows an example of the sense amplifier 607 of FIG. 46. The sense amplifier 607 includes n-channel type MOS transistors 6071, 6072, 6073, 6074, 6075, and 6077, and p-channel type MOS transistors 6076 and 6078. Note, as sgown in FIG. 47, the signal OECK, which is applied to the sense amplifier 607, is also applied to the gate of the MOS transistors 6077.

To detect overerased cell transistors after a collective erase operation, the row decoder 602 sets all word lines WL1, WL2, . . . of the collectively erased cell array to low level L. Thereafter, the column decoder 604 successively selects column gates G601, G602, . . . , to successively connect the bit lines BL1, BL2, . . . to the sense amplifier 607. Whenever a bit line involving an overerased cell transistor is connected to the sense amplifier 607, the sense amplifier 607 provides an output of low level L. Then, the transistor 6077 of the sense amplifier 607 is turned ON to increase a drive current of the sense amplifier 607, thereby preventing a current from flowing through the overerased cell. At the same time, the row decoder 602 scans the word lines WL1, WL2, . . . , to detect the overerased cell that has caused the sense amplifier 607 to provide an output of high level H.

Figure 48:
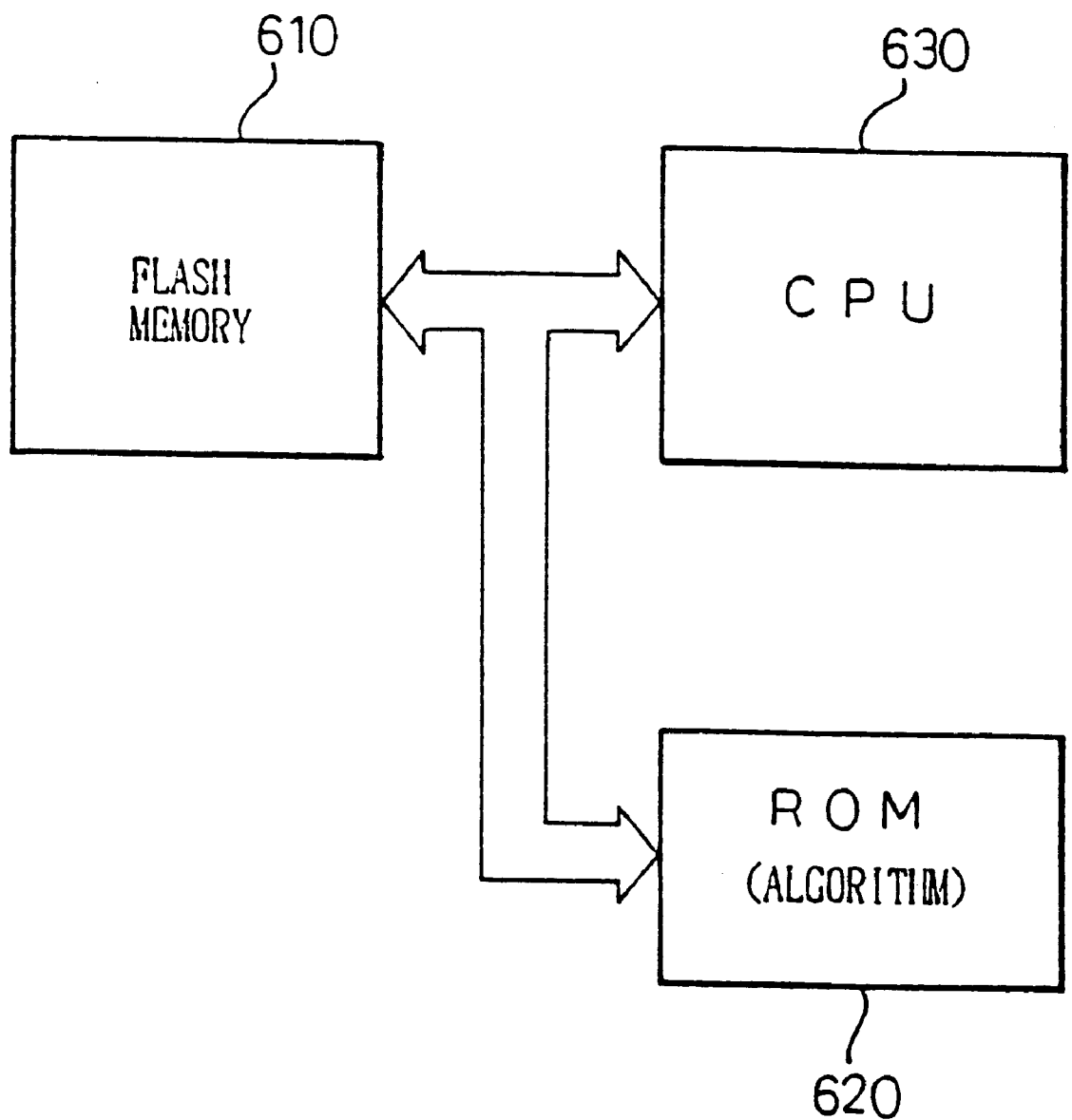
FIG. 48 is a block diagram schematically showing a system employing the semiconductor memory device according to the sixth aspect of the present invention.

FIG. 48 schematically shows a system employing the semiconductor memory device according to the sixth aspect of the present invention. The system includes the flash memory 610, a read only memory (ROM) 620, and a central processing unit (CPU) 630.

Figure 49:
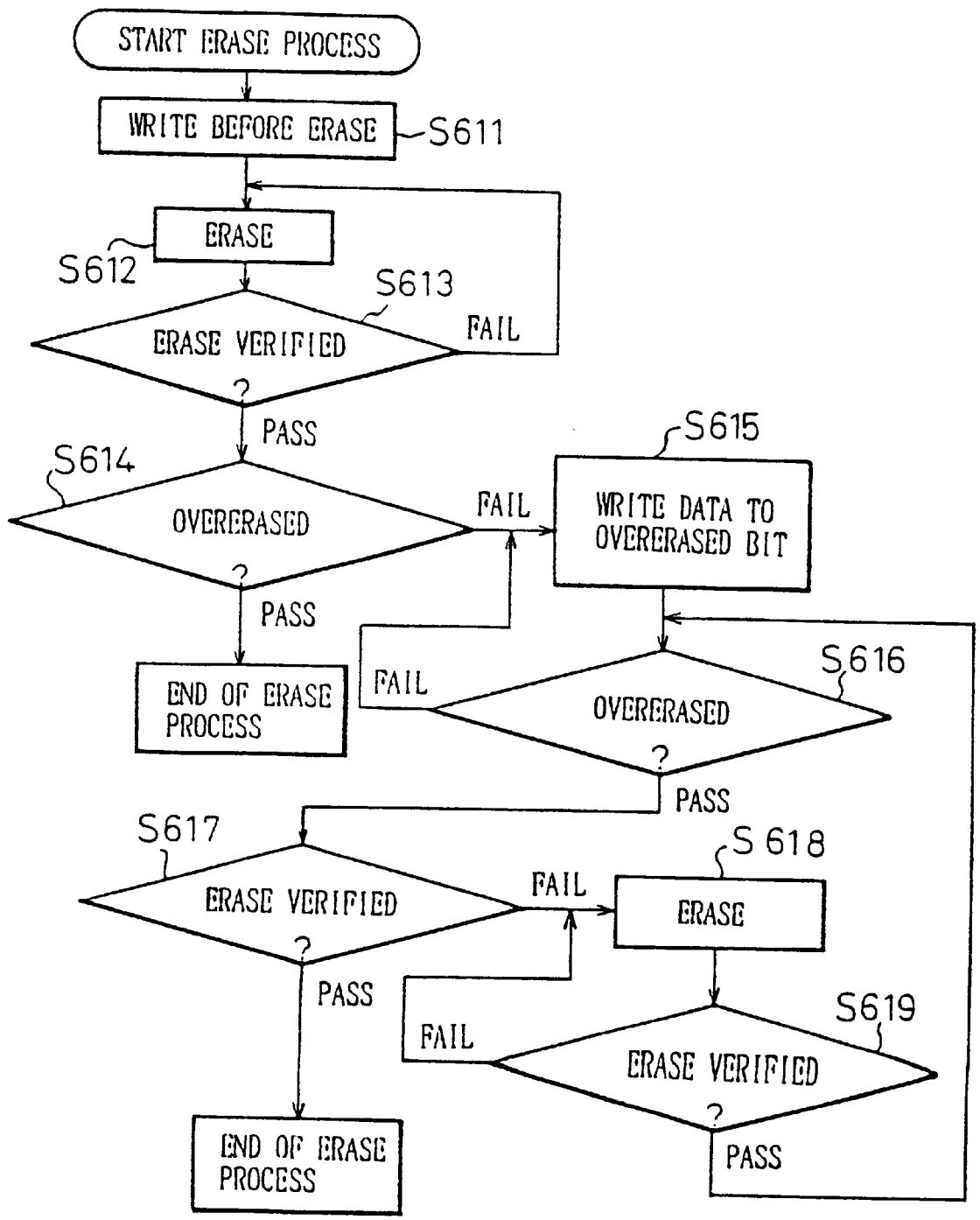
FIG. 49 is a flowchart for explaining an example of a process carried out by the semiconductor memory device of the sixth aspect of the present invention.

The ROM 620 stores an algorithm shown in FIG. 49, and the CPU 630 controls the flash memory 610 according to the algorithm. Namely, the CPU 630 saves overerased cells of the flash memory 610 according to the algorithm stored in the ROM 620.

FIG. 49 shows a flow of the algorithm stored in the ROM 620 of FIG. 48. After the start of an erase operation of the flash memory, step S611 carries out a write-before-erase operation. Namely, before collectively erasing the memory cell array of the flash memory, data "0" is written to every cell transistor of the memory cell array.

Step S612 carries out the collective erase operation, and step S613 carries out an erase verify operation. Note, in the step S613, a signal OECK, which is applied to the sense amplifier 607 and the gate of the MOS transistor 6077, is changed from low level L to high level H, when the erase verify operation is carried out. Namely, electrons are gradually discharged from the floating gates of all cell transistors of the memory cell array, to achieve the erase operation. Step S614 checks to see whether or not there is an overerased cell. If there is no overerased cell, the erase process ends. If there is an overerased cell, step S615 is carried out. As explained with reference to FIGS. 46 and 47, step S614 detects overerased cell transistors one by one.

Step S615 writes data to the overerased cell (overerased bit) detected in step S614. Step S616 carries out the same test as step S614 to check for overerasing. If the overerased cell detected in step S614 restores a normal erased state due to the write operation of step S615, and if there is no other overerased cell, step S617 carries out the same erase verify operation as step S613. If the erase verify operation of step S617 is successful, the erase process ends. If the erase verify operation of step S617 fails, steps S618 and S619 carry out the erase and erase verify operations.

If the overerased cell detected in step S614 restores a normal erased state due to the write operation of step S615 and if another overerased cell is found in step S616, step S615 writes data to the overerased cell newly found. In this way, data is written to every overerased cell of the memory cell array, to restore a normal erased state in every overerased cell.

The erase process of FIG. 49 is stored in the ROM 620 of the system of FIG. 48, and the CPU 630 reads and executes the erase process. Alternatively, the erase process of FIG. 49 may be realized by hardware. For example, the flash memory itself may incorporate a logic circuit that achieves the erase process.

As explained above, the sixth aspect of the present invention saves overerased cell transistors and correctly reads data. Even if memory cells of a semiconductor memory device are overerased during a wafer process or through the repetition of write and erase operations, the sixth aspect of the present invention correctly reads data out of the semiconductor memory device, thereby improving the yield and reliability of the semiconductor memory device.

A semiconductor memory device according to a seventh aspect of the present invention will be explained with reference to FIGS. 50 to 61.

Figure 50:
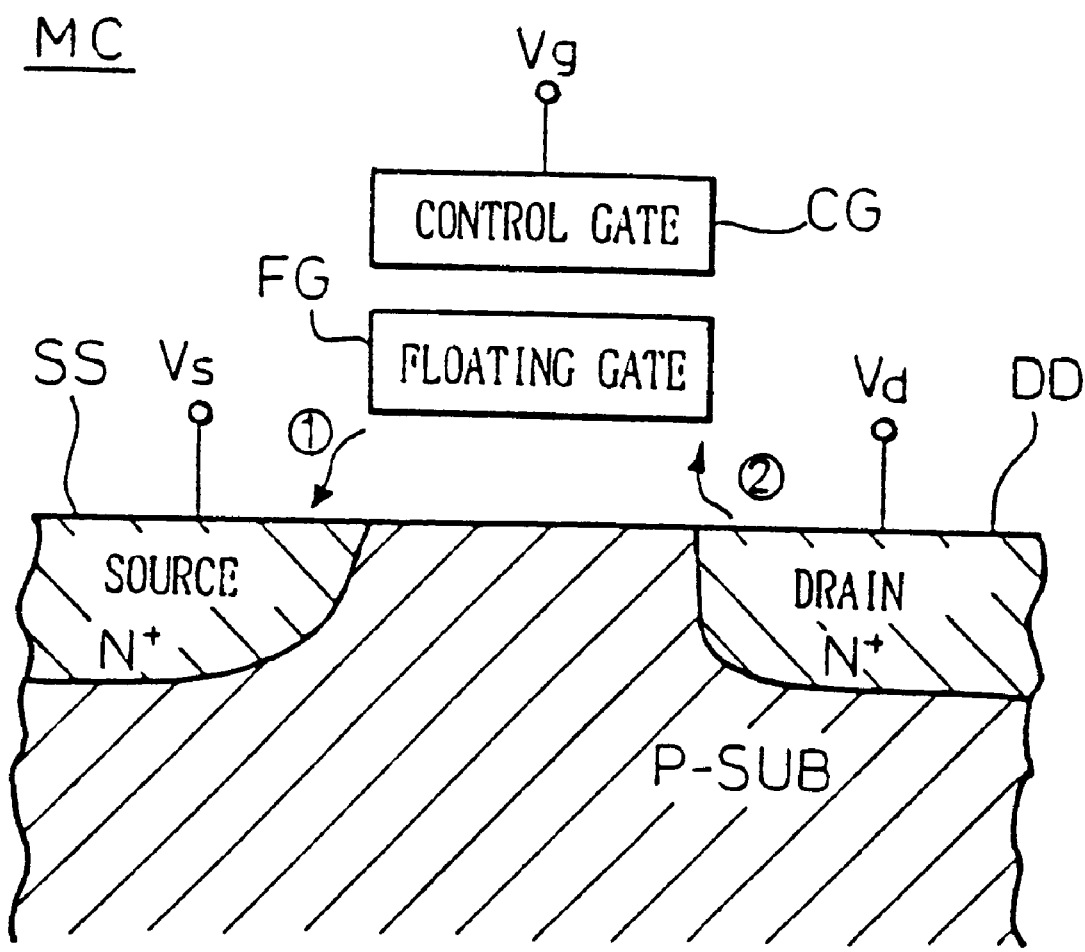
FIG. 50 is diagram for explaining the operation of a memory cell of a semiconductor memory device according to the seventh aspect of the present invention.

FIG. 50 shows a memory cell (MC) of an electrically collectively erasable nonvolatile semiconductor memory device (a flash memory) according to the seventh aspect of the present invention. The memory cell (cell transistor) has a floating gate FG. The floating gate is disposed between a source and a drain and is insulated from other regions. A control gate CG is formed above the floating gate FG.

To write data to the cell transistor, a drain voltage Vd applied to a drain DD is set to, for example, 6 V, a gate voltage Vg applied to the control gate CG to a write voltage (erase voltage) Vpp, and a source voltage Vs applied to a source SS to zero. Charges are injected from the drain DD to the floating gate FG, to write data of "0."

To erase data from the cell transistor, the gate voltage Vg and drain voltage Vd are set to a floating state, and the source voltage Vs is set to the erase voltage Vpp. Electrons are extracted from the floating gate FG to the source SS, to erase the cell transistor, i.e., to write data "1" to the cell transistor. To read data from the cell transistor, the gate voltage Vg is set to a power source voltage Vcc, the drain voltage Vd to about one volt, and the source voltage Vs to zero. It is tested to see whether or not a drain current flows, to determine whether the written data is "1" or "0."

Figure 51:
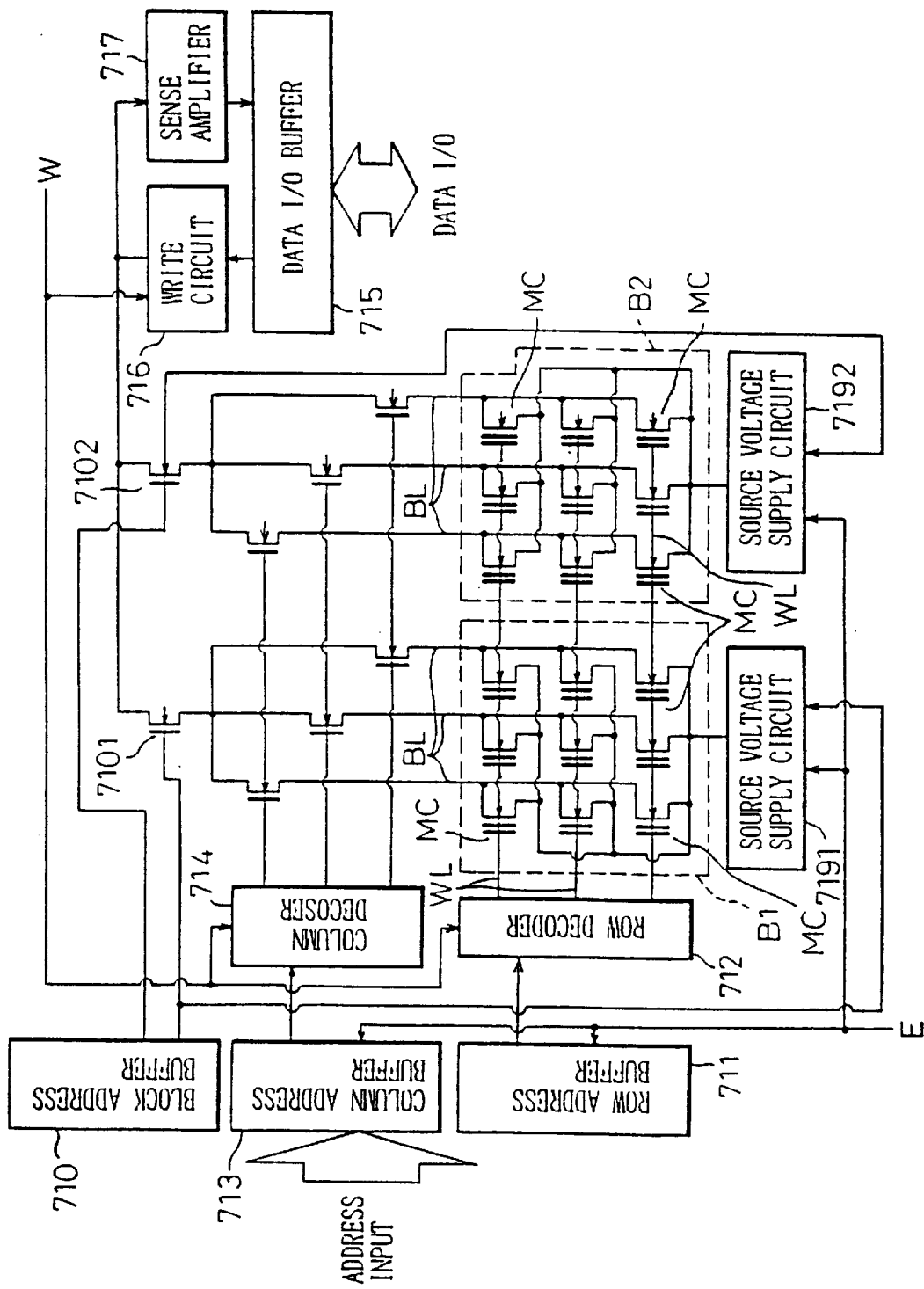
FIG. 51 is a circuit diagram showing a conventional semiconductor memory device related to a semiconductor memory device according to the seventh aspect of the present invention.

FIG. 51 shows a conventional semiconductor memory device related to the seventh aspect of the present invention. The semiconductor memory device includes a block address buffer 710, block selecting gates 7101 and 7102, a row address buffer 711, a row decoder 712, a column address buffer 713, a column decoder 714, a data I/O buffer 715, a write circuit 716, a sense amplifier 717, and source voltage supply circuits 7191 and 7192. The semiconductor memory device also includes bit lines BLs, word lines WLs, memory cells MCs, a write control signal W that becomes high level H when writing data, and an erase signal E that becomes high level H when erasing data.

This semiconductor memory device operates similarly to the semiconductor memory device of FIG. 2. The semiconductor memory device of FIG. 51 additionally has the block address buffer 710 and block selecting gates 7101 and 7102 corresponding to blocks B1 and B2 of memory cells. One of the block selecting gates 7101 and 7102 is selected according to a block selection signal from the block address buffer 710, to connect one of the blocks B1 and B2 to the write circuit 716 or the sense amplifier 717. In each of the blocks B1 and B2 of memory cells, sources of the memory cells are connected to one another. With the use of the source voltage supply circuits 7191 and 7192 provided for the blocks B1 and B2, respectively, the blocks are separately erasable.

To erase the cells of one of the blocks B1 and B2, the erase signal E of high level H is supplied to the row address buffer 711 and column address buffer 713, to set the outputs of the buffers 711 and 713 to an unselected logic (for example, each complementary output being at low level L). This results in putting all word and bit lines WLs and BLs in an unselected state. The erase signal E and a block selection signal from the block address buffer 710 are supplied to the source voltage supply circuits 7191 and 7192. One of the source voltage supply circuits selected with the block selection signal of, for example, high level H, is used to supply an erase voltage Vpp to the selected block. Consequently, all cells in the selected block are erased.

When writing data, the write control signal W of high level H is provided to the row address buffer 711 and column address buffer 713. Accordingly, a selected word line WL is set to the write level Vpp, and a selected bit line BL is connected to the write circuit 716 through one of the block selection gates 7101 and 7102 selected according to the block selection signal. The write circuit 716 provides the selected bit line BL of the selected block with a write voltage of, for example, 6 volts to write data.

The conventional semiconductor memory device of FIG. 51 may erase a block of memory cells but is unable to simultaneously erase a plurality of blocks of memory cells. Namely, the semiconductor memory device of FIG. 51 sequentially erases blocks one after another, and thereafter, verifies the erased blocks. Accordingly, this semiconductor memory device requires a long time for erasing a plurality of blocks and must carry out a complicated verify process.

An object of the seventh aspect of the present invention is to provide a semiconductor memory device capable of simultaneously erasing a plurality of blocks of memory cells and easily verifying the erased blocks.

Figure 52A:
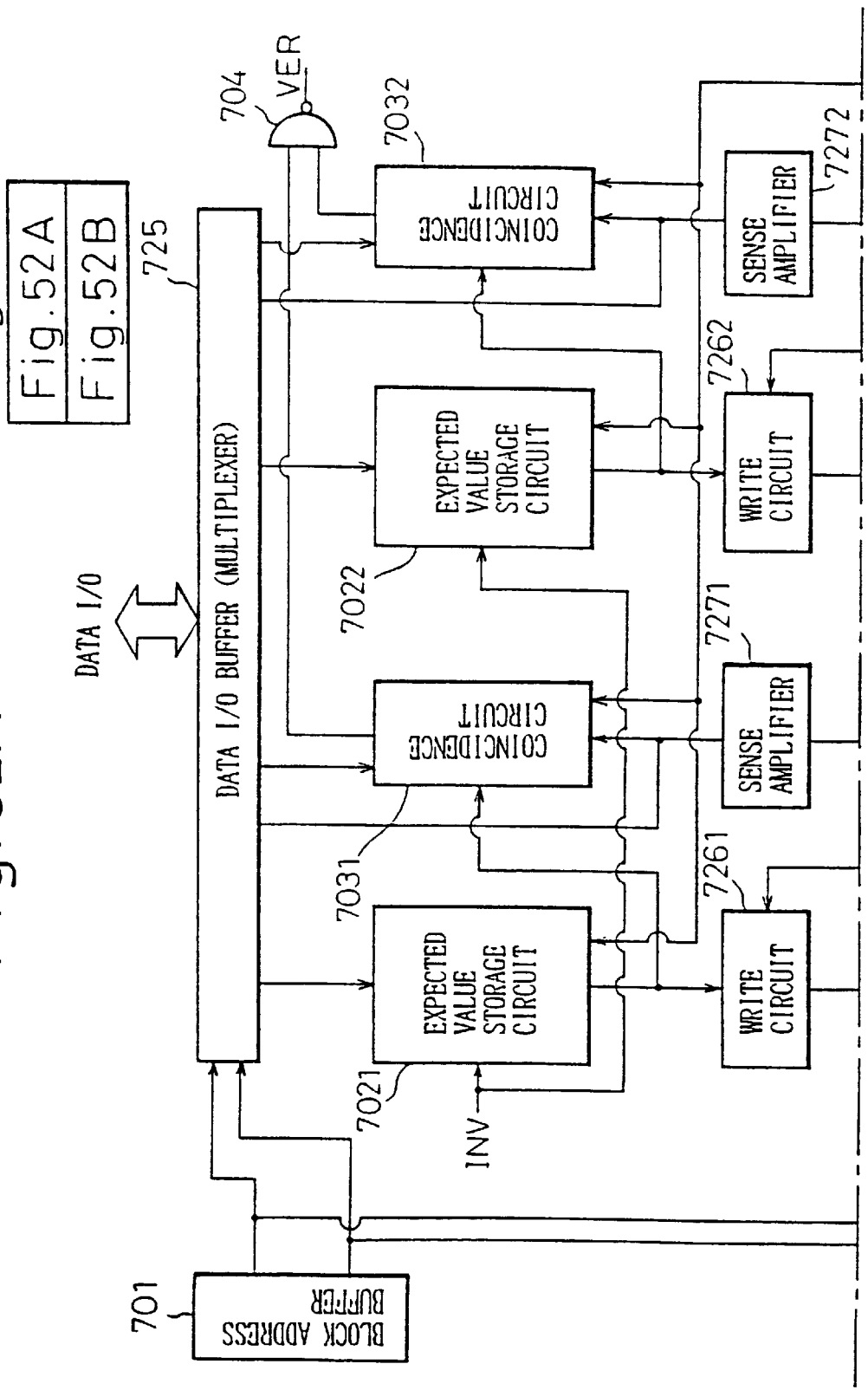
FIG. 52, consisting of FIGS. 52A and 52B, is a circuit block diagram showing an embodiment of a semiconductor memory device according to the seventh aspect of the present invention.
Figure 52B:
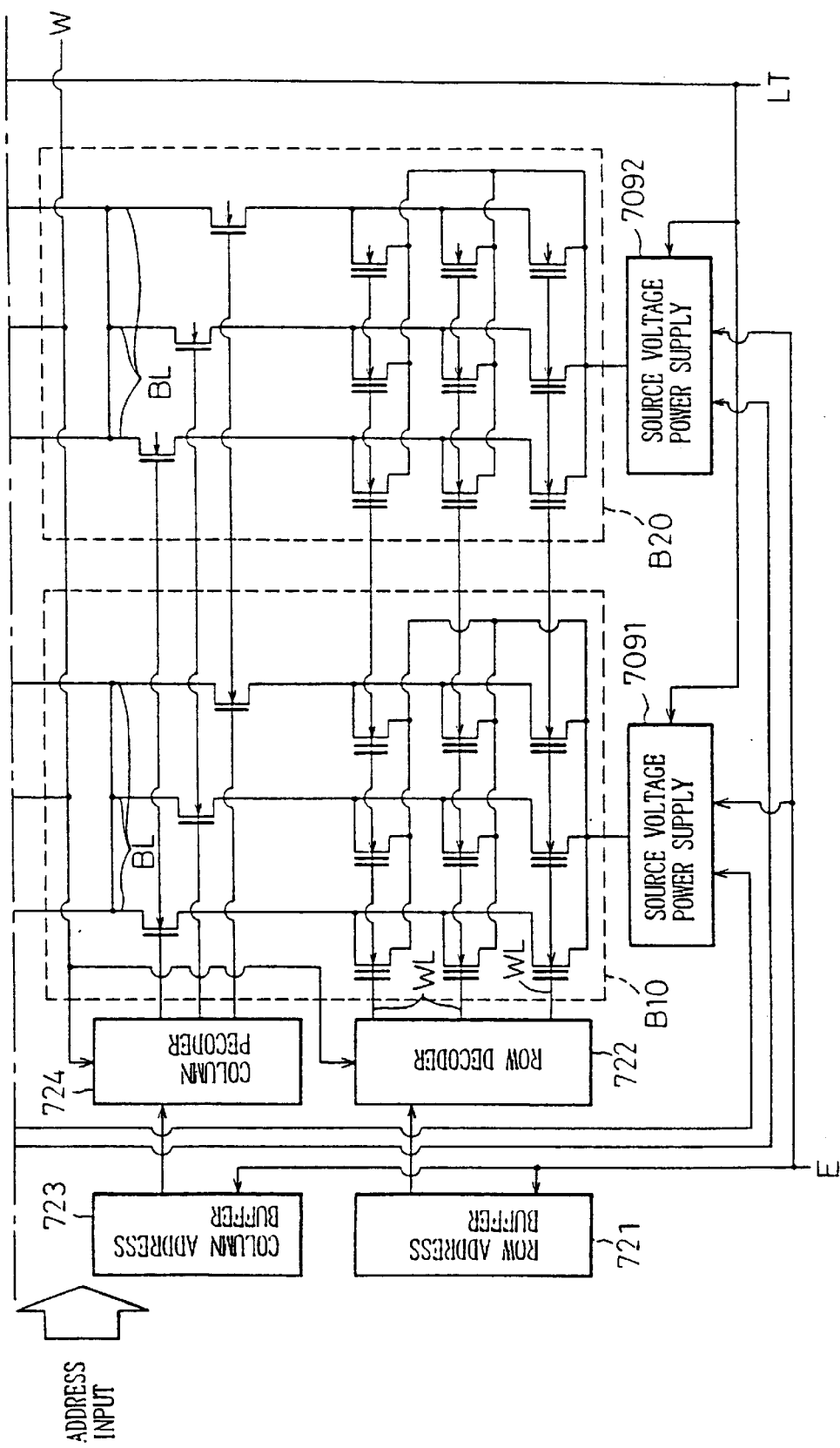

FIG. 52 shows a semiconductor memory device according to an embodiment of the seventh aspect of the present invention. This semiconductor memory device includes a block address buffer 701, expected value storage circuits 7021 and 7022, coincidence circuits 7031 and 7032, a logic circuit (NAND gate) 704, a row address buffer 721, a row decoder 722, a column address buffer 723, a column decoder 724, a data I/O buffer (multiplexer) 725, write circuits 7261 and 7262, sense amplifiers 7271 and 7272, and source voltage supply circuits 7091 and 7092. The semiconductor memory device also includes bit lines BLs, word lines WLs, memory cells MCs, a write control signal W that becomes high level H when writing data, and an erase control signal E that becomes high level H when erasing data. Compared with the conventional semiconductor memory device of FIG. 51, the embodiment of FIG. 52 additionally has the expected value storage circuits 7021 and 7022, coincidence circuits 7031 and 7032, multiplexer (data I/O buffer) 725, and NAND gate 704.

To erase blocks of memory cells, the source voltage supply circuits 7091 and 7092 latch a selection signal of the block address buffer 701 when a latch control signal LT becomes high level H. The erase control signal E is set to high level H to activate all the source voltage supply circuits that have latched the selection signal, thereby simultaneously erasing blocks of memory cells.

Figure 53:
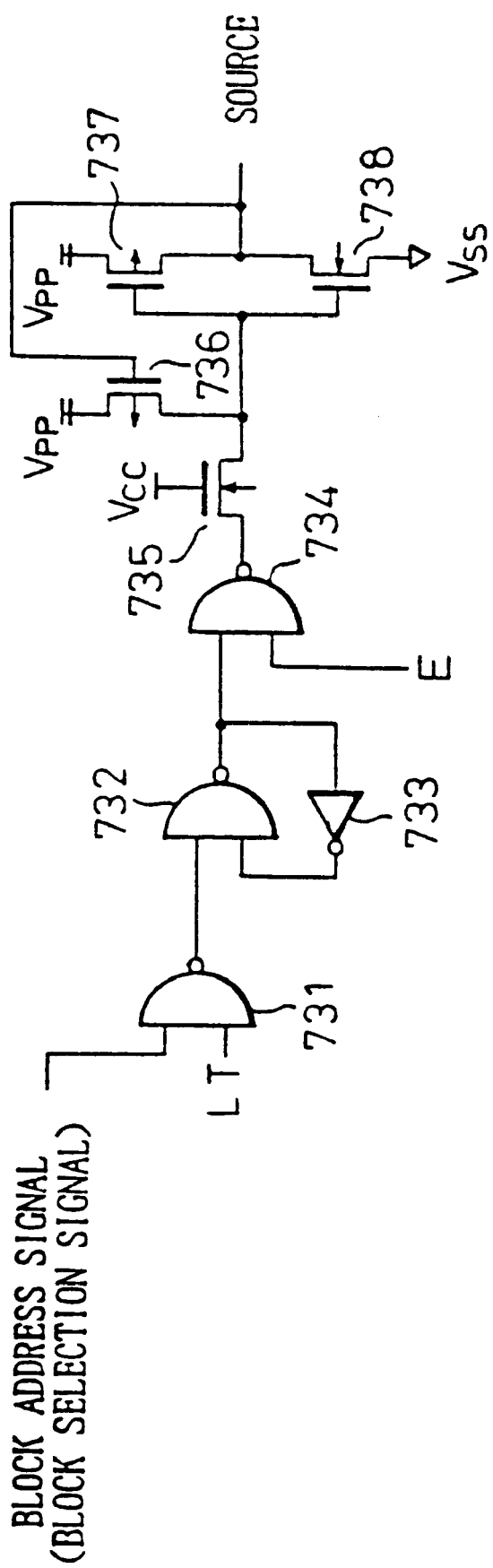
FIG. 53 is a circuit diagram showing a source voltage supply circuit of the semiconductor memory device of FIG. 52.
Figure 54:
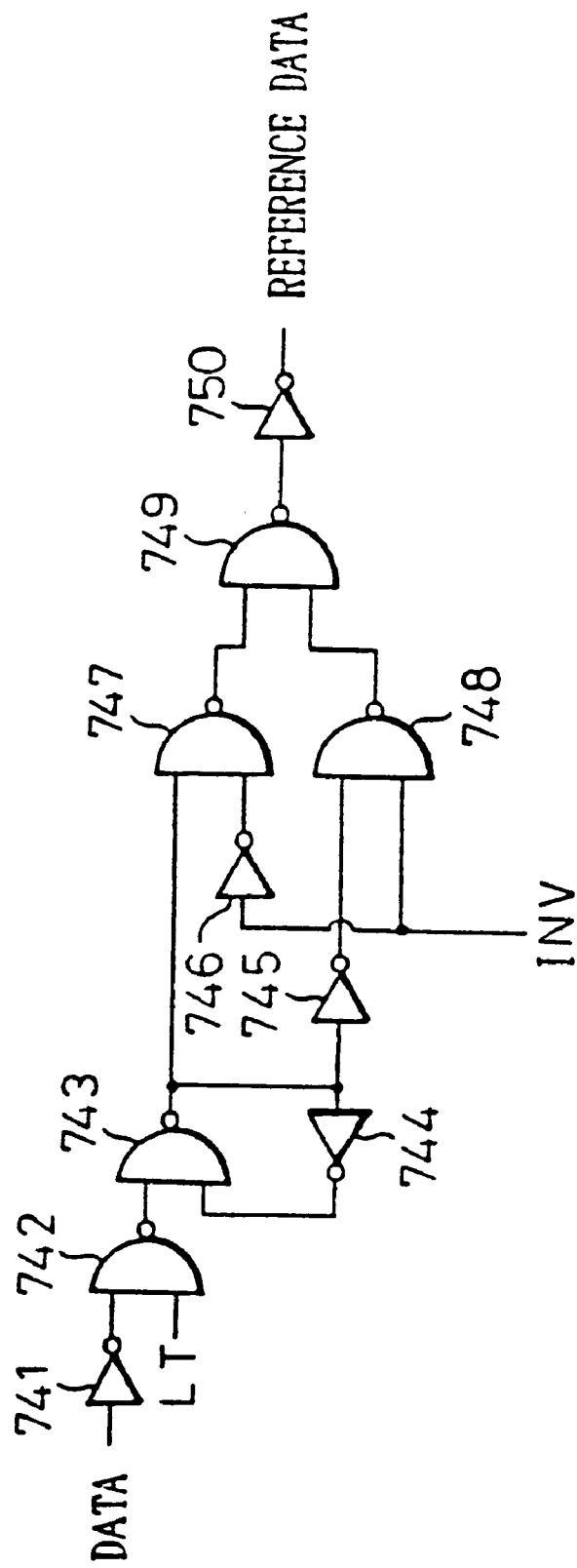
FIG. 54 is a circuit diagram showing an expected value storage circuit of the semiconductor memory device of FIG. 52.
Figure 55:
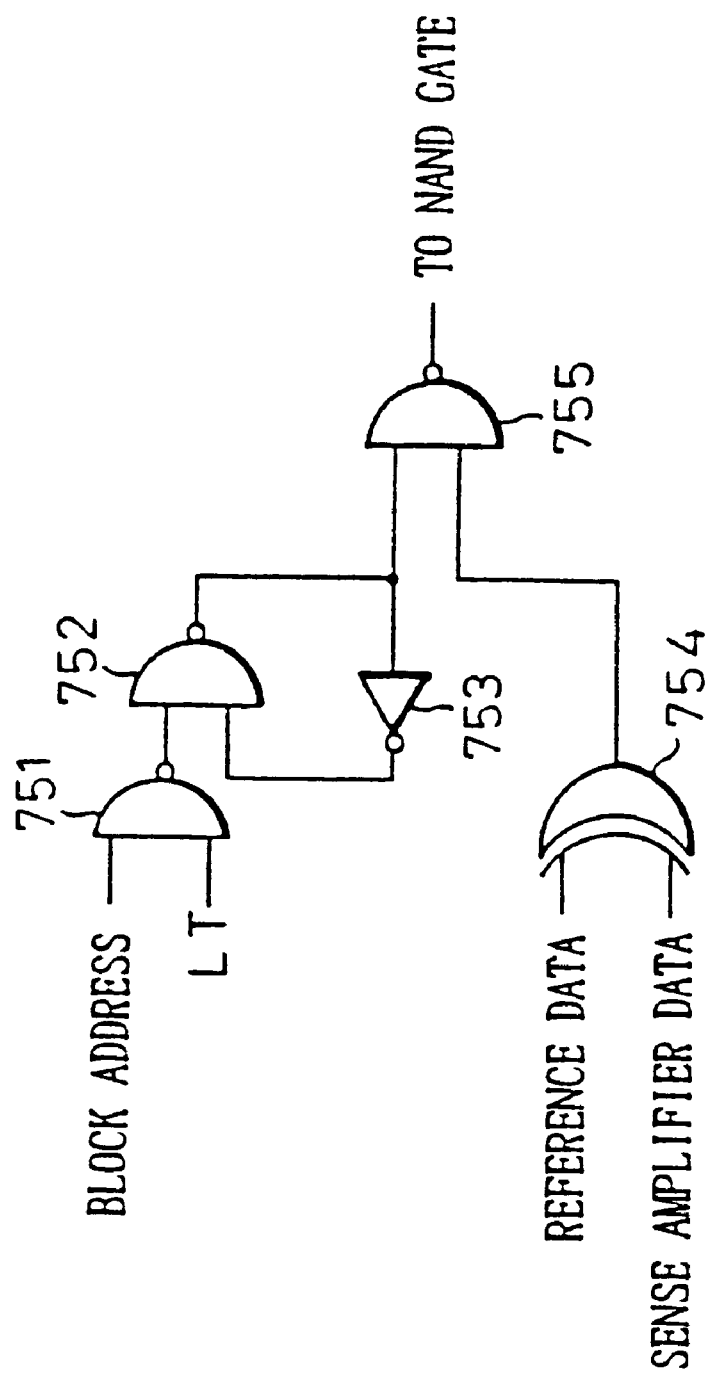
FIG. 55 is a circuit diagram showing a coincidence circuit of the semiconductor memory device of FIG. 52.

FIGS. 53 to 55 show examples of the source voltage supply circuit 7091 (7092), expected value storage circuit 7021 (7022), and coincidence circuit (7031 (7032) of the semiconductor memory device of FIG. 52, respectively.

In FIG. 53, the source voltage supply circuit 7091 (7092) has a NAND gate 731 for receiving the block address signal (block selection signal) and latch control signal LT, a latch circuit formed of a NAND gate 732 and an inverter 733, a NAND gate 734 for receiving an output of the latch circuit as well as the erase control signal E, p-channel type MOS transistors 736 and 737 connected to an erase power source Vpp, and an n-channel type MOS transistor 738. In FIG. 54, the expected value storage circuit 7021 (7022) includes inverters 741, 744, 745, 746, and 750, and NAND gates 742, 743, 747, 748, and 749. The NAND gate 743 and inverter 744 form a latch circuit. An output of the latch circuit is controlled in response to an inversion control signal INV. In FIG. 55, the coincidence circuit 7031 (7032) has an inverter 753, NAND gates 751, 752, and 755, and an exclusive OR gate 754. The NAND gate 752 and inverter 753 form a latch circuit, which determines whether or not an output of the sense amplifier 7272 (7272) agrees with a reference output of the expected value storage circuit 7021 (7022).

In the above arrangements, an erase operation is carried out by latching the block address signal. In this case, only the blocks that have latched the block address signal are erased with the erase control signal E. To carry out a write-before-erase operation, the latch control signal LT is set to high level H, and write data "0" is latched by the expected value storage circuit 7021 (7022). Namely, the data I/O buffer 725 transfers data "0" to the expected value storage circuit 7021 (7022) selected by the block address signal, and the circuit 7021 (7022) latches the data "0" when the latch control signal LT becomes high level H. An output of the coincidence circuit 7031 (7032) of an unselected block is forcibly set to high level H. When the write control signal W becomes high level H, the data is written to the selected block(s).

To carry out a verify operation, the coincidence circuit 7031 (7032) compares the expected value stored in the expected value storage circuit 7021 (7022) with an output of the sense amplifier 7271 (7272). Outputs of the coincidence circuits 7031 and 7032 are sent to the NAND gate 704. If the data has been sufficiently written, the sense amplifier 7271 (7272) provides a low level output, and therefore, the coincidence circuit 7031 (7032) provides a high level output. If the data has been sufficiently written to all the selected blocks, the NAND gate 704 provides a verify output VER of low level L to confirm that the data has been successfully written to a given address of each selected block. To carry out an erase verify operation, the expected value is inverted according to the inversion control signal INV and is verified. If data at a given address is "1" in every selected block, the verify output VER will be low level similar to the write operation, to confirm that data has been erased. In this way, according to the semiconductor memory device of this embodiment, the output of the NAND gate 704 becomes low level L only when all outputs of the coincidence circuits 7031 and 7032 are each at high level H. If any one of the coincidence circuits provides a low level output, it is confirmed that there is a defective bit.

Figure 56A:
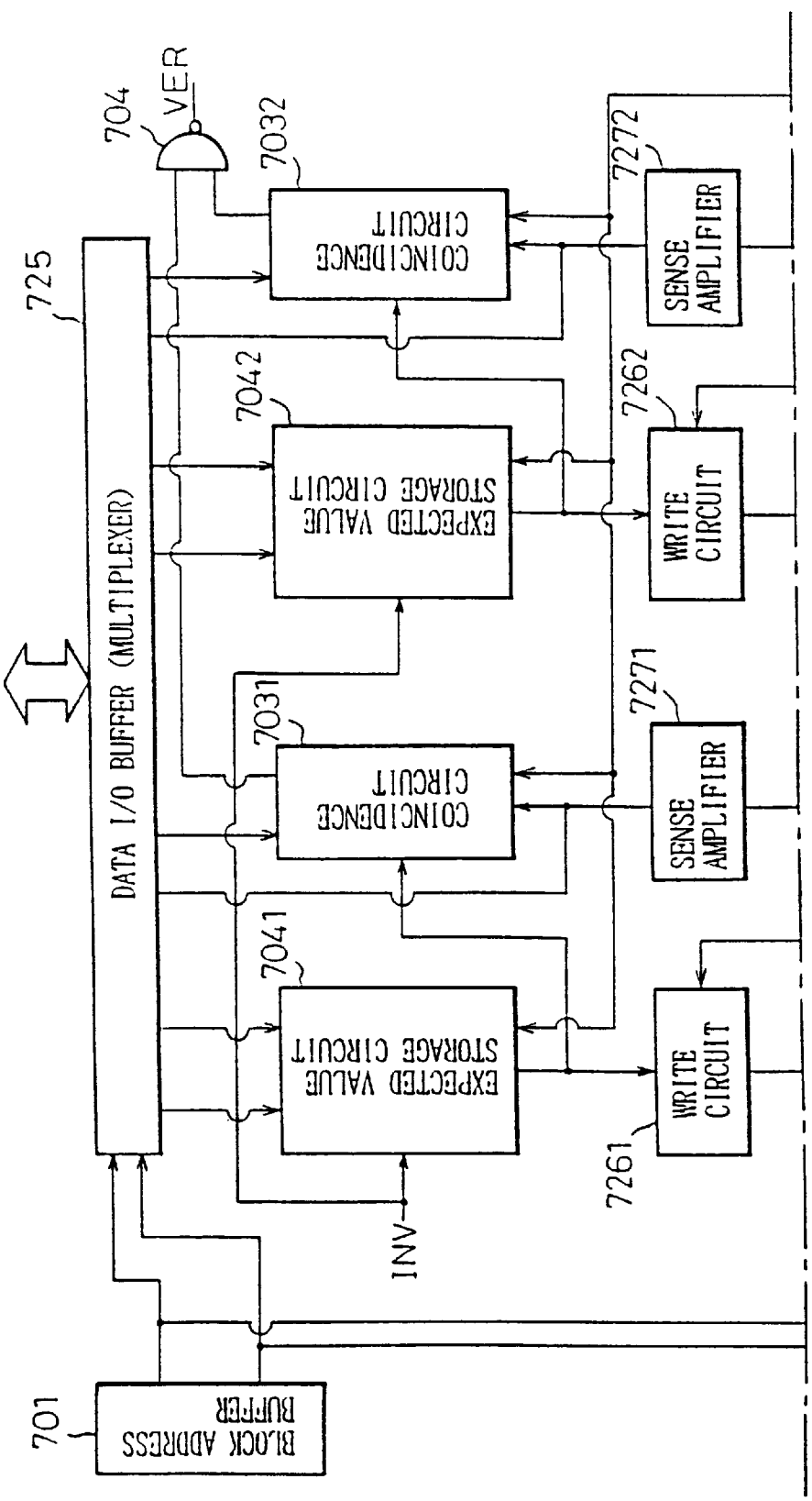
FIG. 56, consisting of FIGS. 56A and 56B, is a circuit block diagram showing another embodiment of a semiconductor memory device according to the seventh aspect of the present invention.
Figure 56B:
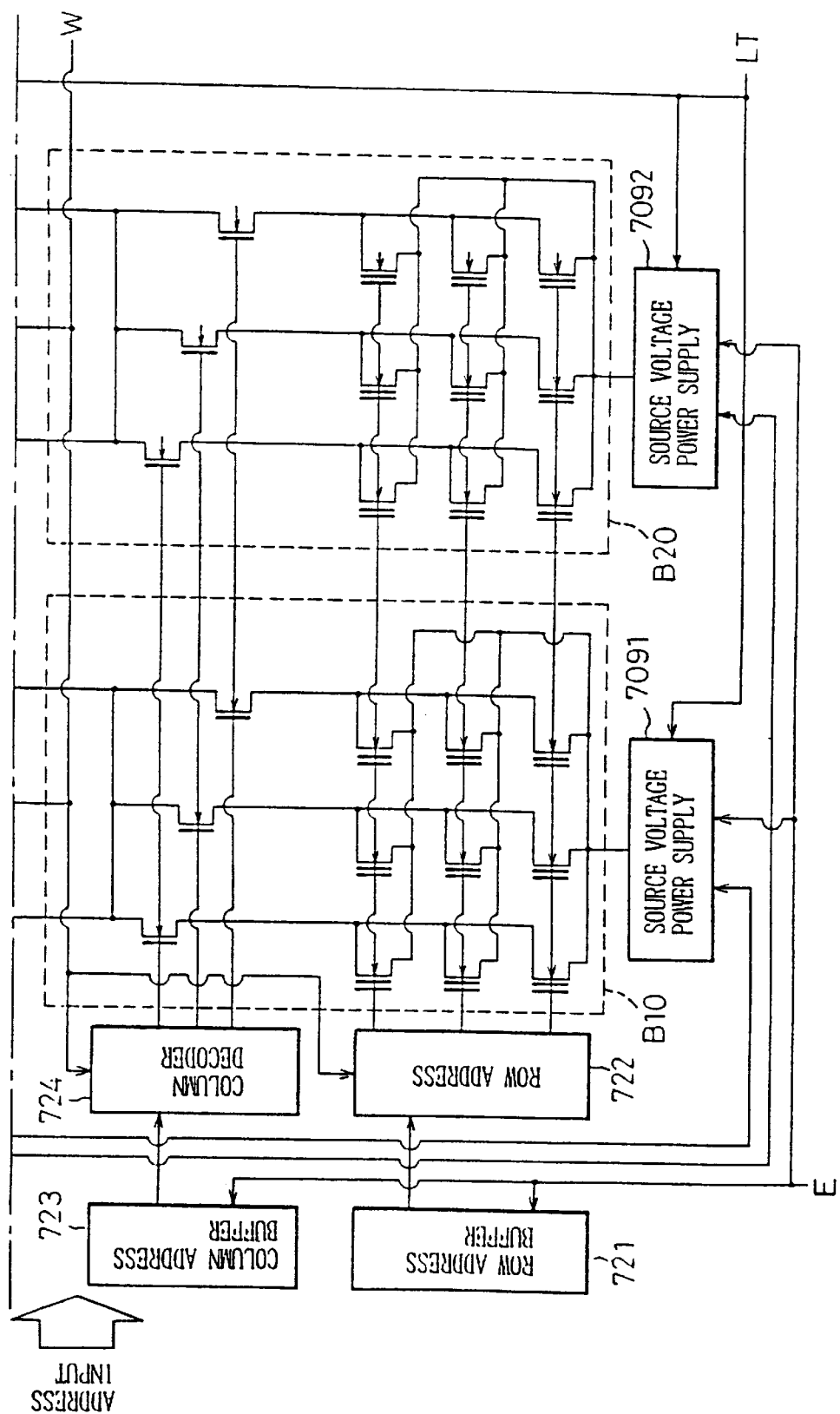

FIG. 56 is a circuit diagram showing a semiconductor memory device according to another embodiment of the seventh aspect of the present invention. This embodiment employs an expected value generator 7041 (7042) instead of the expected value storage circuit 7021 (7022) of FIG. 52.

The semiconductor memory device of FIG. 52 may be realized without a unit for storing random data because reference data necessary for the write-before-erase and erase operations are "0" and "1" for all bits. According to the embodiment of FIG. 56, the expected value generator 7041 (7042) latches its block address signal (selection signal) when the latch control signal LT becomes high level H. The expected value generator 7041 (7042) that has latched the selection signal forcibly provides data of "0." When carrying out an erase verify operation, the expected value is inverted in response to the inversion control signal INV.

Figure 57:
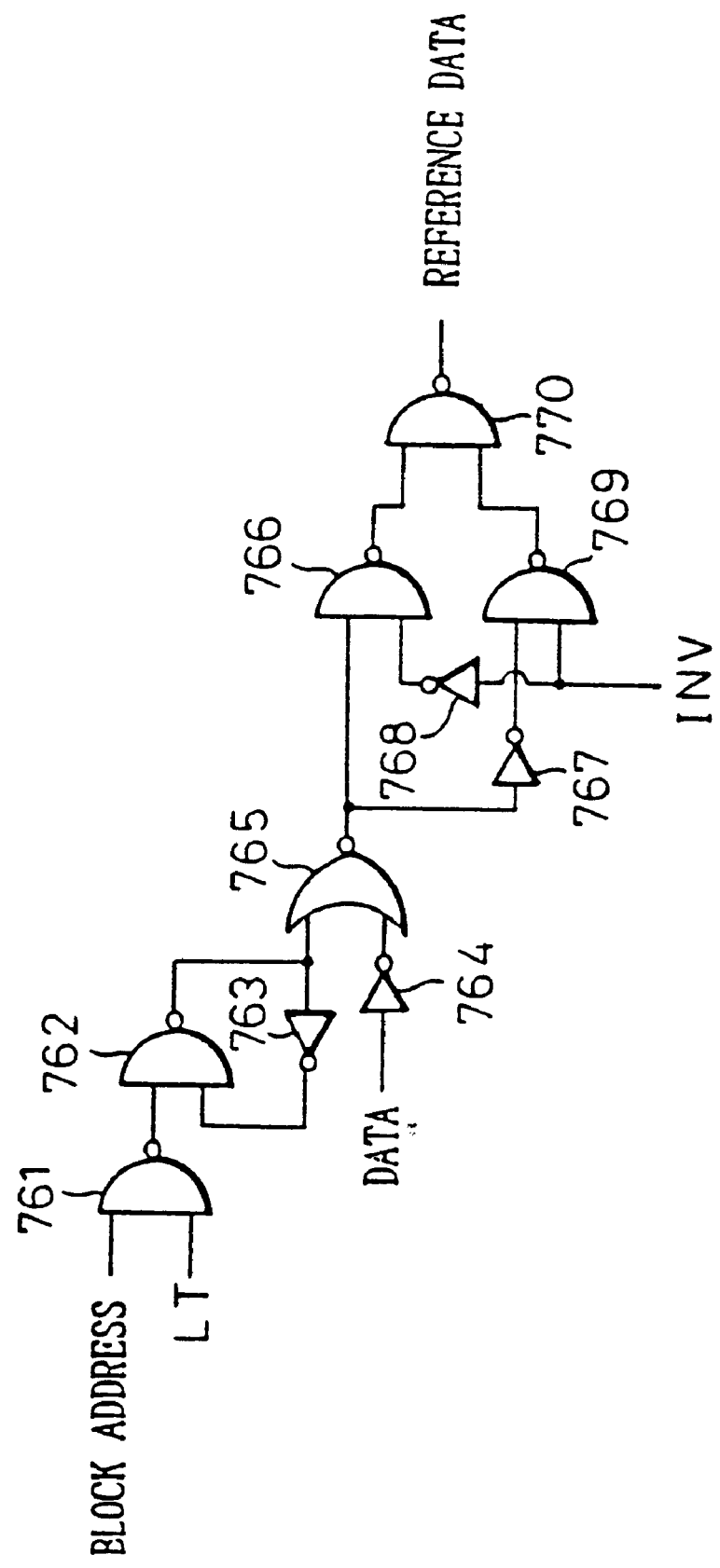
FIG. 57 is a circuit diagram showing an expected value generator of the semiconductor memory device of FIG. 56.

FIG. 57 shows an example of the expected value generator 7041 (7042) of FIG. 56. The expected value generator has inverters 763, 764, 767, and 768, NAND gates 761, 762, 766, 769, and 770, and a NOR gate 765. The NAND gate 762 and inverter 763 form a latch circuit.

This expected value generator forcibly sets reference data to low level L when the latch circuit (762, 763) latches an address data signal (block selection signal), and when the inversion control signal INV becomes high level H, changes the reference data to high level H.

Figures 58, 58A:
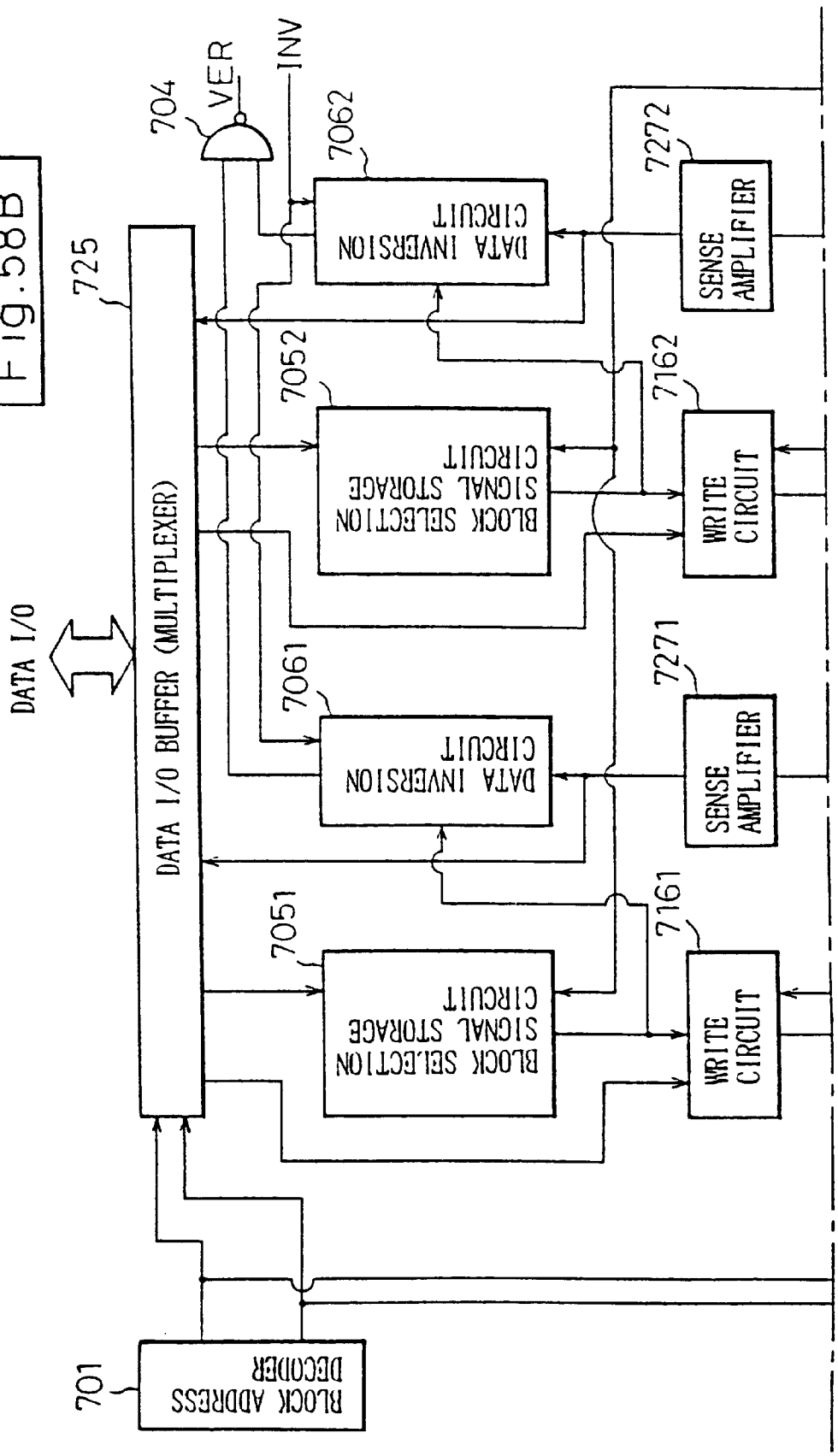
FIG. 58, consisting of FIGS. 58A and 58B, is a circuit block diagram showing still another embodiment of a semiconductor memory device according to the seventh aspect of the present invention.
Figure 58B:
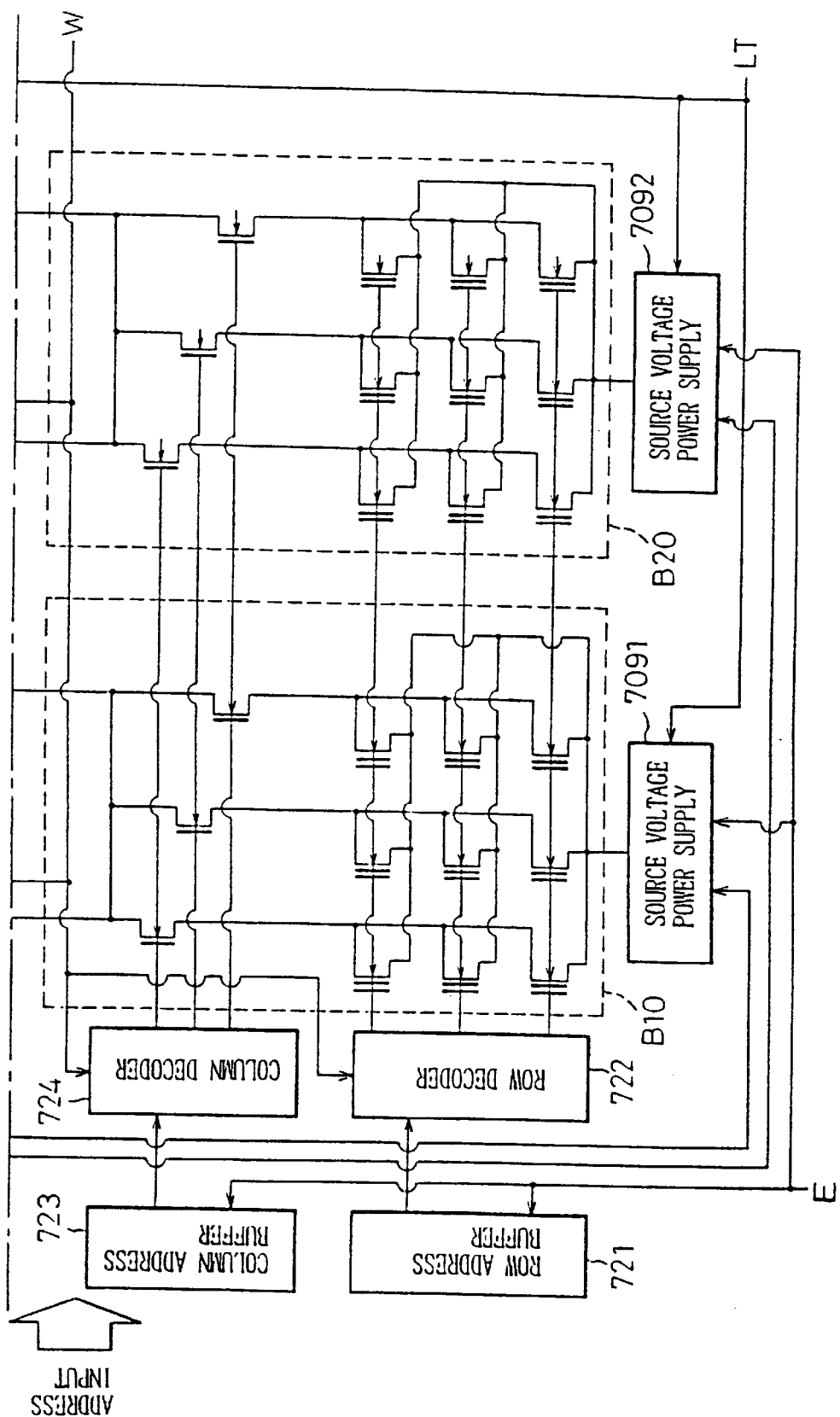

FIG. 58 is a circuit diagram showing a semiconductor memory device according to another embodiment of the seventh aspect of the present invention. This embodiment employs a block selection signal storage circuit 7051 (7052), a write circuit 7161 (7162), and a data inversion circuit 7061 (7062), in place of the expected value storage circuit 7021 (7022), write circuit 7261 (7262), and coincidence circuit 7031 (7032) of FIG. 52. Namely, this embodiment controls the write-before-erase operation, verify operation thereof, and erase verify operation in response to a selection signal stored in the storage circuit 7051 (7052).

The semiconductor memory device of FIG. 58 carries out the write-before-erase operation by writing data to cells in a block specified by a block selection signal (a block address signal). The data inversion circuit 7061 (7062) inverts data of the sense amplifier 7271 (7272) between the erase verify operation and the write verify operation, and provides an output of high level H if the write or erase operation has been sufficiently done. At this time, the sense amplifier 7271 (7272) of an unselected block always provides an output of high level H due to an output signal of the storage circuit 7051 (7052). Consequently, the write-before-erase operation and erase operation are achieved as explained before.

Figure 59:
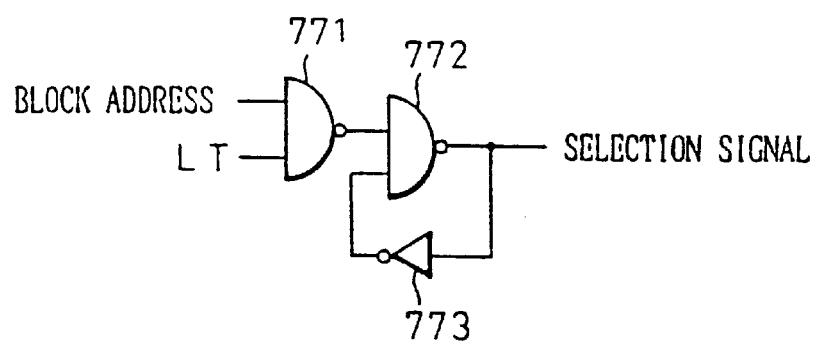
FIG. 59 is a circuit diagram showing a block selection signal storage circuit of the semiconductor memory device of FIG. 58.
Figure 60:
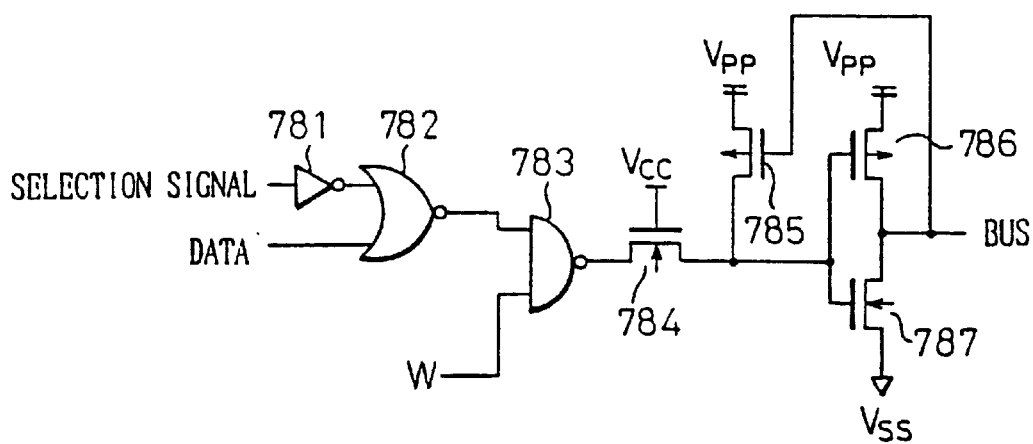
FIG. 60 is a circuit diagram showing a write circuit of the semiconductor memory device of FIG. 58.
Figure 61:
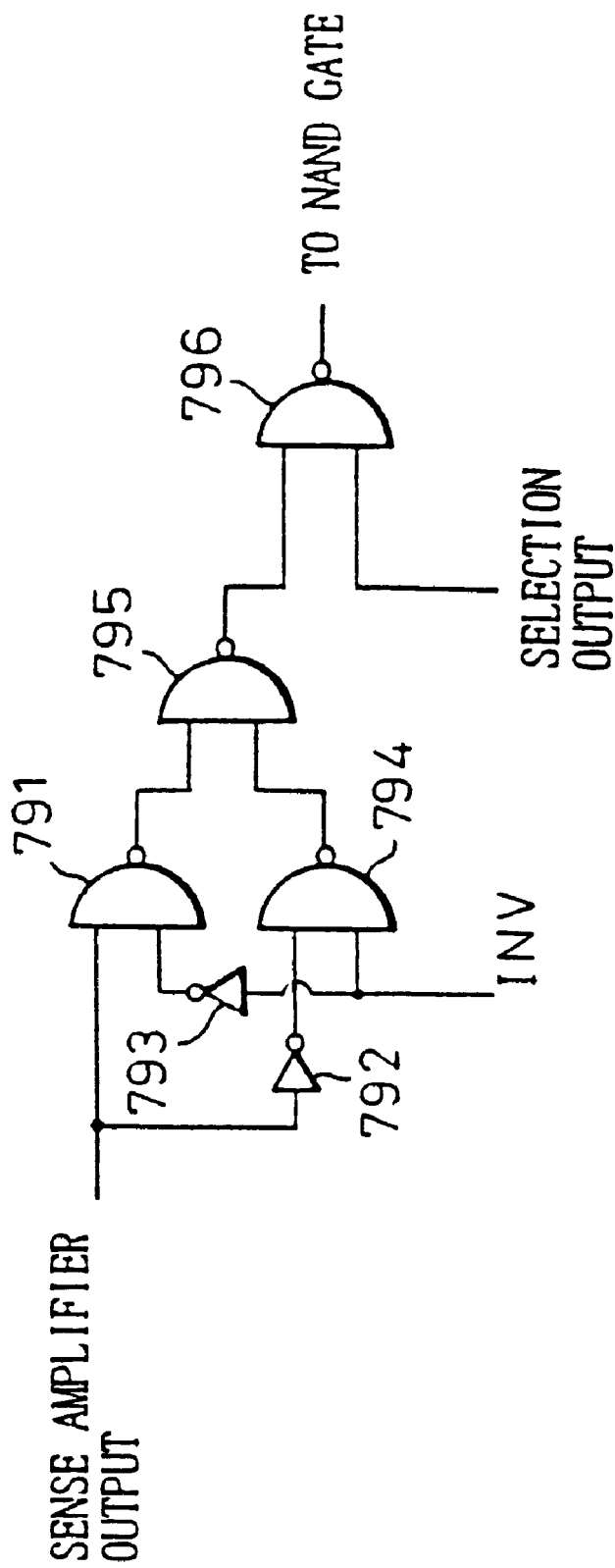
FIG. 61 is a circuit diagram showing a data inversion circuit of the semiconductor memory device of FIG. 58.

FIGS. 59 to 61 show examples of the block selection signal storage circuit 7051 (7052), write circuit 7161 (7162), and data inversion circuit 7061 (7062) of the semiconductor memory device of FIG. 58, respectively.

In FIG. 59, the block selection signal storage circuit 7051 (7052) has a NAND gate 771 for receiving the block address signal (block selection signal) and latch control signal LT, and a latch circuit formed of a NAND gate 772 and an inverter 773. In FIG. 60, the write circuit 7161 (7162) has an inverter 781, a NOR gate 782, a NAND gate 783, p-channel type MOS transistors 785 and 786 for receiving a write power source Vpp, and an n-channel type MOS transistor 787. In FIG. 61, the data inversion circuit 7061 (7062) has inverters 792 and 793, and NAND gates 791, 794, 795, and 796. The data inversion circuit inverts an output of the sense amplifier 7271 (7272) in response to the inversion signal INV and supplies the inverted signal to the NAND gate 704.

The block selection signal storage circuit 7051 (7052) of FIG. 59 latches the block address signal in the latch circuit (772, 773) in response to the latch control signal LT of high level H. In the block that has latched the block selection signal, the write voltage Vpp is applied to a bus when the write control signal W is set to high level H, irrespective of the level of input data.

The data inversion circuit 7061 (7062) of FIG. 61 inverts the output of the sense amplifier 7271 (7272) to low level L (a written state) when the inversion control signal INV becomes low level L in the write verify operation, and provides an output of high level H to the NAND gate 704. In the erase verify operation, the inversion control signal INV is set to high level H. In an unselected block, the block selection signal (block address signal) is at low level L, and therefore, the output to the NAND gate 704 is forcibly set to high level H. As a result, optional blocks are simultaneously erased. The multiplexer 725 follows the block selection address to supply write data to given blocks and data from given sense amplifiers to the outside.

As explained above, the semiconductor memory device according to the seventh aspect of the present invention employs a latch circuit of a block selection signal in a source voltage supply circuit of each cell block. The source voltage supply circuits are simultaneously activated. Each cell block is provided with a sense amplifier, an expected value generator, and a circuit for confirming the coincidence of a sense amplifier output and an expected value. The semiconductor memory device further has a circuit for providing an AND output of the coincidence circuits, to simultaneously carry out erase and verify operations.

A semiconductor memory device according to an eighth aspect of the present invention will be explained with reference to FIGS. 62 to 73.

Semiconductor memories such as EEPROMs (electrically erasable programmable read only memory) have attracted attention recent years. In particular, flash memories have attracted considerable attention as a replacement for magnetic storage devices because they are suitable for integration. Although the following explanation of the present invention is made in connection with the flash memories, the present invention is also applicable for standard EEPROMs.

Each memory cell of a flash memory has a floating gate and a control gate. Data is stored in the cell depending on whether or not the floating gate holds charges. To write data to the cell, a high voltage of about +12 V is applied to the control gate, a voltage of about +6 V is applied to a drain, a source is grounded, and hot electrons are injected into the floating gate. To read data from the cell, a voltage of about +5 V is applied to the control gate, a voltage of about +1 V is applied to the drain, the source is grounded, and charges accumulated in the floating gate are sensed to detect a current difference. To erase data from the cell, a high voltage of about +12 V is applied to the source, the control gate is grounded, and the drain is opened to produce a tunnel current between bands. As a result, electrons are drawn from the floating gate to the source. When writing data to the cell, a drain current of about several milliamperes flows, and a current of several tens of milliamperes is needed in total. Accordingly, a power source for a normal voltage Vcc (+5 V) and a power source for a high voltage Vpp (+12 V) are needed.

Figure 62:
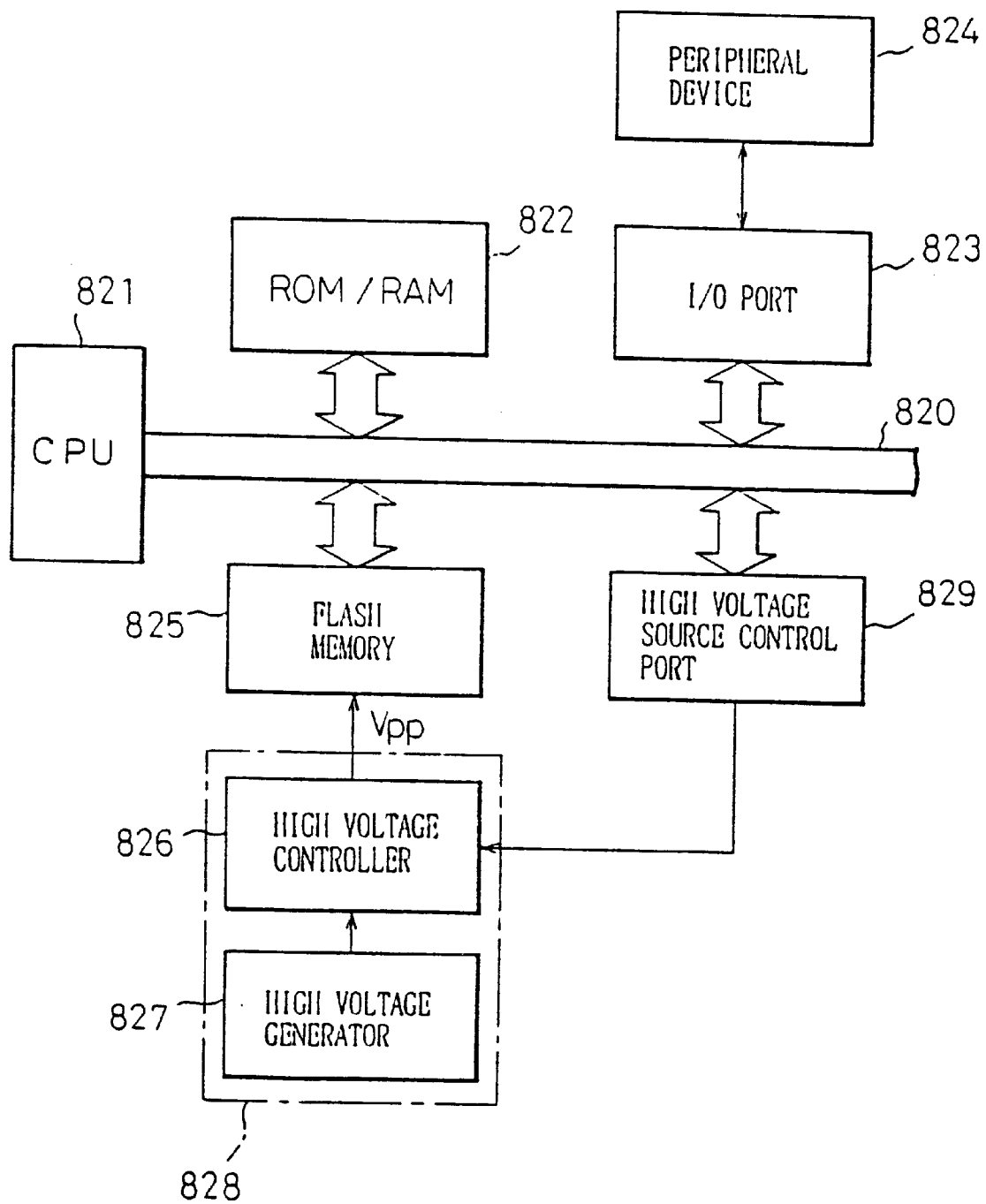
FIG. 62 is a block diagram showing a conventional system using a semiconductor memory device related to the eighth aspect of the present invention.

FIG. 62 shows a conventional computer system employing a flash memory. In addition to a power source for a normal voltage, this system has a power source for a high voltage. The system involves a central processing unit (CPU) 821, a ROM/RAM 822, an input/output (I/O) port 823, a peripheral device 824, the flash memory 825, the high voltage supply source 828, and a control port 829 for controlling the high voltage supply source 828. The high voltage supply source 828 includes a high voltage controller 826 and a high voltage generator 827. The high voltage supply source 828 is controlled by the CPU 821 through the control port 829, to supply and stop a high voltage Vpp to the flash memory 825. The high voltage generator 827 may be a fixed power source or a step-up circuit. In the case of the fixed power source, the high voltage controller 826 will be simply a switch. In the case of the step-up circuit, it is activated by the controller 826 only when needed, to reduce power consumption.

Figure 63:
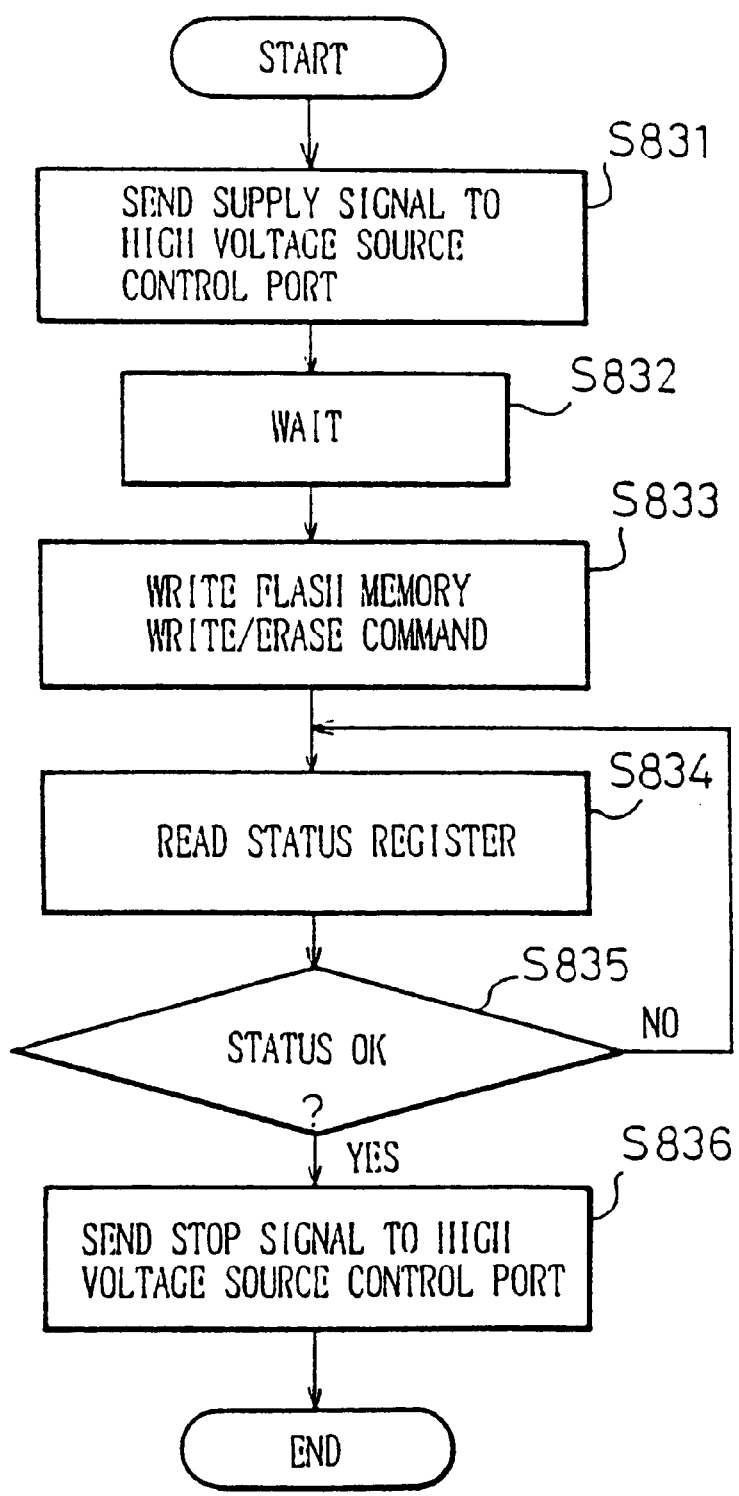
FIG. 63 is a flowchart showing an example of the control operation for controlling the system of FIG. 62.

The flash memory 825 is not frequently written to or erased, and therefore, the high voltage is supplied only when needed. FIG. 63 shows steps of controlling the high voltage supply source 828 when writing and erasing data in the system of FIG. 62. Each of the steps will be briefly explained.

Step S831 provides the control port 829 with an instruction to supply a high voltage. In the case of the fixed power source, the controller 826 is switched to supply the high voltage. In the case of the step-up circuit, a step-up operation is started. Step S832 waits until a sufficient high voltage is supplied. In the case of the fixed power source, this step is omitted.

Step S833 writes a write command or an erase command to the flash memory 825. Steps S834 and S835 test a state after the step S833. If no problem is found, step S836 causes the control port 829 to provide a signal for stopping the high voltage.

In practice, it is disadvantageous to prepare a high voltage supply source in addition to a normal voltage supply source. Namely, flash memories operating with a single power source are needed.

One of such flash memories operating with a single power source incorporates a step-up circuit for increasing a normal voltage Vcc to a high voltage Vpp. The increased high voltage Vpp is applied to the control gate of a memory cell, and the normal voltage Vcc instead of a voltage of +6 V is applied to the drain thereof. Although this technique lowers the avalanche breakdown voltage of the drain, it causes little current to flow to the control gate so that even the internal step-up circuit having a small current supply capacity will be sufficient to produce the voltages. When a voltage is applied to the drain, a large quantity of current is needed. In this case, the normal voltage is used. Consequently, the single power source works to write and erase data.

To reduce the power consumption of the flash memory, it is necessary to reduce the normal voltage Vcc. When the normal voltage Vcc, which is low, is directly applied to the drain of a memory cell, the normal voltage Vcc may be lower than the avalanche breakdown voltage. In this case, data cannot be written. To solve this problem, a separate high voltage source similar to that of the prior art may be used. Many systems, however, are designed to work with a single power source, so that, if a flash memory operating with a separate high voltage source is employed for such systems, software for controlling the high voltage source must be modified. This modification is troublesome thus deteriorating the value of the flash memory.

Since the flash memories do not work with a low voltage, the normal voltage Vcc must be high. This means that a power source providing a low normal voltage is useless for the flash memories.

An object of the eighth aspect of the present invention is to provide a semiconductor memory device employing two power sources that are easy to use and operable like a single power source.

Figure 64:
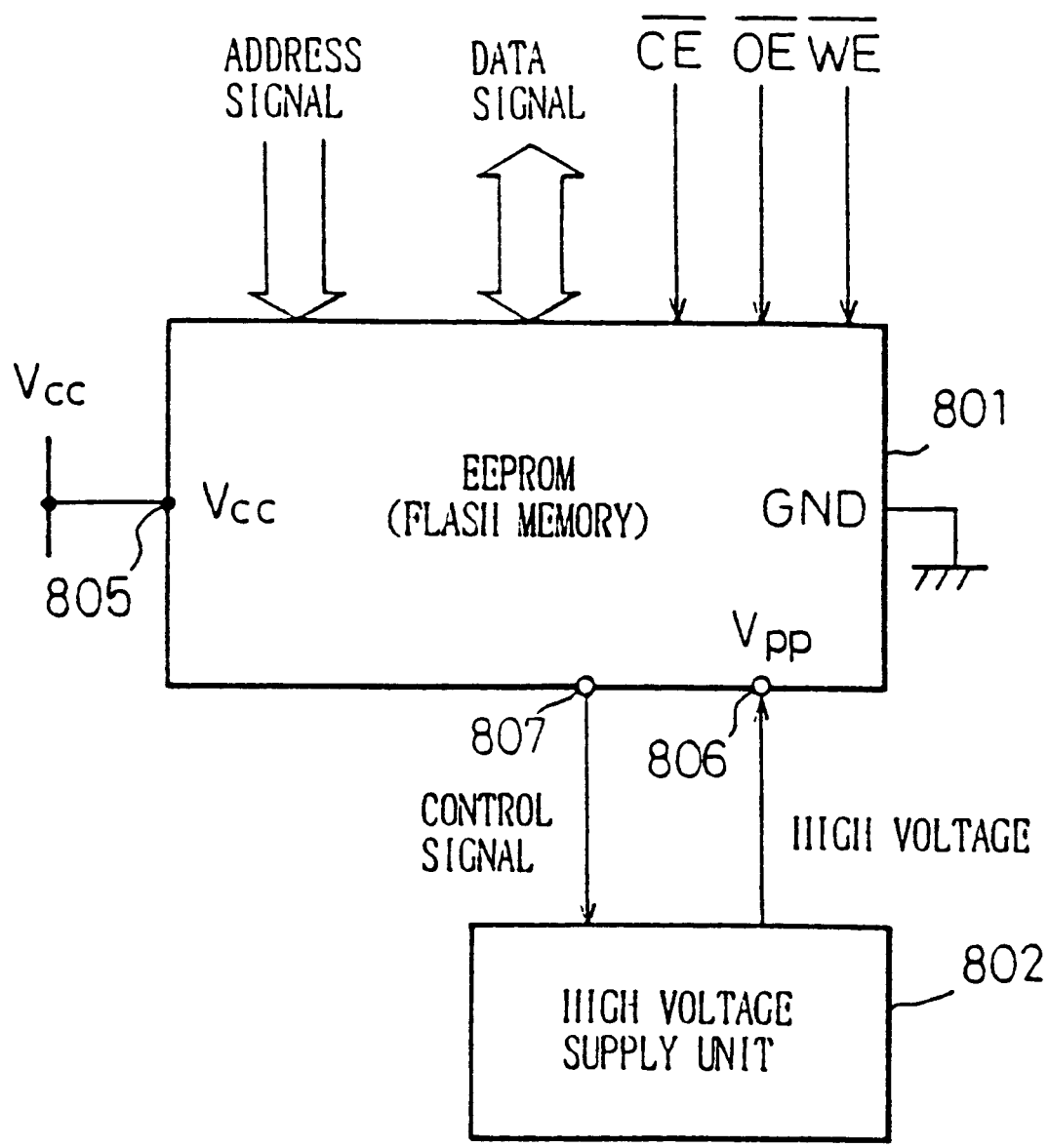
FIG. 64 is a diagram for explaining the principle of a semiconductor memory device according to the eighth aspect of the present invention.

FIG. 64 explains the principle of an electrically erasable nonvolatile semiconductor memory device according to the eighth aspect of the present invention.

This semiconductor memory device (nonvolatile semiconductor memory device) writes or erases data with a high voltage Vpp that is higher than a normal voltage Vcc used to read data. The nonvolatile semiconductor memory device has a terminal 806 for receiving the high voltage Vpp from an external high voltage supply unit 802, in addition to a terminal for receiving the normal voltage. The semiconductor memory device has a control terminal 807 for providing the high voltage supply unit 802 with a control signal to control the supply of the high voltage Vpp.

The signal terminal 807 of the semiconductor memory device (EEPROM) according to the eighth aspect of the present invention provides, when needed, the high voltage supply unit 802 with a control signal to control the supply of the high voltage. Unlike the prior art, a computer system employing the flash memory of the present invention is not required to control the high voltage supply unit 802. Similar to the nonvolatile semiconductor memory device having a single power source, the semiconductor memory device of the present invention automatically controls the high voltage supply unit 802 when the semiconductor memory device is accessed. Accordingly, the nonvolatile semiconductor memory device of the eighth aspect of the present invention is operable in the same manner as that with a single power source, and requires no software amendment.

Figure 65:
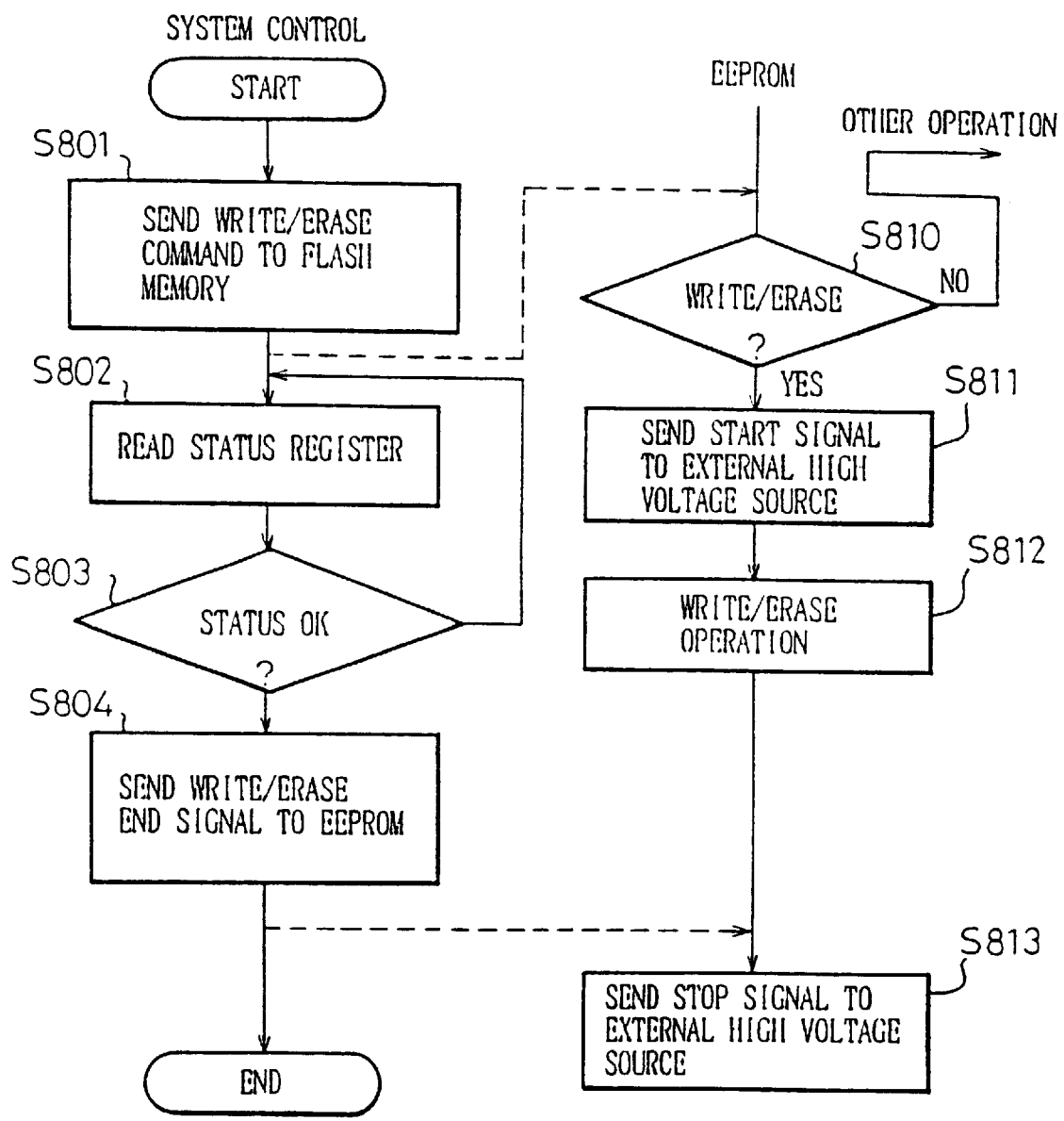
FIG. 65 is a flowchart showing the steps of processing a high voltage requiring operation in a system employing a semiconductor memory device according to the eighth aspect of the present invention.

FIG. 65 shows steps of providing a high voltage in a system employing the nonvolatile semiconductor memory device (EEPROM) of the present invention.

Steps S801 to S804, on the left side of FIG. 65, are carried out in the system, and steps S810 to S813 are carried out in the EEPROM. Step S801 sends a write or erase command to the EEPROM. In response to command, step S810 determines the kind of the command. If it is a command to read data, no high voltage is required. In this case, the following steps are skipped, and a read operation is carried out. If the command is to write or erase data, step S811 causes the signal terminal 807 to send an instruction to start the supply of the high voltage. Then, the process waits until the supplied high voltage reaches a sufficient level. If the high voltage power source is a fixed power source, no wait is required.

Once the supplied high voltage reaches a sufficient level, step S812 carries out the write or erase operation. In the case of the erase operation, the system is not required to carry out any of the operation, and therefore, the system can commence another operation. In the case of the write operation, the system provides write data. In any case, in the middle of or after the write or erase operation, the system carries out a test in steps S802 and S803.

Step S804 informs the EEPROM of the completion of the write or erase operation. In response to this, the EEPROM sends a signal to stop the high voltage in step S813. The write or erase operation usually handles a large quantity of data, so that the write/erase operation continues for a certain period. Accordingly, if the EEPROM detects that the write/erase operation has ended in the middle of a certain period, it may automatically provide the signal to stop the high voltage.

In any case, processes to be carried out in the system are simplified compared with the prior art of FIG. 63.

Figure 66:
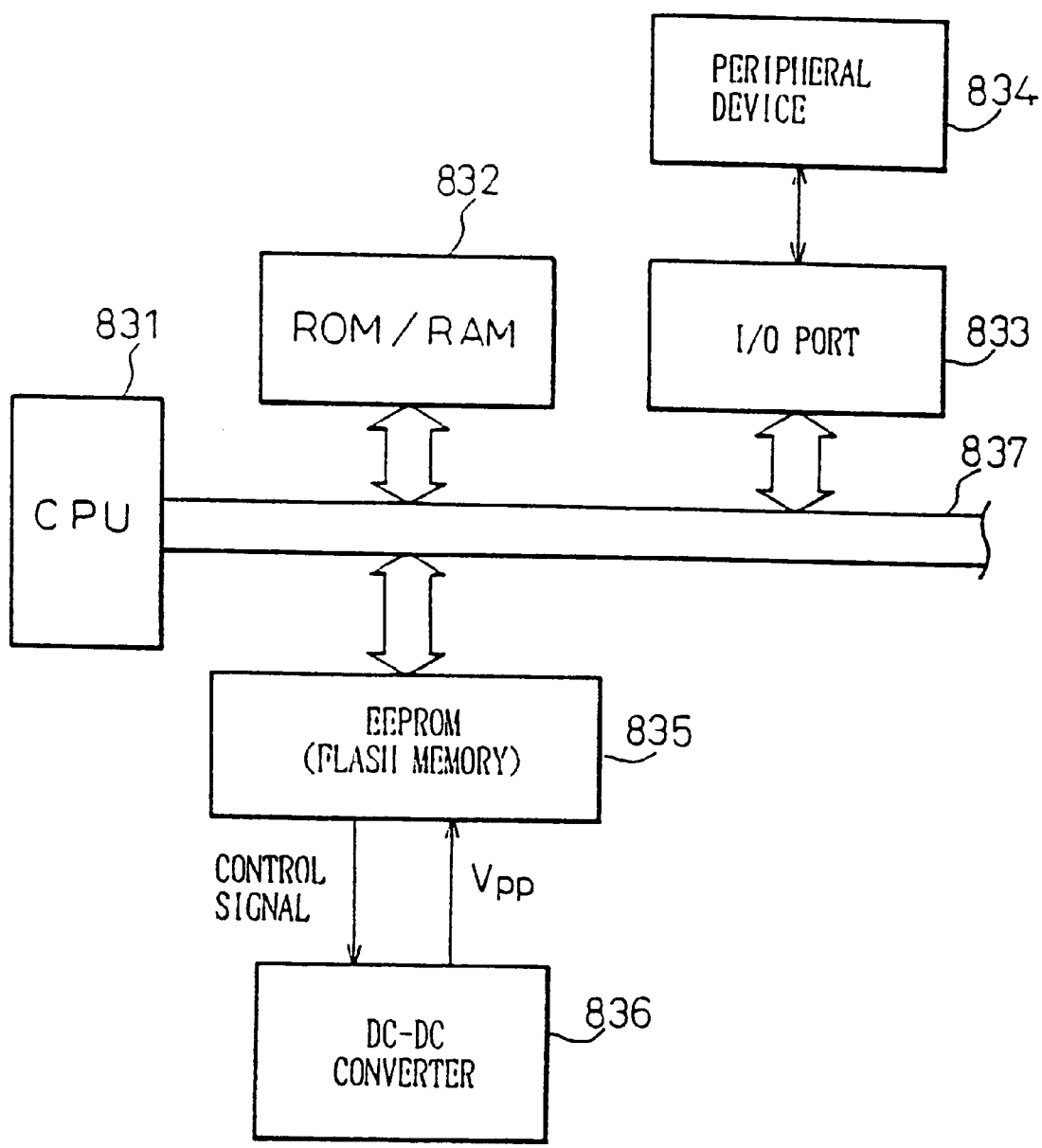
FIG. 66 is a block diagram showing a total system using a semiconductor memory device according to the eighth aspect of the present invention.

FIG. 66 shows a system according to an embodiment of the semiconductor memory device according to the eighth aspect of the present invention.

This system includes a central processing unit (CPU) 831, a ROM/RAM 832, an I/O port 833, a peripheral device 834, a flash memory 835 of the present invention, and a DC-DC converter 836 for generating a high voltage. The DC-DC converter 836 is turned ON and OFF in response to a control signal from the flash memory 835.

In comparison with the system of FIG. 62, the system of FIG. 66 has no output port through which the CPU 831 controls the DC-DC converter 836. The system of FIG. 66 is basically the same as a system with a flash memory having a single power source.

Figure 67:
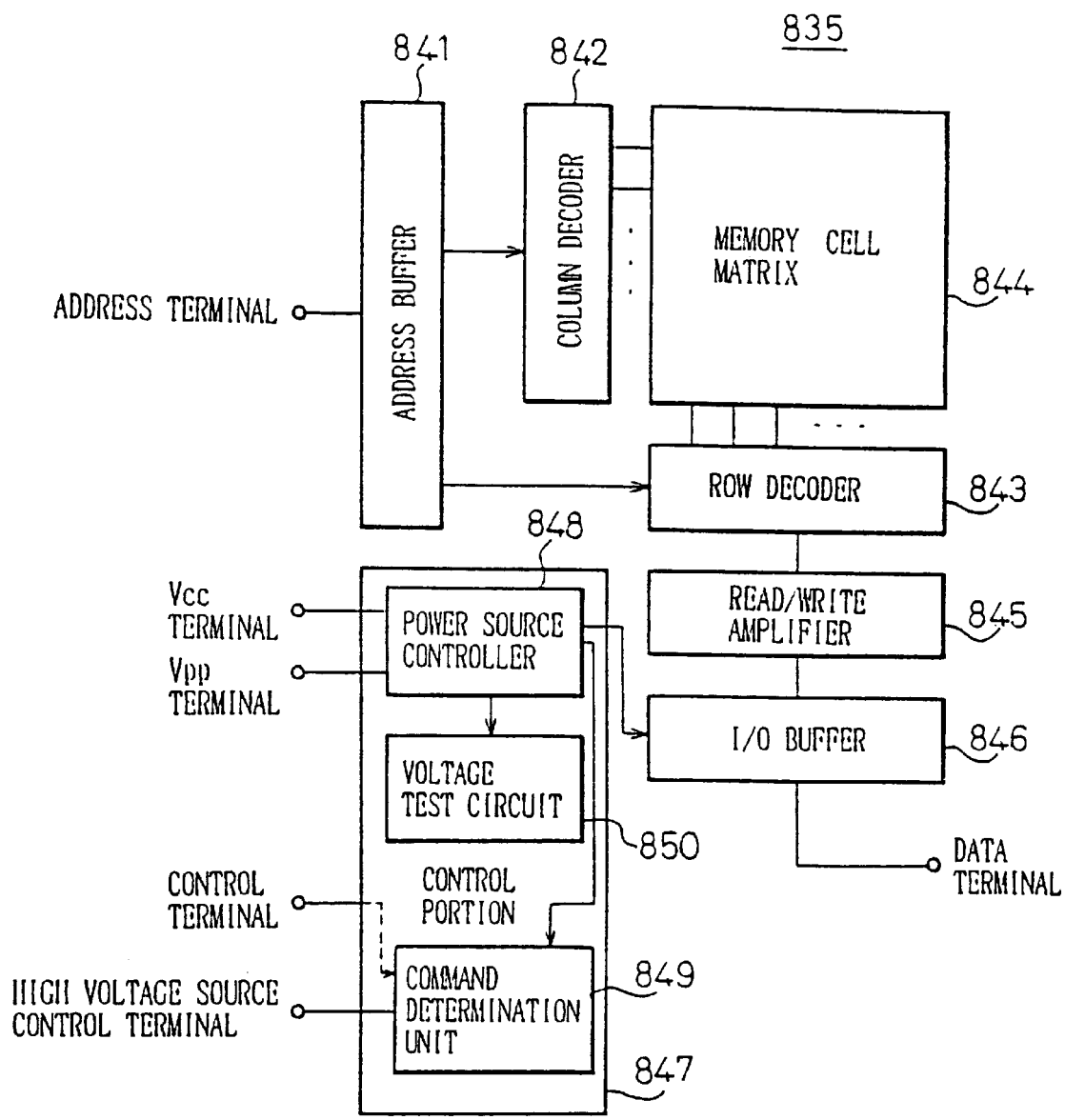
FIG. 67 is a block diagram showing an embodiment of a semiconductor memory device according to the eighth aspect of the present invention.

FIG. 67 shows the internal arrangement of the flash memory 835 of FIG. 66. The flash memory 835 has an address buffer 841, a row decoder 842, a column decoder 843, a memory cell matrix 844, a read/write amplifier 845, an I/O buffer 846, and a controller 847. The flash memory 835 involves external I/O terminals such as an address terminal, a data terminal, a normal power source (Vcc) terminal, a high voltage (Vpp) terminal, and a control terminal. These are the same as those of the conventional flash memory.

What is different from the conventional flash memory is that the flash memory of FIG. 67 has a command determination unit 849, a voltage test circuit 850, and an external I/O terminal for controlling a high voltage supply source. The command determination unit 849 is a comparator for finding, for example, a write or erase command to the flash memory 835. When the CPU 831 provides a write or erase command to the flash memory 835, the command determination unit 849 detects the command and provides the high voltage source control terminal with a signal to start the supply of the high voltage. The command determination unit 849 may be a timer circuit that is reset by a write signal *WE.

Figure 69:
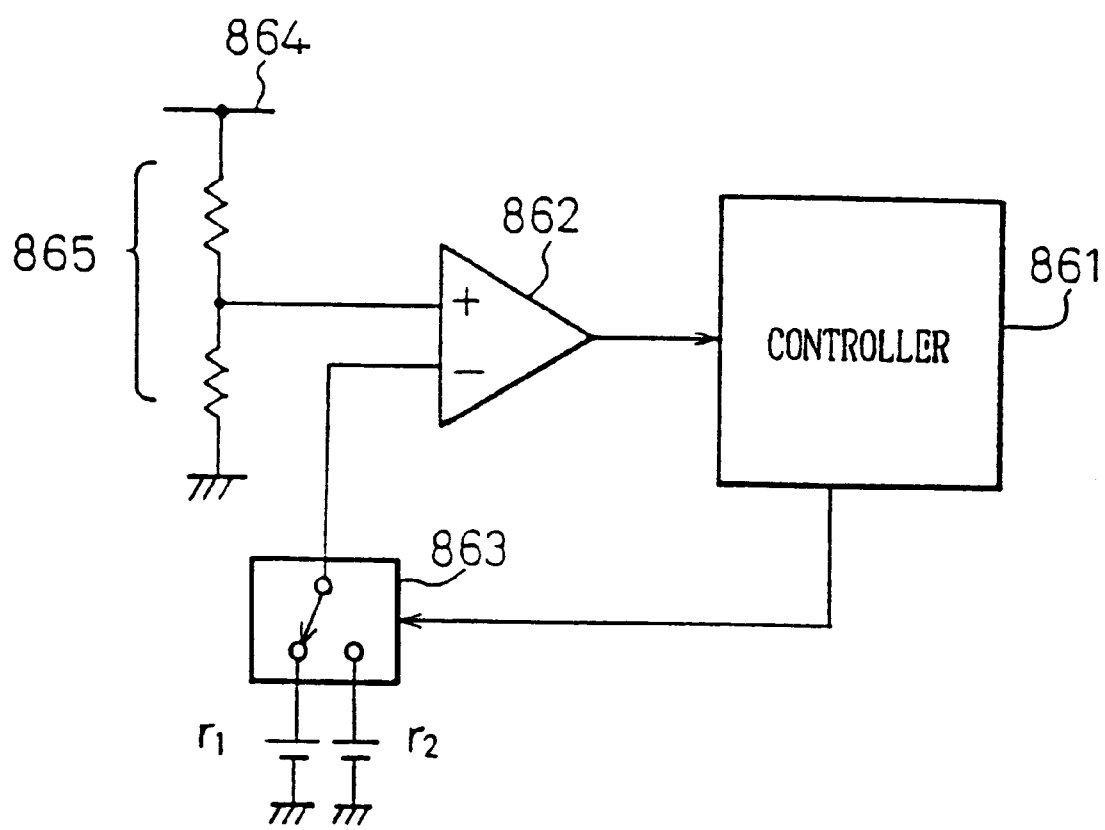
FIG. 69 is a circuit block diagram showing a voltage test circuit shown in FIG. 67.

The voltage test circuit 850 tests if a supplied high voltage is greater than a predetermined value. FIG. 69 shows an example of the voltage test circuit 850. This circuit tests not only the high voltage but also if the high voltage Vpp and normal voltage Vcc applied to internal power source lines are greater than respective reference values. The voltage test circuit 850 includes a sequence circuit 861 for carrying out a main control operation. A comparator 862 compares a voltage, which comes from an internal power source line 864 and is divided by a resistor 865, with one of reference voltages $r_1$ and r2. These reference voltages are switched from one to another through a switch 863.

Figure 68:
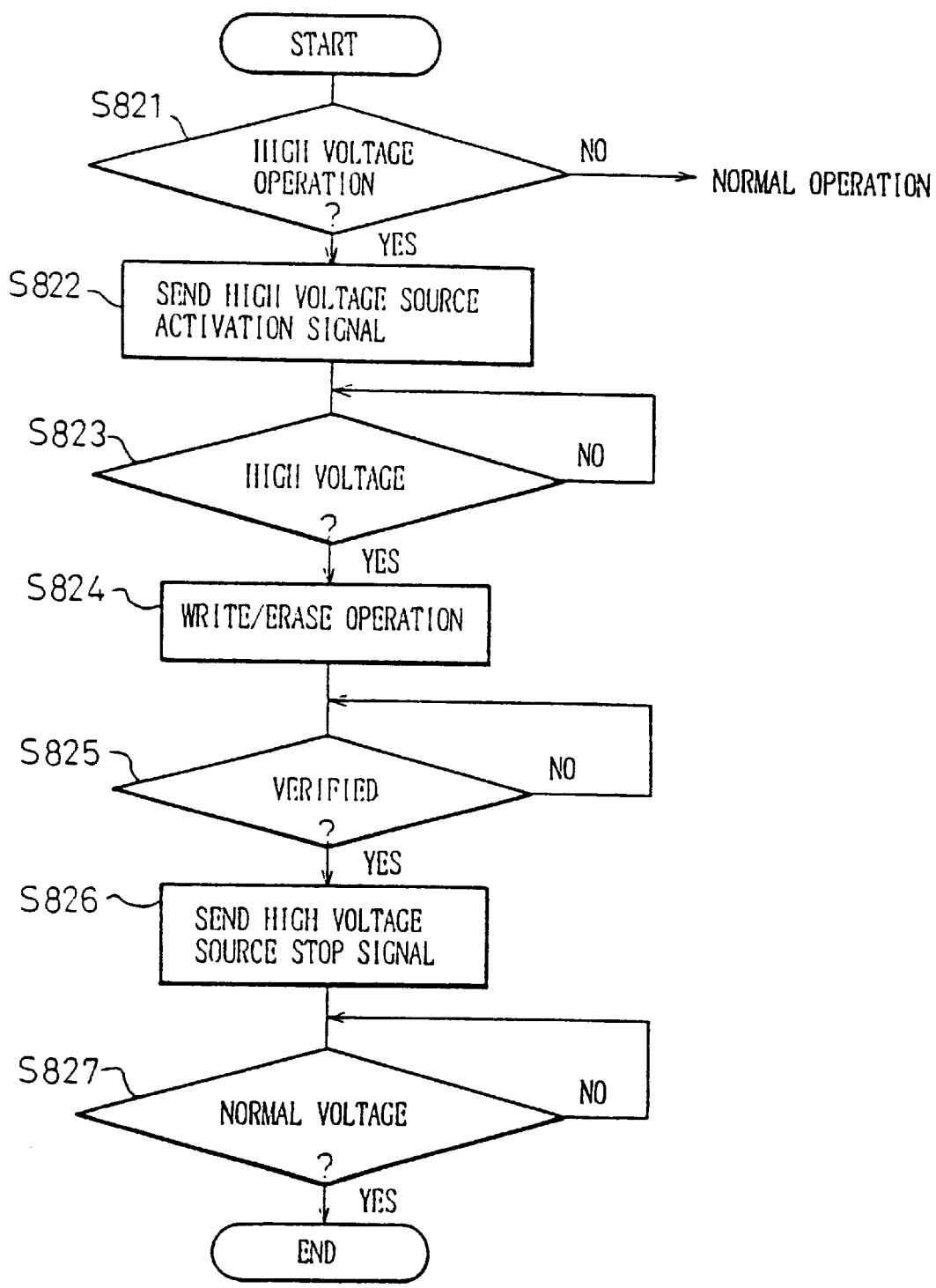
FIG. 68 is a flowchart showing an example of the control operation for controlling the system of FIG. 66.

FIG. 68 shows steps of controlling the external power source for the flash memory 835. Step S821 checks a signal provided by the CPU 831 to the flash memory 835, to see whether or not a high voltage is required. If the high voltage is required, step S822 sends an activation signal to the DC-DC converter 836. The DC-DC converter 836 needs a certain period after the activation thereof until it provides the required voltage. Accordingly, there is a wait time until the voltage test circuit 850 confirms in step S823 that the voltage of the internal power source line is greater than the predetermined value.

When the voltage becomes greater than the predetermined value, step S824 carries out a write or erase operation. This operation continues for a while. After the write or erase operation is complete, step S825 checks to see if data has been correctly written or erased. If the result is YES, step S826 sends a stop signal to the DC-DC converter 836. At the same time, the internal power source is connected. The DC-DC converter 836 then stops supplying the high voltage. Step S827 confirms that the connected internal power source is restored to a normal voltage, and the process ends.

In FIG. 68, the voltage test circuit 850 of FIG. 67 is used to test the voltage provided by the DC-DC converter 836. It is also possible to measure, in advance, a time after the activation of the DC-DC converter 836 until the predetermined voltage is provided, and an operation that requires the high voltage is started after the measured time.

Figure 70:
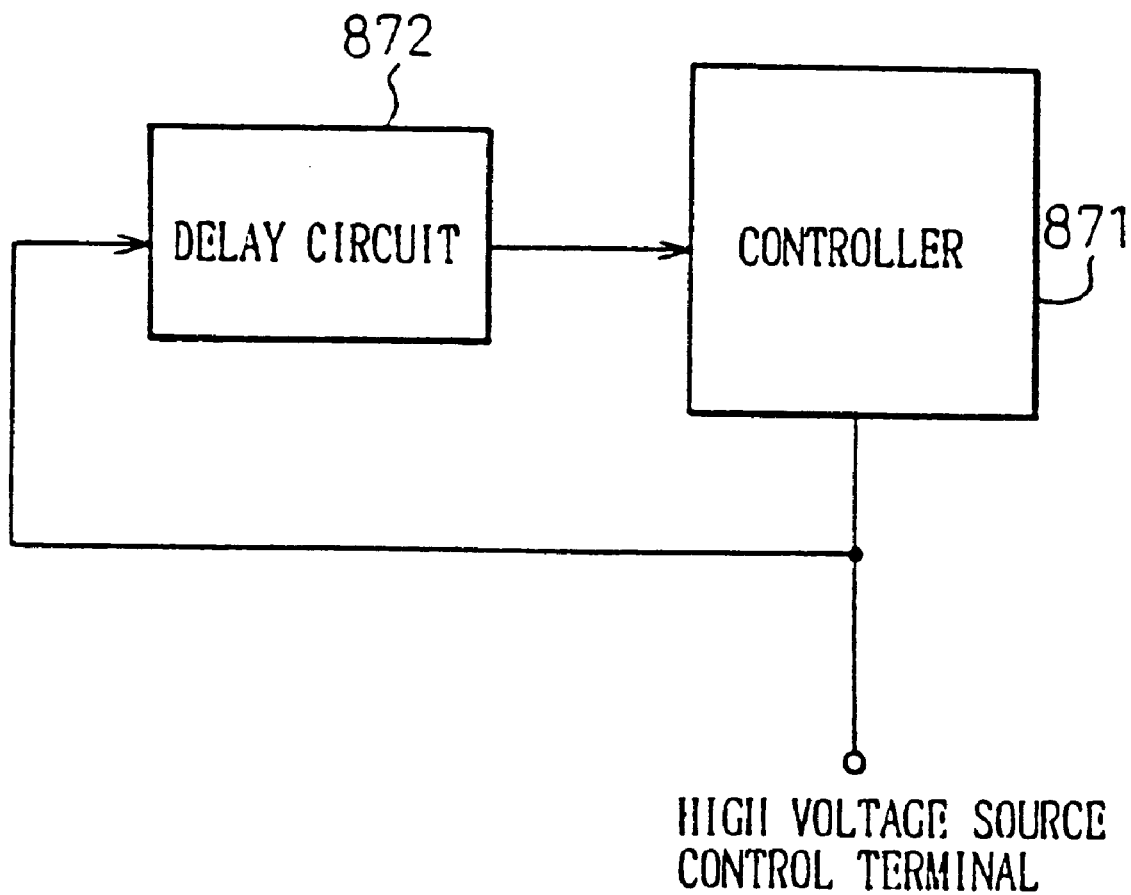
FIG. 70 is a circuit block diagram for explaining the start of a next operation a predetermined time after the transmission of a control signal.

FIG. 70 shows an example of such a technique. Upon detecting an operation that requires the high voltage, a controller 871 provides the high voltage control terminal with a signal to activate the DC-DC converter 836, and temporarily stops working. The activation signal is also provided to a delay circuit 872, which provides the controller 871 with a delayed signal after a predetermined time. In response to the signal, the controller 871 restarts.

The control operation of FIG. 68 may be realized by a microcomputer. It is not practical, however, to install the microcomputer in the flash memory 835. The embodiment mentioned above, therefore, employs the delay circuit and logic circuits to achieve the control operation.

Although the DC-DC converter 836 is disposed outside the flash memory 835 in the embodiment, it may be incorporated in the flash memory with the same control mechanism explained above. The DC-DC converter 836 will be explained next.

Figure 71:
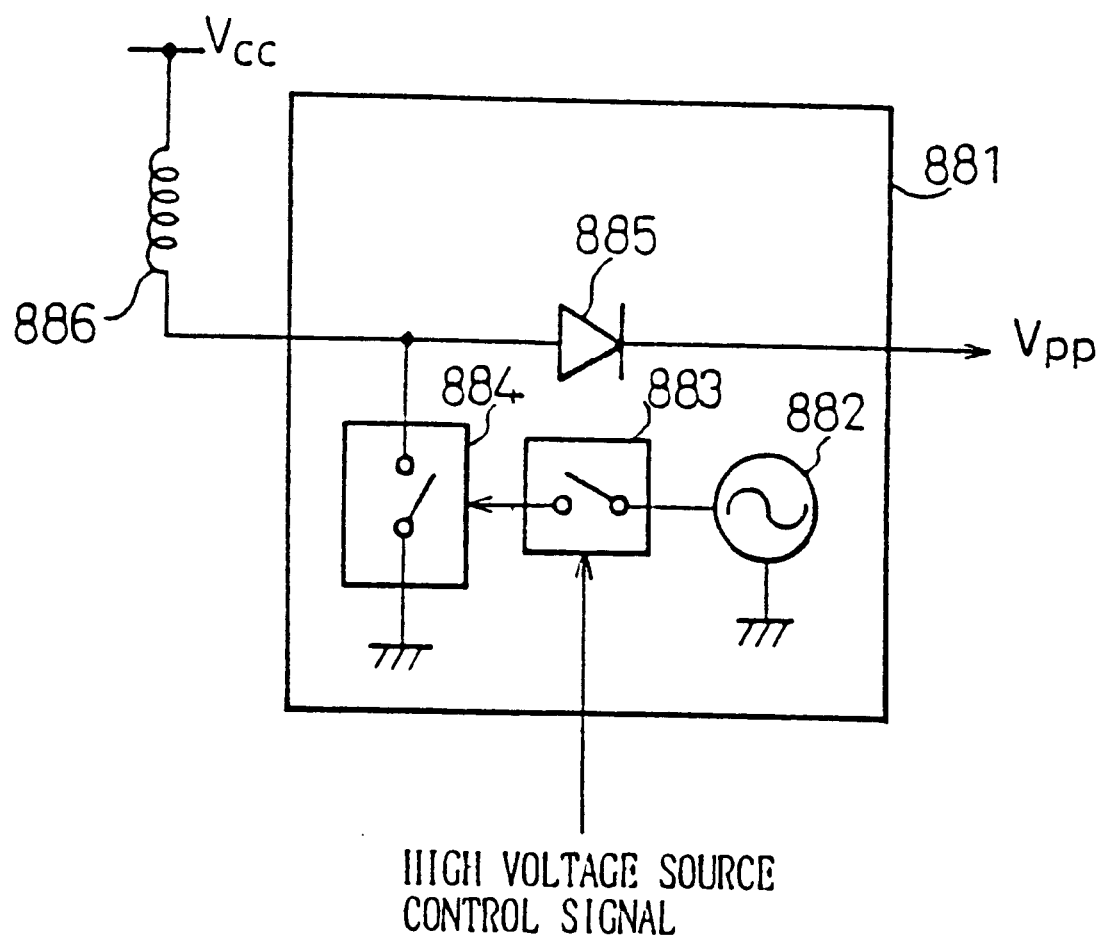
FIG. 71 is a diagram schematically showing an example of a DC-DC converter.
Figure 72:
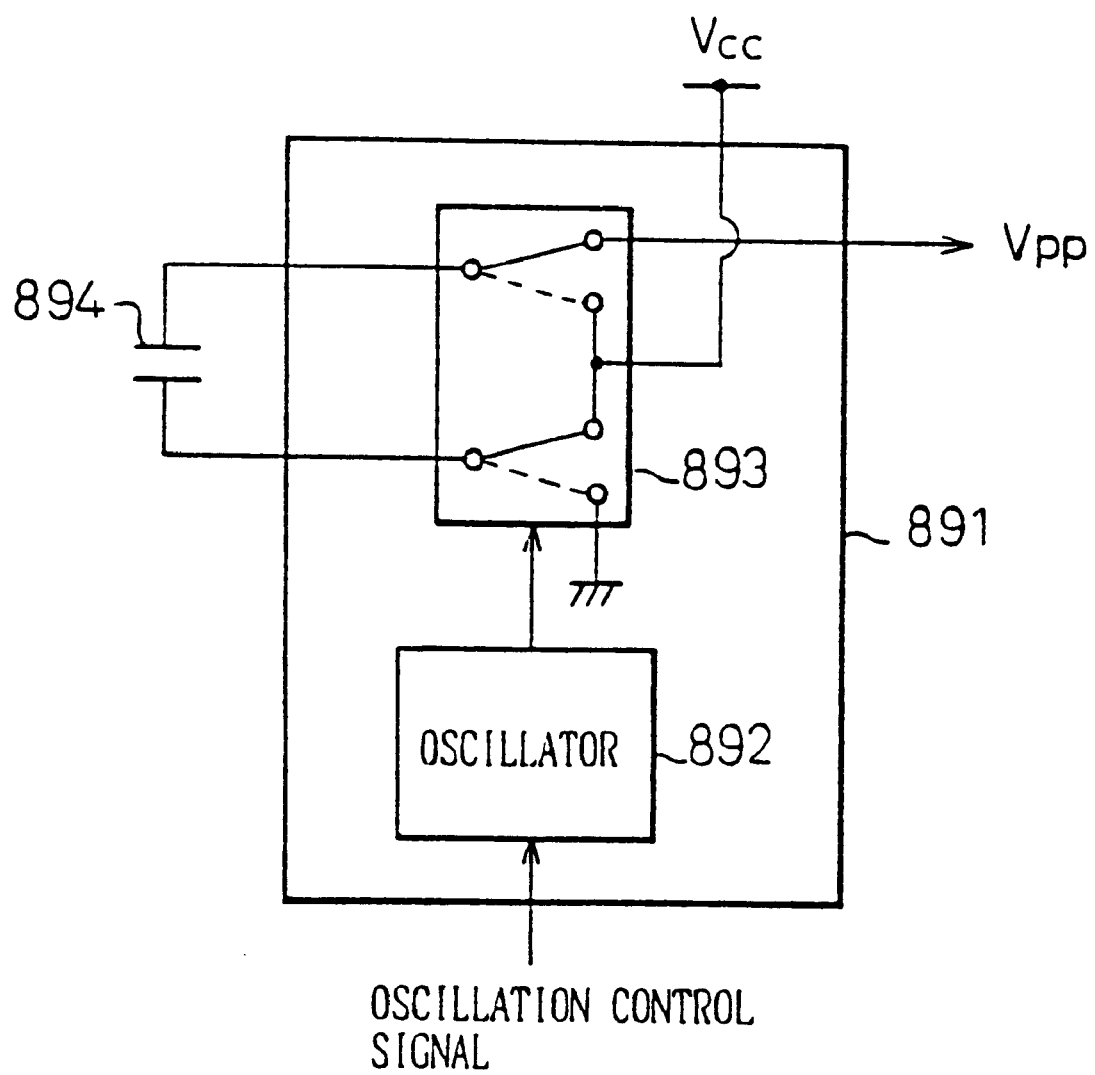
FIG. 72 is a diagram schematically showing another example of a DC-DC converter.

FIGS. 71 and 72 show examples of DC-DC converters. The DC-DC converter 881 of FIG. 71 employs an inductance element 886 and includes an oscillator 882 and a switch 883 for controlling a step-up operation. A switch 884 is turned ON and OFF in response to a signal from the oscillator 882. The inductance element 886 is a coil connected between a diode 885 and the normal power source Vcc. When the switch 884 is turned ON and OFF, the amplitude of a voltage at an input end of the diode 885 increases according to the principle of a transformer. An output end of the diode 885 provides only high voltage components, thereby providing a high voltage output. Switching the switch 883 controls the turning ON and OFF of the switch 884, to control an increase in voltage. Components except the coil 886 are relatively compact, so that they may be incorporated in the flash memory 835. The coil 886 is difficult to reduce in size without deteriorating performance. When incorporating the DC-DC converter 836 in the flash memory 835, it is preferable, therefore, to arrange the coil 886 outside the flash memory 835.

The DC-DC converter 891 of FIG. 72 employs a capacitor 894 as a passive component. An increase in voltage is controlled by controlling an oscillator 892. It is also difficult to install the capacitor 894 in the flash memory 835. When incorporating the DC-DC converter 891 in the flash memory 835, the capacitor 894 may be arranged outside the flash memory 835.

Figure 73:
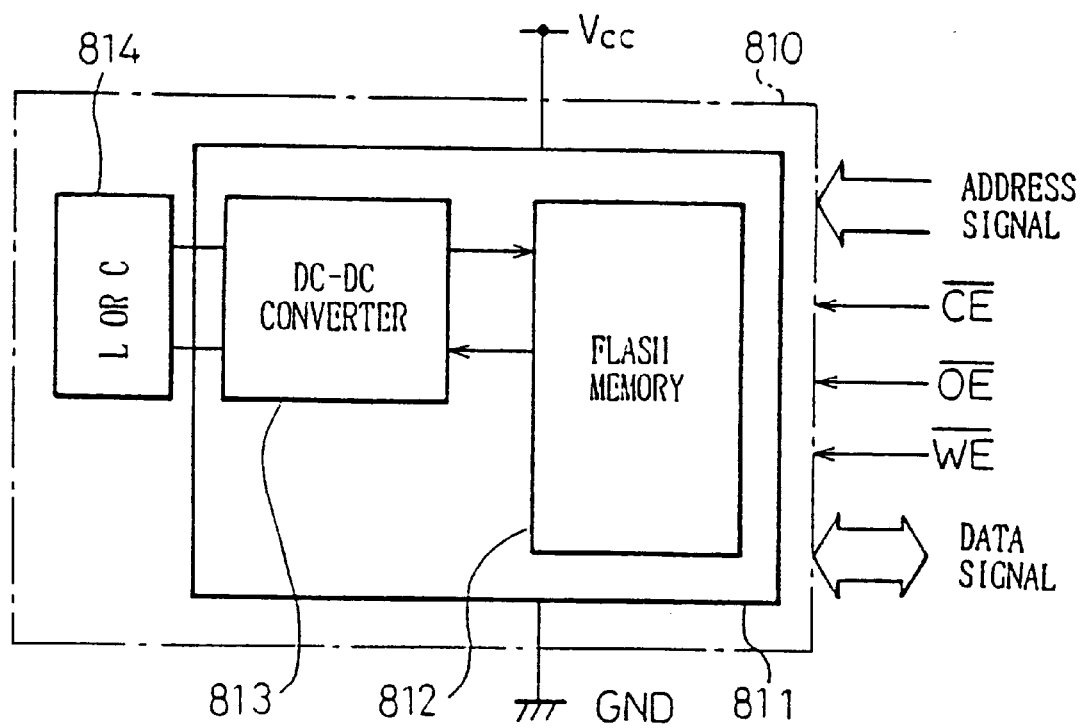
FIG. 73 is a block diagram showing a semiconductor memory device having DC-DC converter according to the eighth aspect of the present invention.

FIG. 73 shows a package in which a flash memory 812 and a DC-DC converter 813 are mounted on an element to which a passive component 814 such as an inductance element or a capacitance element is attached.

A semiconductor memory device according to the ninth aspect of the present invention will be explained next with reference to FIGS. 74 to 91.

Generally, semiconductor memory devices (for example, EEPROMs, flash memories) must be tested in a production line, and this testing is particularly important for new products to analyze and guarantee them. To easily carry out the test, the semiconductor memory devices usually incorporate test functions such as full selection and nonselection functions of word or bit lines. These functions are provided for a decoder circuit in the semiconductor memory devices, and are used when the test is carried out in the production line.

Figure 74:
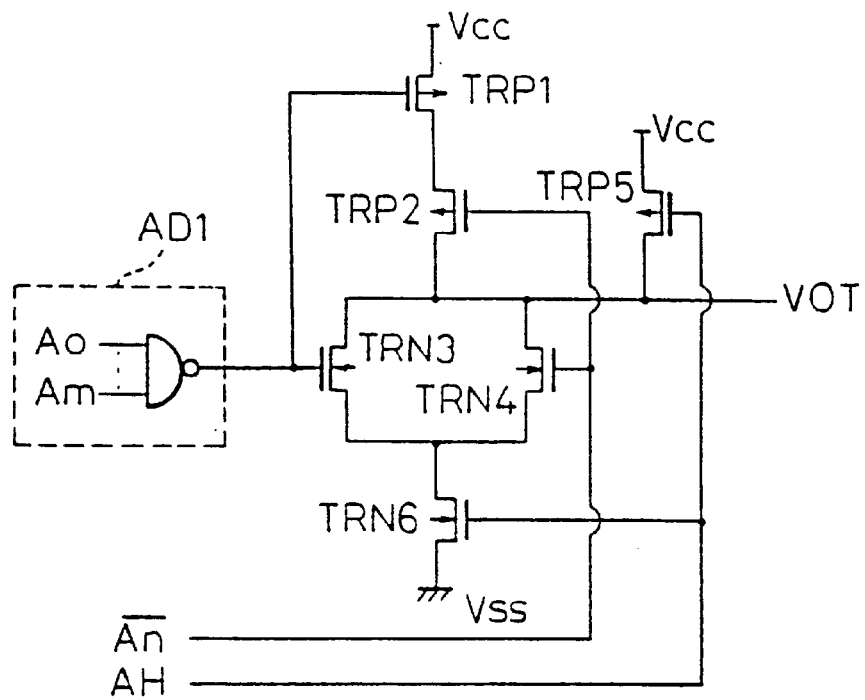
FIG. 74 is a circuit diagram showing a conventional decoder circuit used in a semiconductor memory device related to the ninth aspect of the present invention.

FIGS. 74 to 77 each show an example of a decoder arranged in a conventional decoder circuit of a semiconductor memory device. In FIG. 74, the decoder has a NOR output circuit composed of CMOS transistors. The decoder includes p-channel type MOS transistors TRP1, TRP2, and TRP3, and n-channel type MOS transistors TRN3, TRN4, and TRN6. A source of the transistor TRP1 is connected to a high voltage supply source Vcc, and a source of the transistor TRN6 is connected to a low voltage supply source Vss.

As shown in FIG. 74, a gate of the transistor TRP1 is connected to a gate of the transistor TRN3, and an output of an address buffer AD1 is supplied to these gates of the transistors TRP1 and TRN3. A source of the transistor TRP5 is connected to the high voltage supply source Vcc, and a drain of thereof is connected to an output end VOT of the decoder. A full selection control signal AH is supplied to gates of the transistors TRP5 and TRN6, and a nonselection signal /An is supplied to gates of the transistors TRP2 and TRN4. Note, a mark "/" denotes an inverted signal, and thus the signal /An denotes an inverted signal of the signal An. Further, the signal /An may be a specific terminal for receiving a specific high signal (extremely high voltage signal), or the signal /An may be a terminal for receiving a specific address signal.

This decoder of FIG. 74 usually achieves a decoder function only with the NOR circuit, and to achieve a test function, the decoder needs the transistors TRP5 and TRN6 as control transistors in addition to the basic decoder circuit. These transistors are set to high or low potential in response to a control signal, to carry out a full selection operation or a nonselection operation.

Note, in FIG. 74, the full selection control signal AH controls the gates of the transistors TRP5 and TRN6, to carry out the full selection or nonselection operation. To carry out the full selection operation, the full selection control signal AH is set to low level L to turn ON the transistor TRP5, thereby maintaining a high potential on a word or bit line. On the other hand, to carry out the nonselection operation, the full selection and nonselection control signals AH and /An are each set to high level H to turn ON the transistors TRN4 and TRN6, thereby dropping the potential of the word or bit line.

This conventional arrangement increases the size and cost of the decoder circuit. When semiconductor memory devices are more integrated, decoder layout pitches must be narrower making it difficult to achieve the test function.

Figure 75:
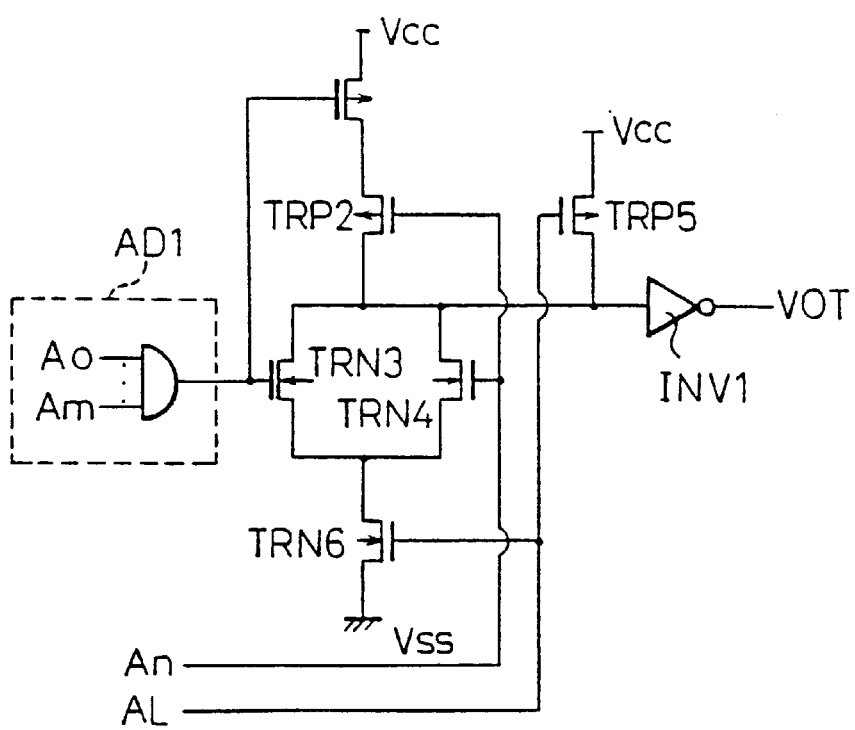
FIG. 75 is a circuit diagram showing another conventional decoder circuit used in a semiconductor memory device related to the ninth aspect of the present invention.

The decoder of FIG. 75 resembles that of FIG. 74. In FIG. 74, a decoding section is a NOR circuit composed of CMOS transistors. FIG. 75 differs from FIG. 74 in that FIG. 75 employs a full selection signal An instead of the total nonselection signal /An, and an inverter INV1 is connected to the output end of the decoder. Namely, the logic of FIG. 75 is opposite to that of FIG. 74.

Figure 76:
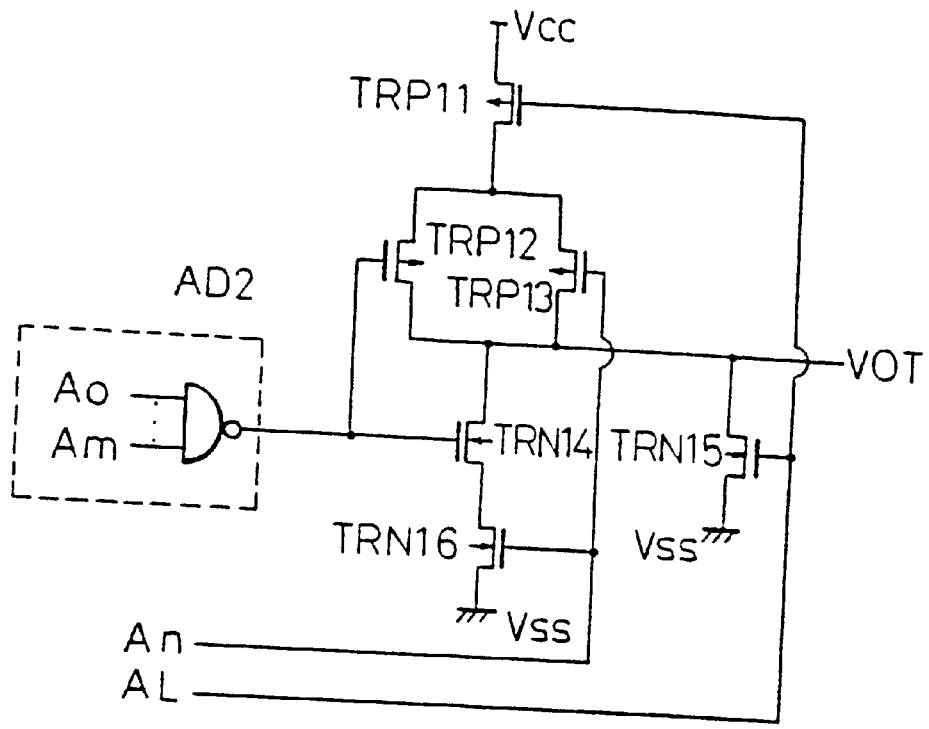
FIG. 76 is a circuit diagram showing still another conventional decoder circuit used in a semiconductor memory device related to the ninth aspect of the present invention.

The decoder of FIG. 76 differs from the decoder of FIG. 74 in that it has an output section composed of a NAND circuit of CMOS transistors. The decoder of FIG. 76 includes p-channel type MOS transistors TRP11, TRP12, and TRP13, and n-channel type MOS transistors TRN14, TRN15, and TRN16. A source of the transistor TRP11 is connected to a high voltage supply source Vcc, and a source of the transistor TRN16 is connected to a low voltage supply source Vss. A source of the transistor TRN15 is connected to the low voltage supply source Vss, and a drain thereof is connected to an output end of the decoder. A gate of the transistor TRP12 is connected to a gate of the transistor TRN14, and a gate of the transistor TRN14 is connected to an output of an address buffer AD2. A separate nonselection control signal AL is supplied to gates of the transistors TRP11 and TRN15, and a full selection signal An is supplied to gates of the transistors TRP13 and TRN16.

When the nonselection control signal AL is set to high level H, the transistor TRN15 is turned ON to drop the output of the decoder, thereby putting a word or bit line in an unselected state. When the nonselection and full selection control signals AL and An are each set to low level L, the transistors TRP11 and TRP13 are turned ON. As a result, the decoder provides the high voltage Vcc to carry out full selection.

Figure 77:
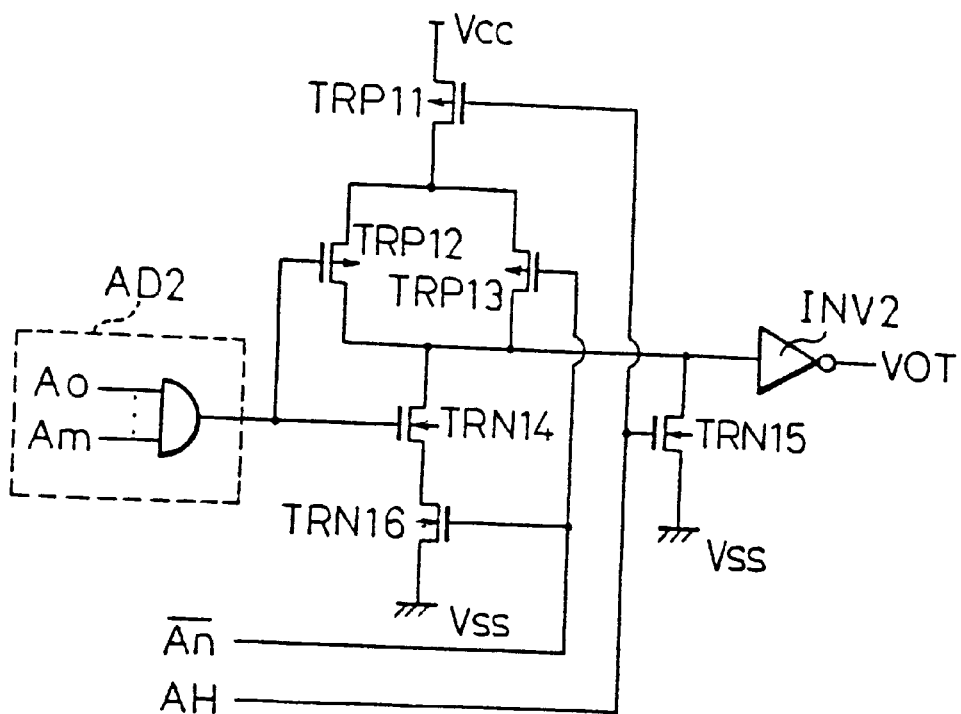
FIG. 77 is a circuit diagram showing still another conventional decoder circuit used in a semiconductor memory device related to the ninth aspect of the present invention.

The decoder of FIG. 77 resembles that of FIG. 76. A decoding section of FIG. 77 is a NAND circuit of CMOS transistors. FIG. 77 differs from FIG. 76 in that it employs a nonselection signal /An instead of the full selection signal An, and an inverter INV2 is connected to an output end of the decoder. Namely, the logic of FIG. 77 is opposite to that of FIG. 76. All of these conventional decoders has the problems mentioned before.

An object of the ninth aspect of the semiconductor memory device of the present invention is to provide an inexpensive decoder circuit that solves the problems of the prior art. The decoder circuit of the present invention is simple and compact to achieve the full selection and non-selection of word or bit lines in a test mode. This decoder circuit is suitable for high integration.

FIGS. 78 to 81B show embodiments of a decoder circuit of a semiconductor memory device according to the ninth aspect of the present invention.

Figure 78:
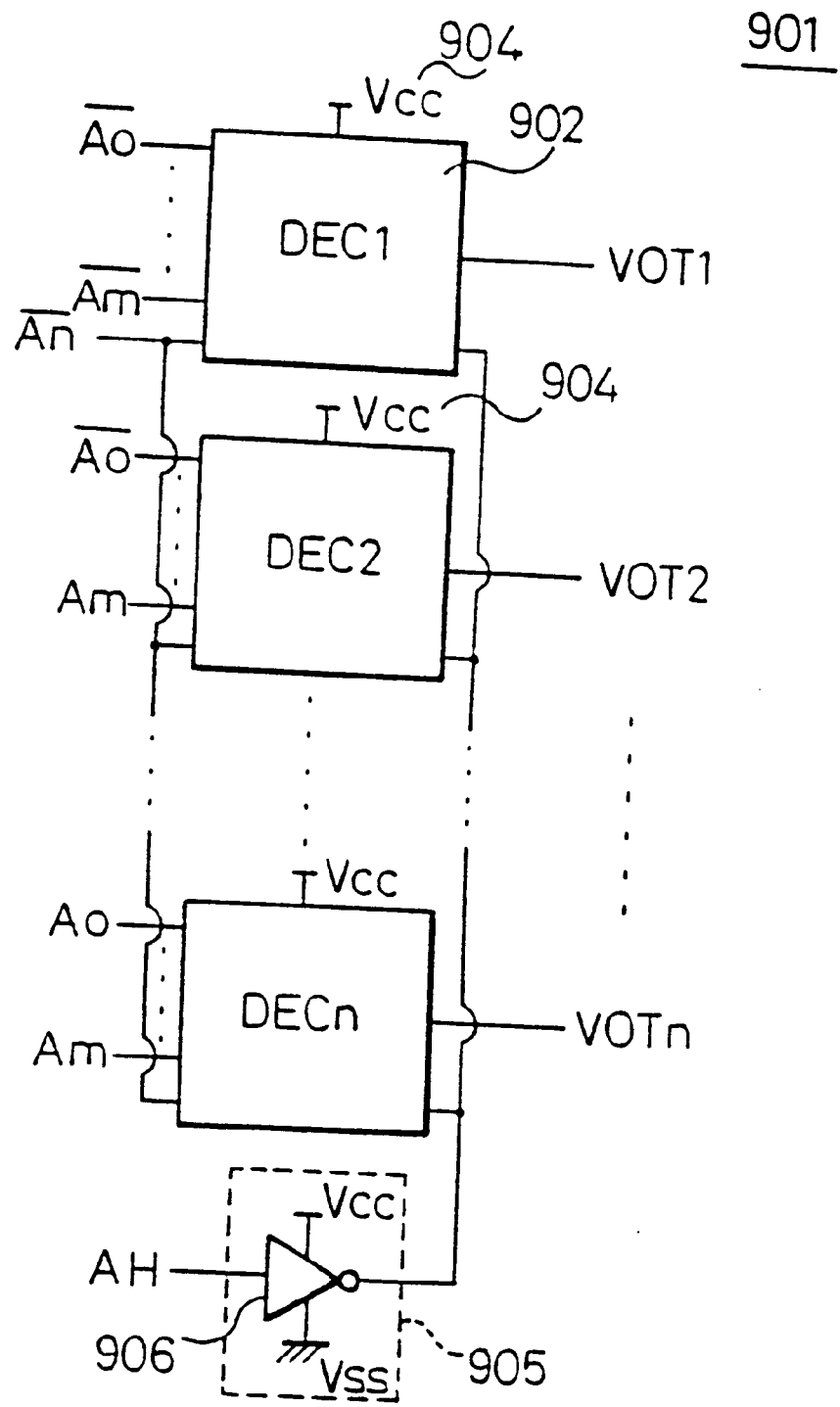
FIG. 78 is a circuit block diagram showing an embodiment of a decoder circuit used in a semiconductor memory device according to the ninth aspect of the present invention.

As shown in FIG. 78, an output row or a decoding row of the decoder circuit 901 is connected to a first power source 904 for supplying a high voltage Vcc and to a second power source 905 for supplying a low voltage (ground voltage) Vss or the high voltage Vcc in response to a control signal AH. The output row of the decoder circuit 901 is composed of decoders DEC1 to DECn. Namely, each of the decoders DEC1 to DECn is connected to the first power source 904 for supplying the high voltage Vcc, and each of the decoders DEC1 to DECn receives address signals A0 to Am and /A0 to /Am. The decoders DEC1 to DECn (902) have output ends VOT1 to VOTn, respectively.

In response to the control signal AH, the second power source 905 supplies the low voltage Vss or the high voltage Vcc. The second power source 905 is shared by the decoders DEC1 to DECn. Namely, an output end of the second power source 905 is connected to input ends of the decoders DEC1 to DECn. A nonselection signal /An is supplied to an input end of each of the decoders DEC1 to DECn.

Note, in the ninth aspect of the present invention, the second power source 905 may have any circuit arrangement if it can provide the function mentioned above. For example, the second power source 905 may have an inverter 906 as shown in FIG. 78. In response to the level of the control signal AH, the inverter 906 provides the high voltage Vcc or the low voltage Vss.

The operation of the decoder circuit of FIG. 78 will be explained next. To carry out a nonselection operation, the nonselection signal /An and control signal AH are each set to high level H. The inverter 906 provides the voltage Vss of low level L, and the decoders DEC1 to DECn connected to the inverter 906 operate like conventional decoders. The output ends VOT1 to VOTn of the decoders DEC1 to DECn are each at low level L to establish a nonselection state. On the other hand, to carry out a full selection operation, the nonselection signal /An is set to high level H, and the control signal AH to low level L. The inverter 906 provides the voltage Vcc of high level H, and the decoders DEC1 to DECn connected to the inverter 906 receive the voltage Vcc, and the output ends VOT1 to VOTn of the decoders DEC1 to DECn each provide the voltage Vcc of high level H to establish a full selection state.

In this way, the single second power source 905 is shared by the decoders DEC1 to DECn, and therefore, no additional circuits nor transistors are required for the decoder circuit. This results in suppressing the size of the decoder circuit and easily carrying out the full selection or nonselection operation of word or bit lines in a test mode.

Figure 79:
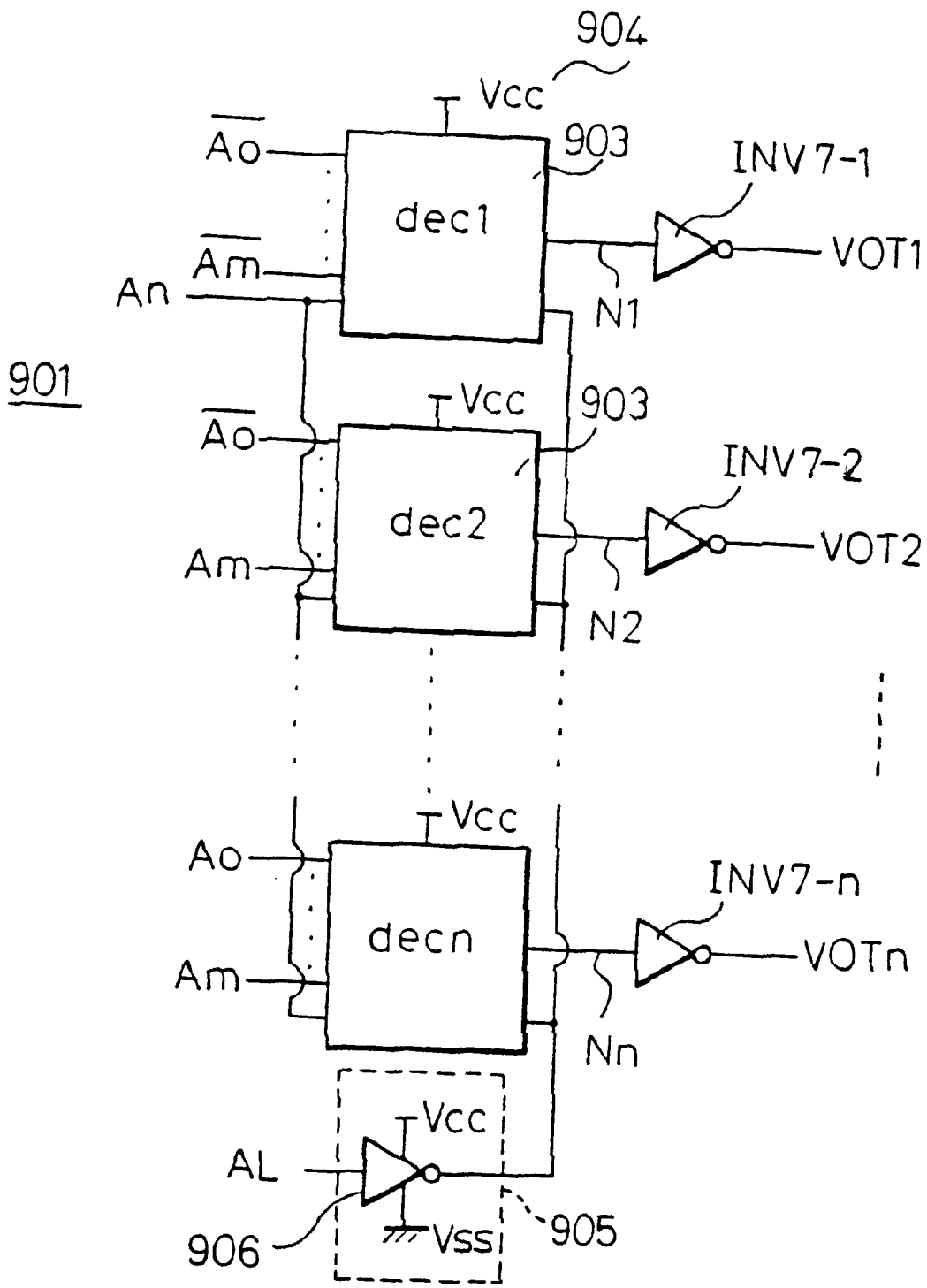
FIG. 79 is a circuit block diagram showing another embodiment of a decoder circuit used in a semiconductor memory device according to the ninth aspect of the present invention.

The decoder circuit of FIG. 79 is basically the same as that of FIG. 78 and is characterized by a decoding row 903 (dec1 to decn). Each of the decoders is connected to a first power source 904 for supplying a high voltage Vcc, and receives decoder selection signals A0 to Am and /A0 to /Am. Output ends N1 to Nn of the decoders dec1 to decn are connected to output terminals VOT1 to VOTn through inverters INV7-1 to INV7-n, respectively.

The decoders dec1 to decn share a second power source 905, which supplies a low (ground) voltage Vss or the high voltage Vcc in response to a control signal AL. Namely, an output end of the second power source 905 is connected to an input of each of the decoders dec1 to decn. A total selection signal An is supplied to an input of each of the decoders dec1 to decn. The second power source 905 has an inverter 906. In response to the level of the control signal AL, the inverter 906 provides the high voltage Vcc or the low voltage Vss.

The operation of FIG. 79 will be explained next. To carry out a full selection operation, the full selection signal An is set to high level H, and the control signal AL to high level H. The inverter 906 provides the voltage Vss of low level L, and the decoders dec1 to decn connected to the inverter 906 operate like the conventional decoders. The output ends N1 to Nn of the decoders dec1 to decn each provide the voltage Vss of low level L. The low level signals are inverted by the inverters INV7-1 to INV7-n, so that the output ends VOT1 to VOTn each provide high level H, to establish a full selection state. On the other hand, to achieve a nonselection operation, the full selection signal An is set to high level H, and the control signal AL is set to low level L. The inverter 906 provides the voltage Vcc of high level H. Accordingly, the decoders dec1 to decn connected to the inverter 6 receive the voltage Vcc, and the output ends N1 to Nn of the decoders dec1 to decn each provide the voltage Vcc of high level H. These high level outputs are inverted by the inverters INV7-1 to INV7-n, so that the output ends VOT1 to VOTn each become low level L to establish a nonselection state.

Figure 80A:
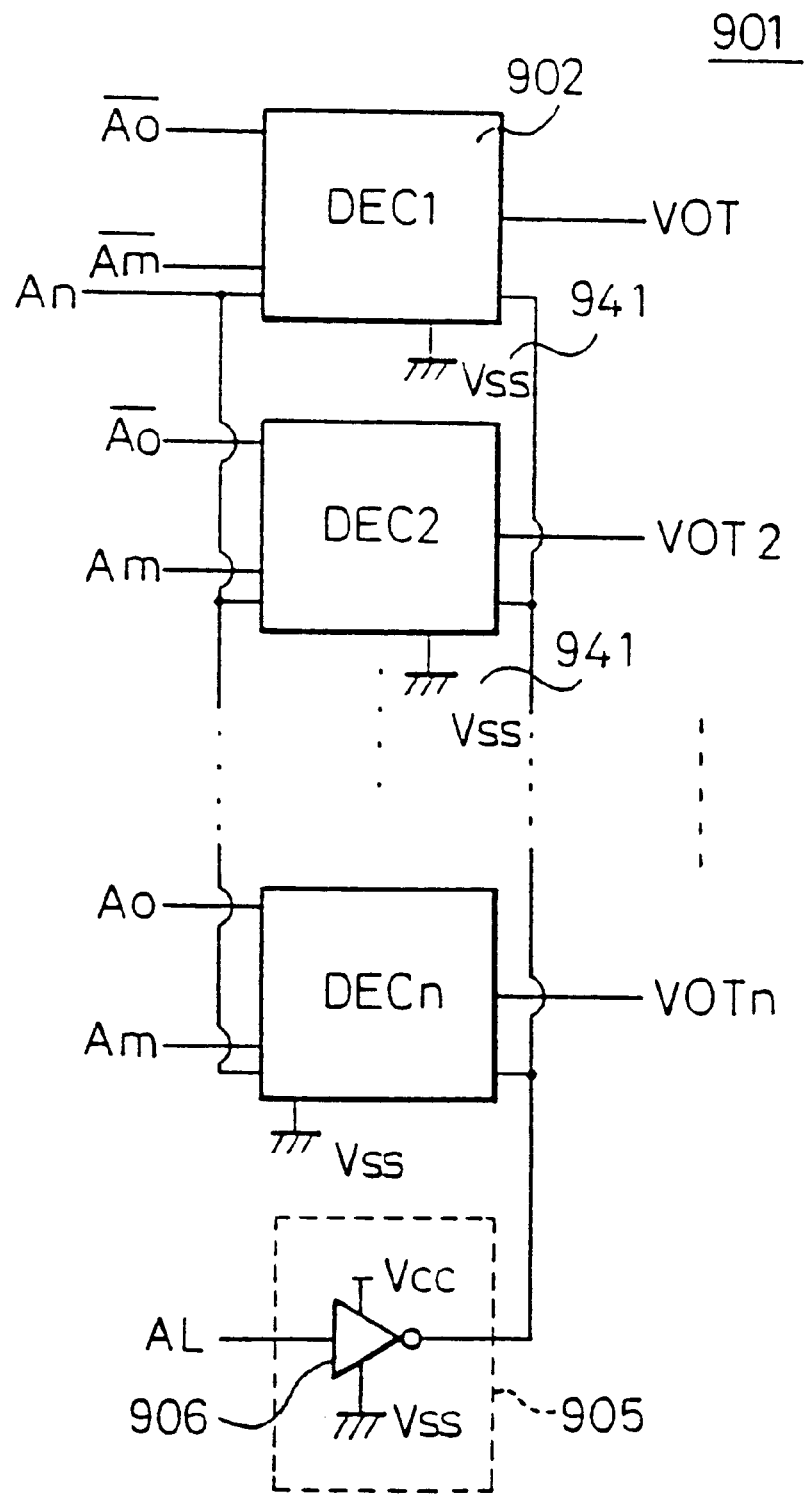
FIG. 80A is a circuit block diagram showing still another embodiment of a decoder circuit used in a semiconductor memory device according to the ninth aspect of the present invention.

The decoder circuit of FIG. 80A is basically the same as that of FIG. 78 but inverts the polarities of signals.

The decoder circuit 901 of FIG. 80A has an output row of decoders DEC1 to DECn. Each of the decoders DEC1 to DECn is connected to a first power source 904 for supplying a low voltage Vss, and receives address signals A0 to Am and /A0 to /Am. The decoders have output ends VOT1 to VOTn, respectively. In response to a control signal AL, the second power source 905 supplies the low voltage Vss or the high voltage Vcc. The second power source 905 is shared by the decoders DEC1 to DECn. Namely, an output end of the second power source 905 is connected to an input end of each of the decoders DEC1 to DECn. A full selection signal An is supplied to each of the decoders DEC1 to DECn. The second power source 905 has an inverter 906, and the inverter 906 provides the high voltage Vcc or the low voltage Vss in response to the level of the control signal AL.

The operation of the embodiment of FIG. 80A will be explained next. To carry out a full selection operation, the full selection signal An and control signal AL are each set to low level L. The inverter 906 provides the voltage Vcc of high level H, and the decoders DEC1 to DECn connected to the inverter 906 operate like conventional decoders. The output ends VOT1 to VOTn of the decoders DEC1 to DECn each become high level H to establish a full selection state. On the other hand, to carry out a nonselection operation, the full selection signal An is set to low level L, and the control signal AL is set to high level H. The inverter 906 provides the voltage Vss of low level L. Accordingly, the decoders DEC1 to DECn connected to the inverter 906 receive the voltage Vss, and the output ends VOT1 to VOTn each become low level L to establish a nonselection state.

Figure 80B:
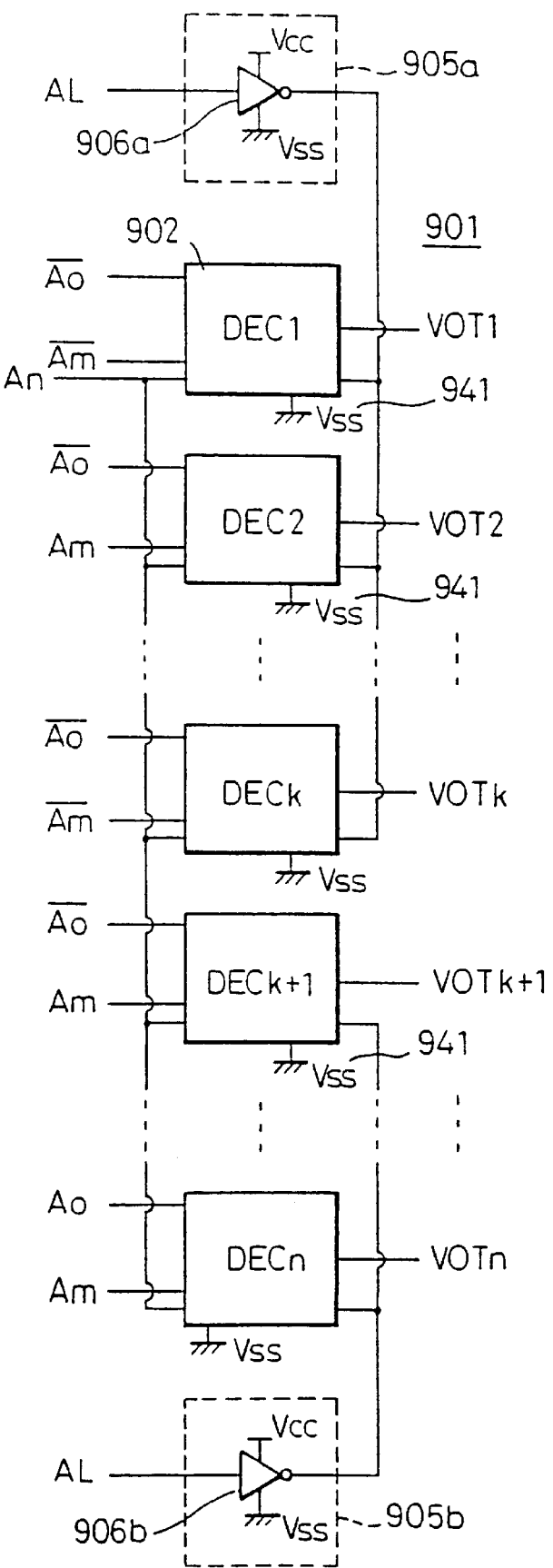
FIG. 80B is a modification of the decoder circuit shown in FIG. 80A.

FIG. 80B shows a modification of the decoder circuit shown in FIG.80A.

As shown in FIG. 80B, in this modification, two second power sources 905a and 905b are provided for the decoder circuit 901 having an output row of decoders DEC1 to DECn. Namely, the power source 905a is provided for the decoders DEC1 to DECk, and the power source 905b is provided for the decoders DECk+1 to DECn. For example, the total number of the decoders DEC1 to DECn is specified as 1026 or 512, and each of the power sources 905a and 905b is provided for 512 or 256 decoders DEC1 to DECk and DECk+1 to DECn, respectively. Note, the control signal AL applied to inverters 906a and 906b of the power sources 905a and 905b is the same signal. Further, the number of the power sources is not limited to two, but can be specified as four or more. In this case, the decoders DEC1 to DECn are divided into four or more plural groups, and each of the power sources is provided for each of the divided groups, respectively. In this modification shown in FIG. 80B, transistors constituting the inverters 906a and 906b can be formed in a smaller size than that of the inverter 906 shown in FIG. 80A.

Figure 81A:
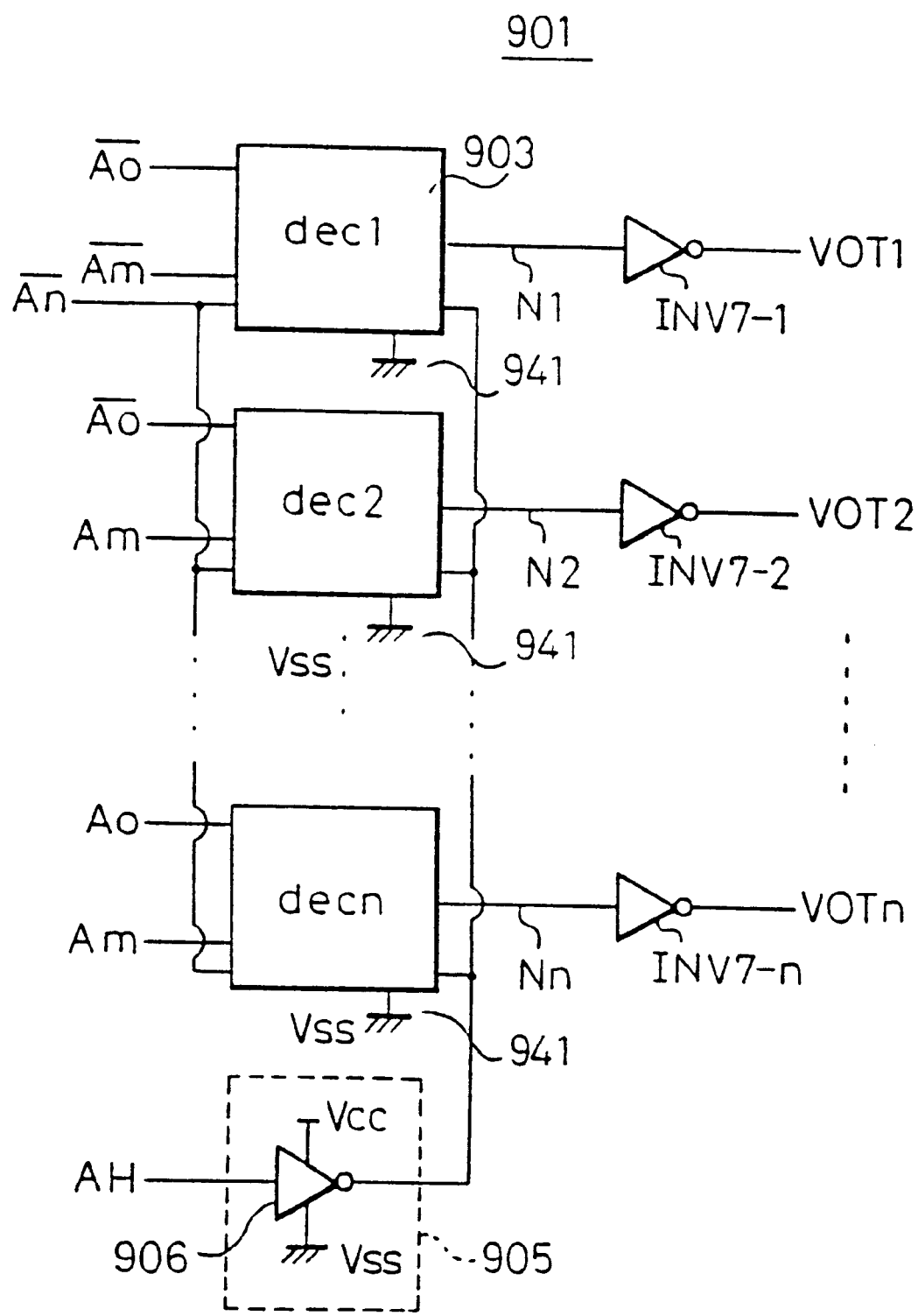
FIG. 81A is a circuit block diagram showing still another embodiment of a decoder circuit used in a semiconductor memory device according to the ninth aspect of the present invention.

The decoder circuit of FIG. 81A is basically the same as that of FIG. 80A and is characterized by a decoding row 903.

The decoding row 903 includes decoders dec1 to decn. Each of these decoders is connected to a first power source 904 for supplying a low voltage Vss, and receive decoder selection signals A0 to Am and /A0 to /Am. Output ends N1 to Nn of the decoders dec1 to decn are connected to output terminals VOT1 to VOTn through inverters INV7-1 to INV7-n, respectively.

The decoders dec1 to decn share a second power source 905, which supplies the low voltage Vss or a high voltage Vcc in response to a control signal AH. Namely, an output end of the second power source 905 is connected to an input end of each of the decoders dec1 to decn. A nonselection signal /An is supplied to each of the decoders dec1 to decn. The second power source 905 has an inverter 906. In response to the control signal AH, the inverter 906 provides the high voltage Vcc or the low voltage Vss.

The operation of the embodiment of FIG. 81A will be explained. To establish a nonselection state, the nonselection signal /An and control signal AH are each set to low level L.

The inverter 906 provides the voltage Vcc of high level H, and the decoders dec1 to decn connected to the inverter 906 operate like conventional decoders. The output ends N1 to Nn of the decoders each provide the voltage Vcc of high level H. These high-level outputs are inverted by the inverters INV7-1 to INV7-n, and the output terminals VOT1 to VOTn each provide low level L to establish the nonselection state. On the other hand, to establish a full selection state, the nonselection signal /An is set to low level L and the control signal AH to high level H. The inverter 906 provides the voltage Vss of low level L. Accordingly, the decoders dec1 to decn connected to the inverter 906 each receive the voltage Vss, and the output ends N1 to Nn of the decoders each provide the voltage Vss of low level L. These low-level outputs are inverted by the inverters INV7-1 to INV7-n, and the output terminals VOT1 to VOTn each provide high level H to establish the full selection state.

In this way, the decoders DEC1 to DECn share the single second power source 905. Namely, the decoder circuit according to the present invention requires no additional circuits or transistors. This results in realization of a compact decoder circuit that easily carries out a full selection or nonselection operation of word or bit lines.

Figure 81B:
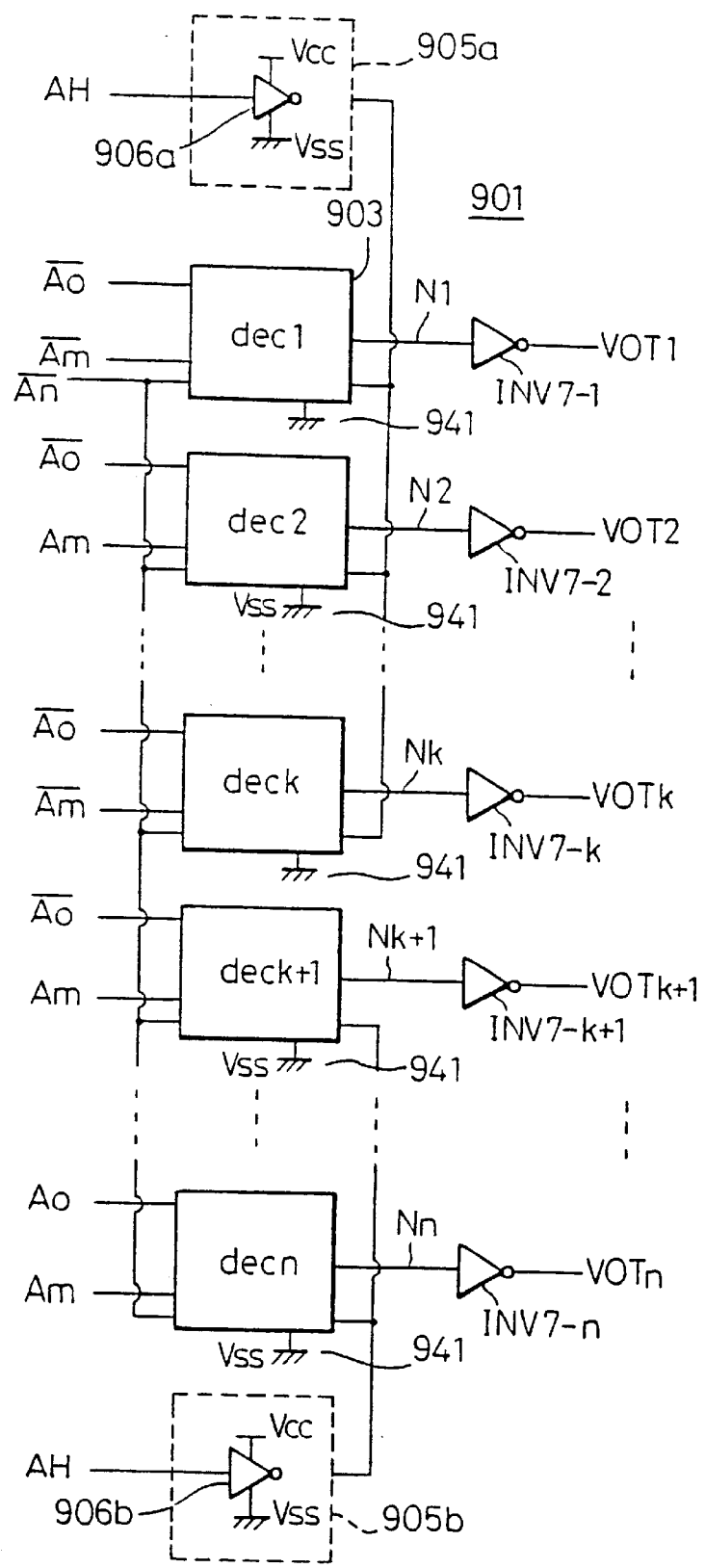
FIG. 81B is a modification of the decoder circuit shown in FIG. 81A.

FIG. 81B shows a modification of the decoder circuit shown in FIG. 81A.

As shown in FIG. 81B, in this modification, two second power sources 905a and 905b are provided for the decoder circuit 901 having an output row of decoders dec1 to decn. Namely, the power source 905a is provided for the decoders dec1 to deck, and the power source 905b is provided for the decoders deck+1 to decn. For example, the total number of the decoders dec1 to decn is specified as 1026 or 512, and each of the power sources 905a and 905b is provided for 512 or 256 decoders dec1 to deck and deck+1 to decn, respectively. Note, similar to the modification of FIG. 80B, the control signal AH applied to inverters 906a and 906b of the power sources 905a and 905b is the same signal. Further, the number of the power sources is not limited to two, but can be specified as four or more plural. In this case, the decoders DEC1 to DECn are divided into four or more plural groups, and each of the power sources is provided for each of the divided groups, respectively. In this modification shown in FIG. 81B, transistors constituting the inverter 906a and 906b can be formed in a smaller size than that of the inverter 906 shown in FIG. 81A.

Figure 82:
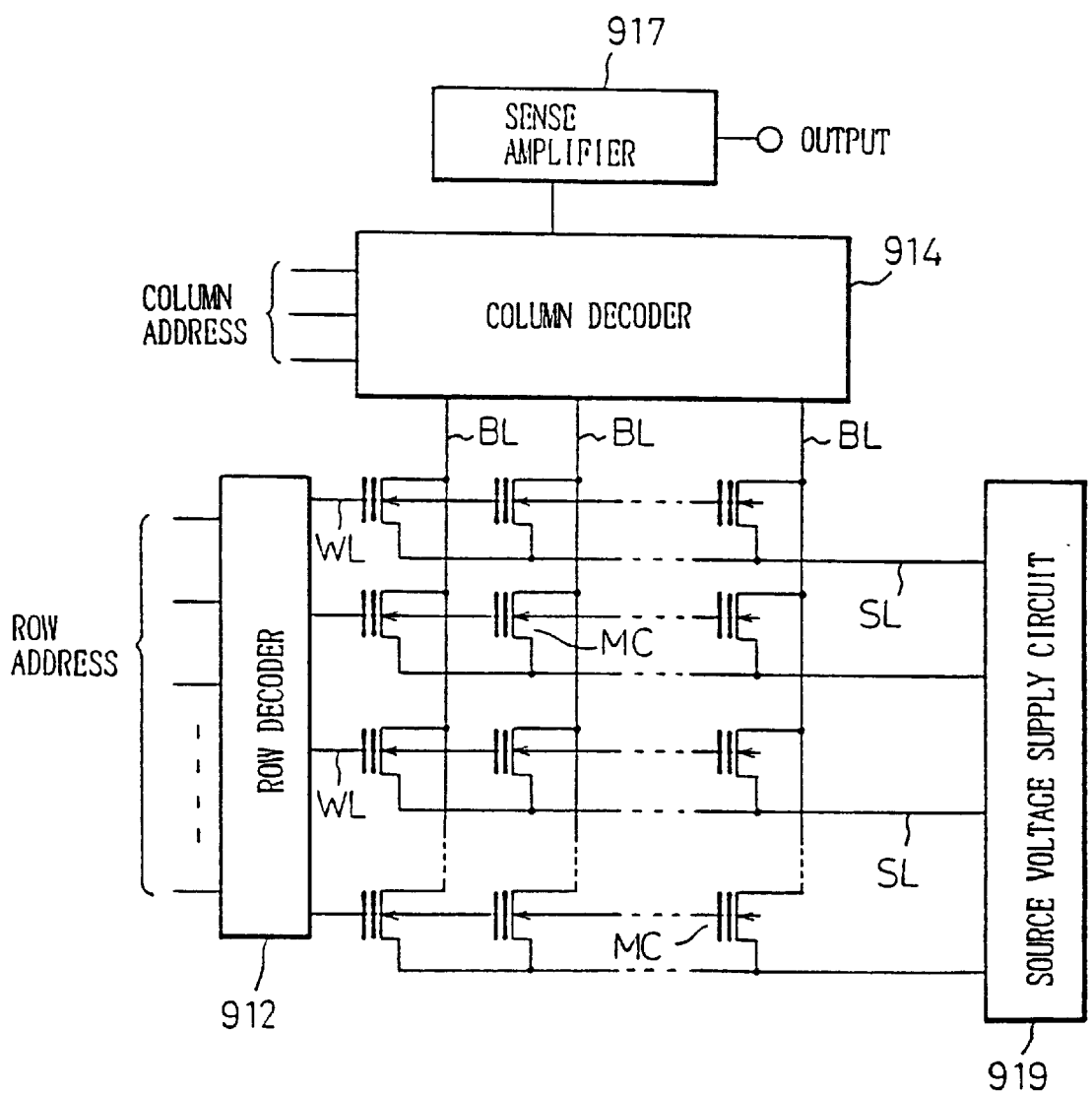
FIG. 82 is a circuit block diagram showing an example of a semiconductor memory device using a decoder circuit according to the ninth aspect of the present invention.

FIG. 82 shows an example of a semiconductor memory device (flash memory) using a decoder circuit according to the ninth aspect of the present invention. In FIG. 82, reference 912 denotes a row decoder, 914 denotes a column decoder, 917 denotes a sense amplifier, and 919 denotes a source voltage supply circuit. Note, in FIG. 82, the row decoder 912 includes a row address buffer, and the column decoder 914 includes a column address buffer.

As shown in FIG. 82, the semiconductor memory device comprises the row decoder 912, the column decoder 914, a sense amplifier 917, and the source voltage supply circuit 919. Further, the semiconductor memory device comprises memory cells (cell transistor) MCs each made of an n-channel type MOS (MIS) transistor, word lines WLs, bit lines BLs, and source lines SLs. The source voltage supply circuit 519 is connected to the sources of the memory cells MCs in a memory cell array through the source lines SLs, to electrically collectively erase the memory cells. The decoder circuit according to the ninth aspect of the present invention is applied to the row decoder 912 or column decoder 914. Note, the decoder circuit of the ninth aspect of the present invention not only has a normal decoding function, but also has a test function to carry out a full selection or nonselection operation of word or bit lines.

Figure 83B:
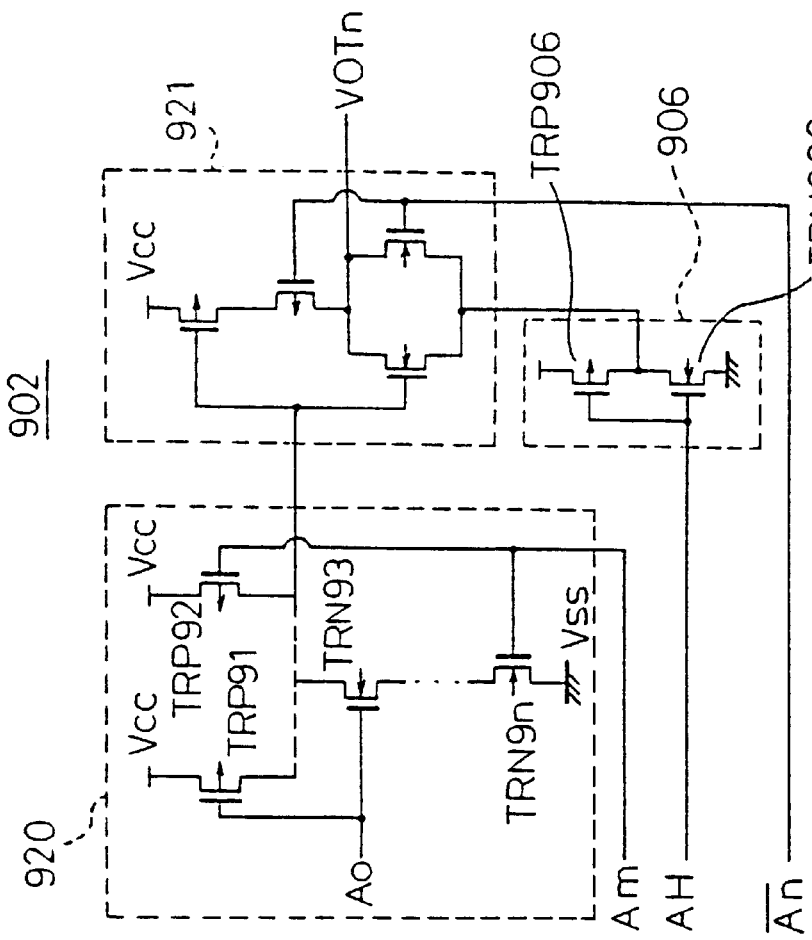
FIGS. 83A and 83B are circuit diagrams showing the details of the decoder circuit of FIG. 78.
Figure 83A:
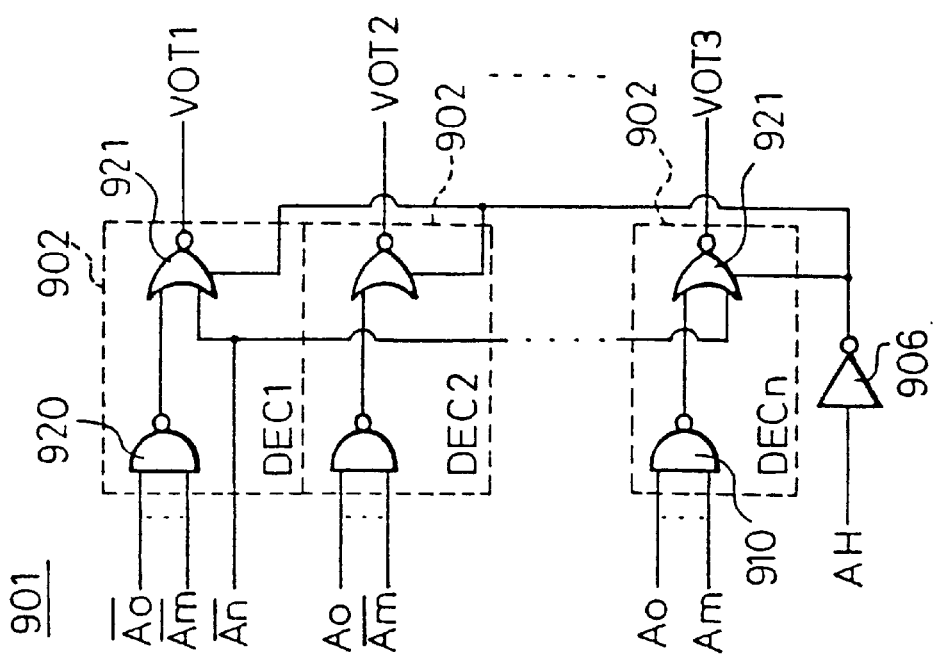

FIGS. 83A and 83B show the details of the decoder circuit of FIG. 78, and FIG. 83B shows transistors forming the decoder circuit.

In FIG. 83A, the decoder circuit 901 has the output row 902 involving the decoders DEC1 to DECn. Each of the decoders DEC1 to DECn has a NAND gate 920 for receiving the address signals A0 to Am and /A0 to /Am, and a NOR gate 921 for receiving an output of the NAND gate 920 and the nonselection signal /An. An output of the NOR gate 921 is connected to a corresponding one of the output terminals VOT1 to VOTn. Other arrangements and operation of FIG. 83A are the same as those of FIG. 78.

FIG. 83B shows transistors forming the elements of FIG. 83A. The NAND gate 920 has p-channel type MOS transistors TRP91 and TRP92, and n-channel type MOS transistors TRN931 to TRN93n. These transistors are disposed between the high voltage supply source Vcc and the low voltage supply source Vss. The NOR gate 921 may be a known NOR gate such as the one shown in FIG. 74. The inverter 906 may be a known CMOS inverter (transistors TRP906 and TRN906).

The operation of the decoder circuit of FIGS. 83A and 83B is the same as that of the decoder circuit of FIG. 78, and therefore, will not be explained again.

FIGS. 84A and 84B show the details of the decoder circuit of FIG. 79, in which FIG. 84B shows transistors forming the decoder circuit.

In FIG. 84A, the decoder circuit 901 has the decoder row 903 involving the decoders dec1 to decn. The decoder circuit also has the inverters INV7-1 to INV7-n that are not provided for the decoder circuit of FIG. 83A. The operation of the decoder circuit of FIGS. 84A and 84B is the same as that of the decoder circuit of FIG. 79, and therefore, will not be explained again.

Figure 85B:
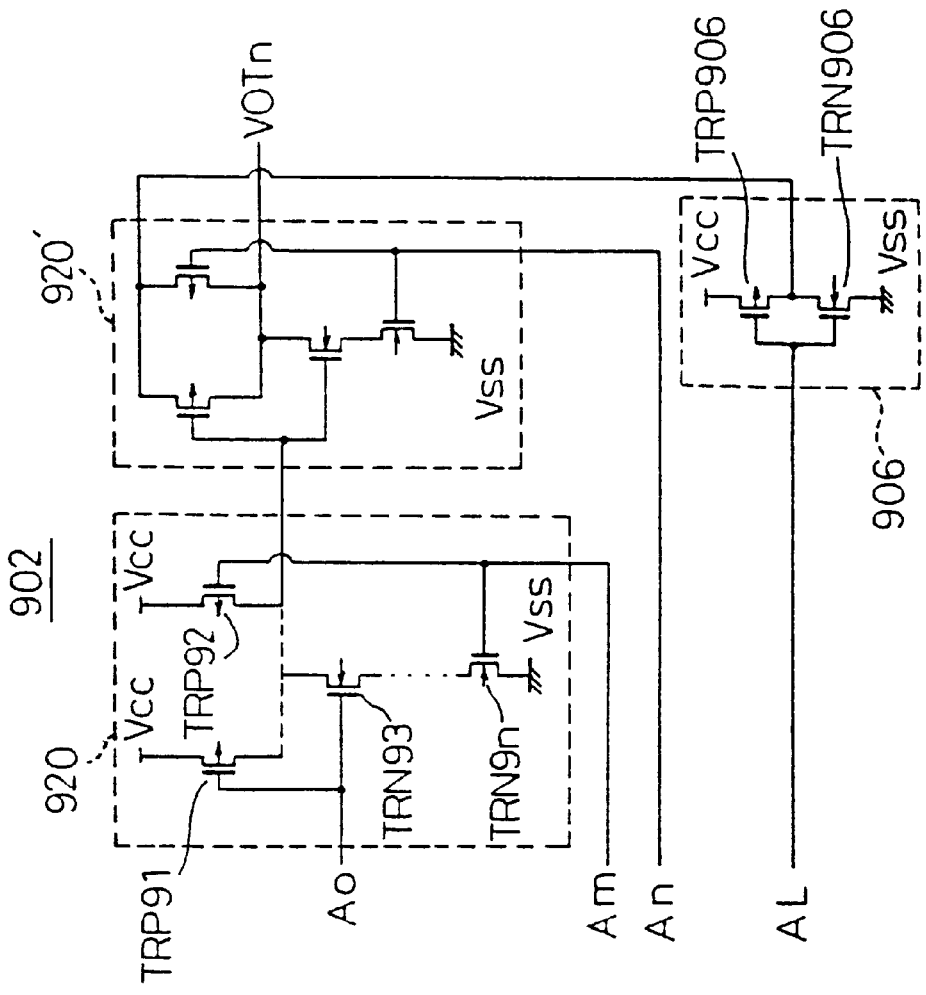
FIGS. 85A and 85B are circuit diagrams showing the details of the decoder circuit of FIG. 80A.
Figure 85A:
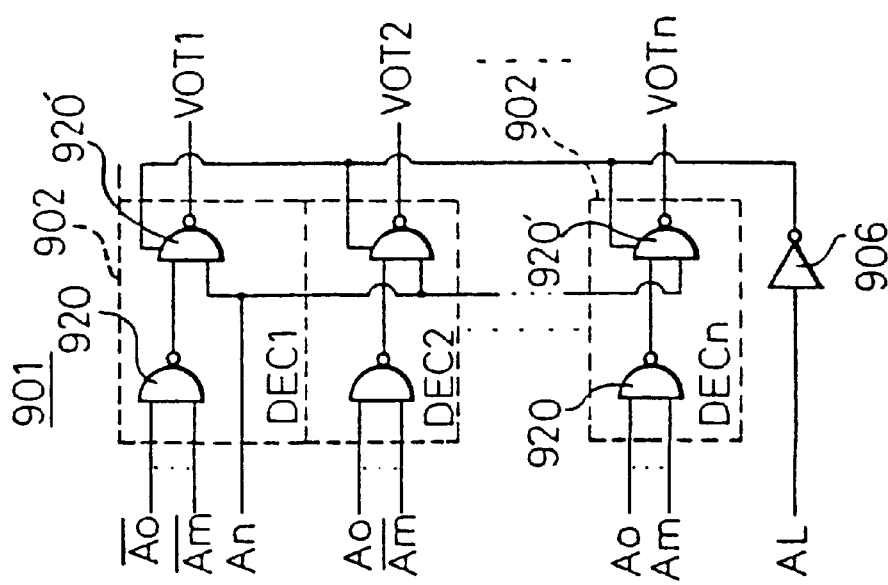

FIGS. 85A and 85B show the gates and transistors of the decoder circuit of FIG. 80A.

The decoder circuit 901 of FIGS. 85A and 85B differ from those of FIGS. 83A, 83B and 84A, 84B in that each decoder of the decoder circuit 901 is formed of NAND gates 920 and 920'. Note, the NAND gate 920 is the same as that of FIG. 83A and 83B, and the NAND gate 920' is the same as that of FIGS. 76 and 77. The inverter 906 is a known one. The operation of the decoder circuit of FIGS. 85A and 85B is the same as that of the decoder circuit of FIG. 80A, and therefore, will not be explained again. Note, the transistors TRP906 and TRN906 constituting the inverter 906 may be formed of larger size transistors than the other transistors (for example, transistors TRP91, TRP91 and TRN3, TRN9n) to adequately pass transient currents caused by parasitic capacitances, and the like. Further, as described with reference to FIGS. 80A and 80B, when the decoders (DEC1 to DECn) are divided into a plurality of groups (DEC1 to DECk, DECk+1 to DECn) and a plurality of inverters (906a and 906b) are provided for the divided groups, the transistors (TRP906, TRN906) constituting each of the inverters can be formed in a smaller size than that of the inverter 906 provided for all of the decoders (DEC1 to DECn).

Figure 86B:
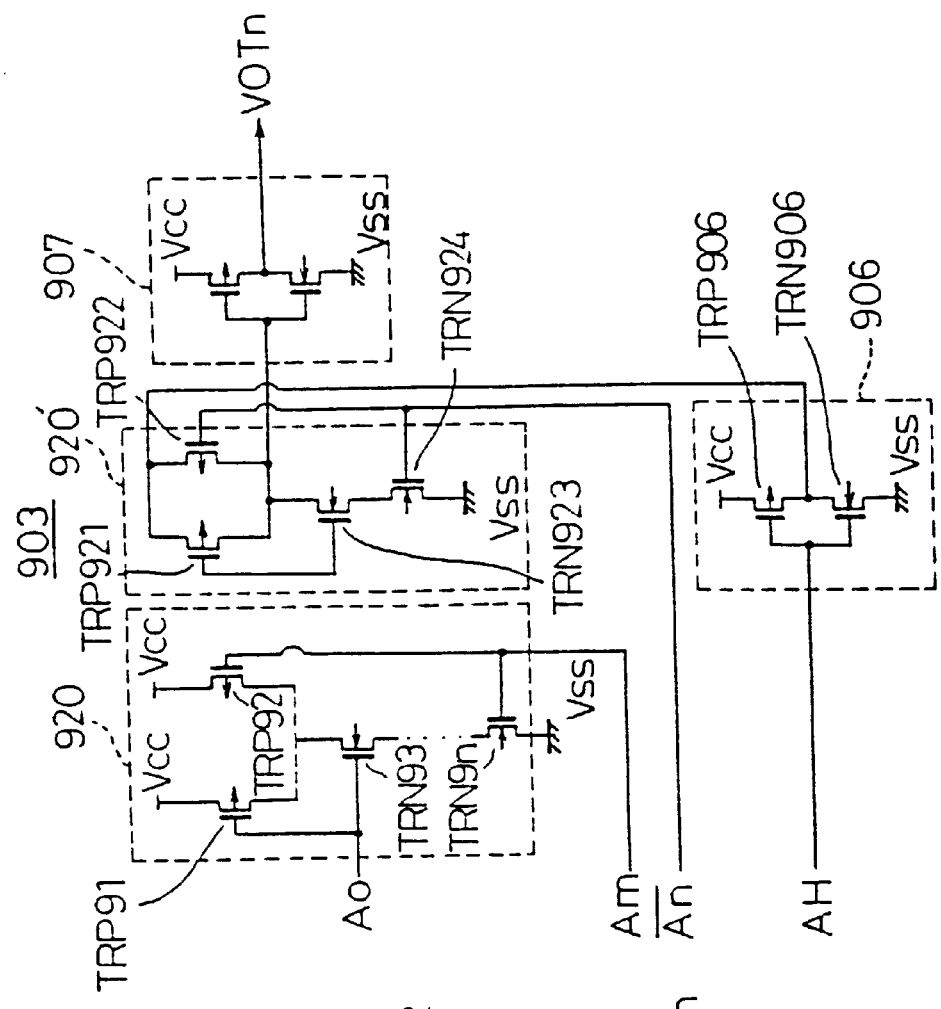
FIGS. 86A and 86B are circuit diagrams showing the details of the decoder circuit of FIG. 81A.
Figure 86A:
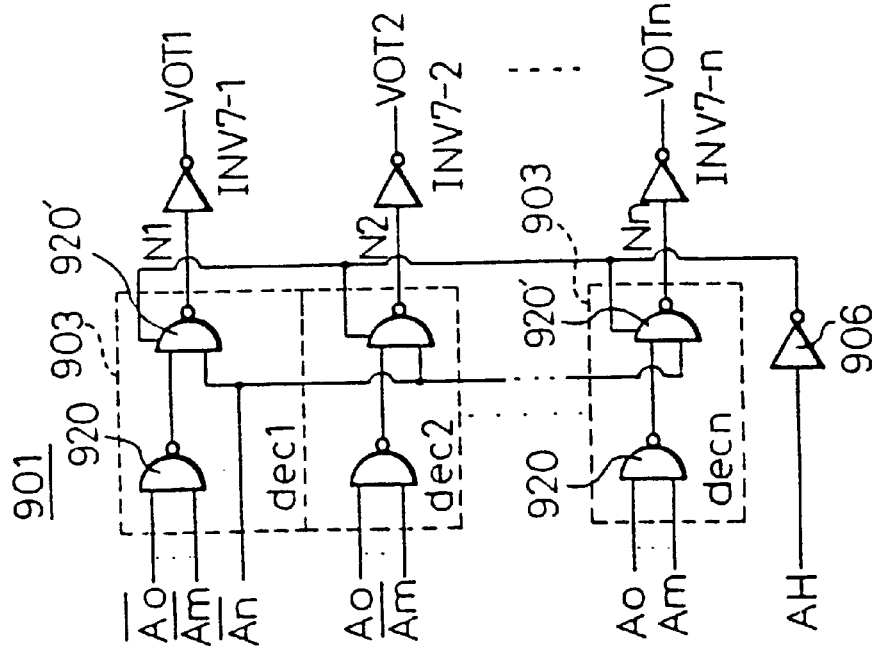

FIGS. 86A and 86B show the gates and transistors of the decoder circuit of FIG. 81A.

The decoder circuit of FIGS. 86A and 86B resembles that of FIGS. 85A and 85B and differs from those of FIGS. 83A, 83B and 84A, 84B in that each decoder of the decoder circuit is formed of NAND gates 920 and 920'. The NAND gate 920 is identical to that of FIGS. 83A and 83B, and the NAND gate 920' is identical to that of FIGS. 76 and 77. The inverter 906 is a known one. The operation of the decoder circuit of FIGS. 86A and 86B is the same as that of the decoder circuit of FIG. 81A, and therefore, will not be explained again. Note, the transistors TRP906 and TRN906 constituting the inverter 906 may be formed as larger size transistors than the other transistors to adequately pass transient currents caused by parasitic capacitances, and the like. Further, as described with reference to FIGS. 81A and 81B, when the decoders (dec1 to decn) are divided into a plurality of groups (dec1 to deck, deck+1 to decn) and a plurality of inverters (906a and 906b) are provided for the divided groups, the transistors (TRP906, TRN906) constituting each of the inverters can be formed of a smaller size than that of the inverter 906 provided for all of the decoders (dec1 to decn).

Any one of the decoder circuits according to the ninth aspect of the present invention achieves a word line full selection function, a word line nonselection function, a bit line full selection function, and a bit line nonselection function. The ninth aspect of the present invention realizes these functions only by providing a second power source for the decoder circuit involving a plurality of decoders. The second power source has a switch including an inverter for selecting one of at least two power source voltages. The ninth aspect of the present invention realizes these functions without increasing the size of the decoder circuit. This decoder circuit, therefore, is appropriate for an integrated semiconductor memory device.

Figure 87:
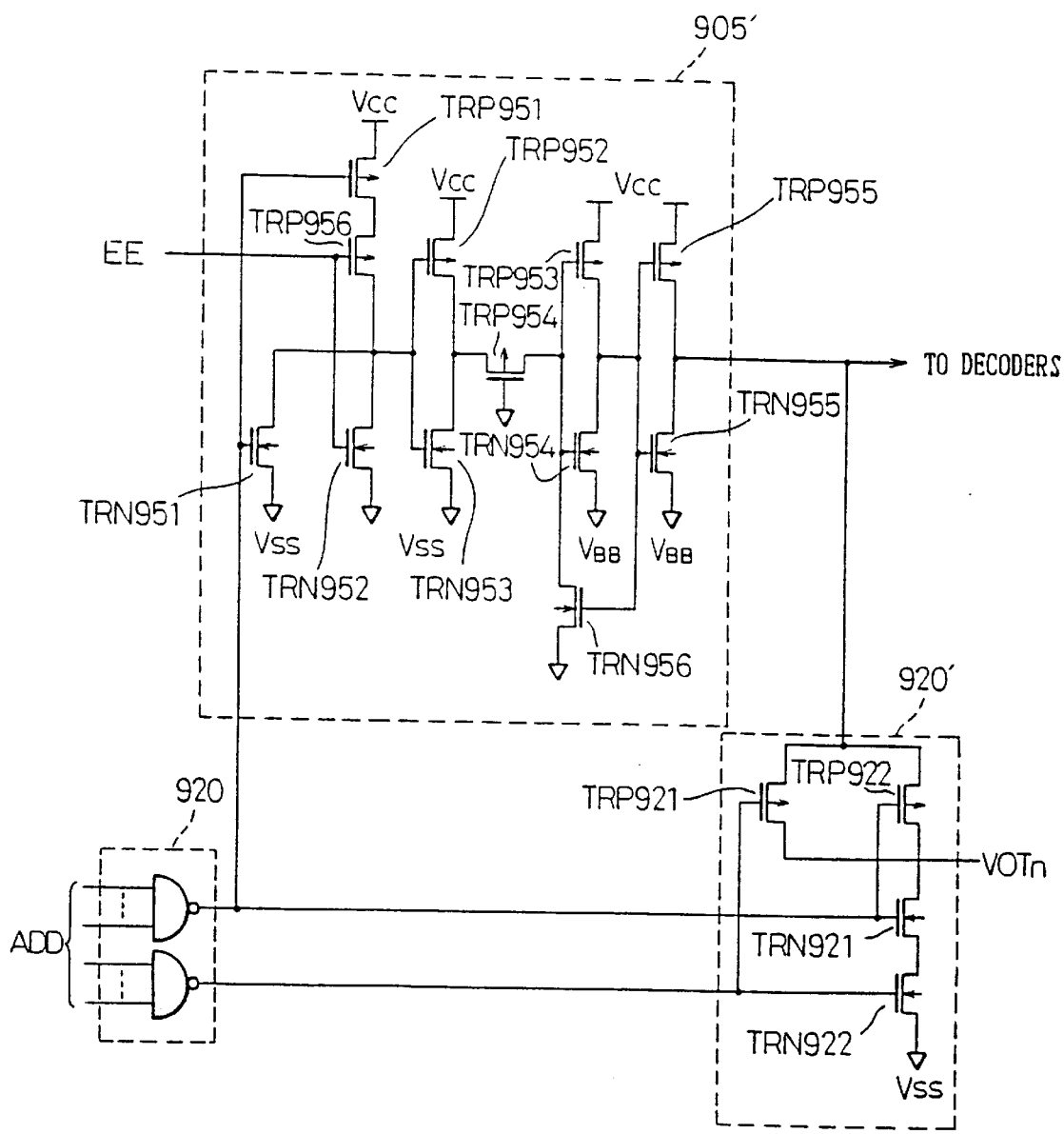
FIG. 87 is a circuit diagram showing a power supply circuit for the decoder used in a semiconductor memory device according to the ninth aspect of the present invention.

FIG. 87 shows a power supply circuit for the decoder used in a semiconductor memory device according to the ninth aspect of the present invention. In FIG. 87, a reference 905' denotes a second power source corresponding to the inverter 906 shown in, for example, FIGS. 85A and 85B, a reference EE denotes an erase control signal, and further references 920 and 920' denote NAND gates which are the same as those of FIGS. 85A and 85B. Note, an output of the power source 905' is changed to a specific negative voltage (for example, −10 volts), when an erase operation is carried out.

As shown in FIG. 87, the power source 905' comprises p-channel type MOS transistors TRP951, TRP952, TRP953, TRP954, TRP955, and TRP956, and n-channel type MOS transistors TRN951, TRN952, TRN953, TRN954, TRN955, and TRN956. Note, the erase control signal EE is at a high level H when read or write operations are carried out, and the erase control signal EE is at a low level L when an erase operation is carried out. Further, the transistor (transfer gate) TRP954 is used to cut a negative voltage, and the transistors TRN954, TRN955, and TRN956 are formed on a triple well configuration. Further, source voltages $V_{ss}$ of the transistors TRN954, TRN955, and TRN956 can be specified as a normal low voltage (ground voltage) Vss in the read or write operations. In addition, the output voltage of the power source 905' is applied to the other decoders. In this embodiment, an address signal ADD indicating a specific sector is applied to the NAND gates (predecoder) 920, the output voltage of the power source 905' is applied to the decoders included in the specific sector.

As described above, the decoder circuit of the ninth aspect of the present invention can be applied to a flash memory for carrying out an erase operation (electrical and collective erase operation) thereof.

In the above embodiments, the decoder circuit achieves a word line full selection function, a word line nonselection function, a bit line full selection function, and a bit line nonselection function, in a test mode, but the decoder circuit of the ninth aspect of the present invention can also be applied to a flash memory having a collective erasing operation. Namely, in the erasing operation of the flash memory, all of the word lines must be collectively changed to a specific negative voltage, e.g., −10 volts, and the circuit configuration of FIG. 87 realizes this erase operation of the flash memory.

Recently, high function semiconductor devices (semiconductor memory devices) such as flash memories have been driven with low voltage, and some semiconductor memory devices have even driven with a negative voltage. When driving semiconductor memory devices of conventional specifications with such low or negative voltage, the decoder circuit according to the ninth aspect of the present invention is advantageous for switching voltages from one to another.

When a semiconductor memory device carries out various tests, a normal voltage must be switched to a higher voltage than the normal voltage to set a test mode. If such a high voltage is applied to the semiconductor device by mistake, the test mode will unexpectedly start to cause malfunctions and destroy data. Therefore, the high voltage (extremely high voltage: for example, 12 volts) for starting the test mode in a semiconductor memory device is usually extremely high compared with a voltage (normal high voltage: for example, 5 volts) for normal operation.

Figure 88:
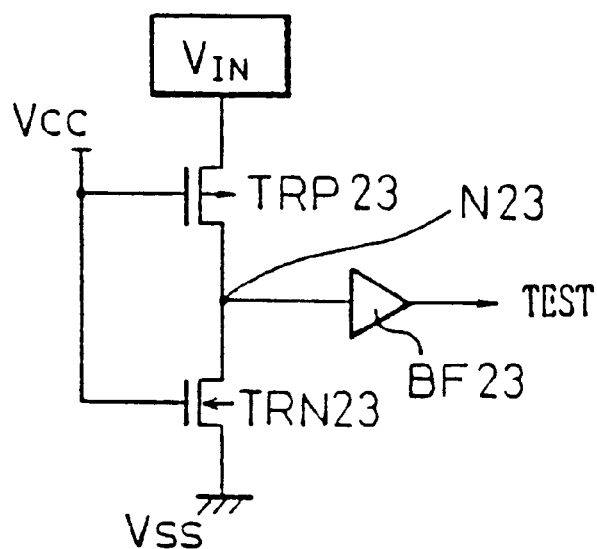
FIG. 88 is a circuit diagram showing a conventional test mode signal detector of a semiconductor device related to the ninth aspect of the present invention.

FIG. 88 shows a detector 930 for detecting the extremely high voltage for starting the test mode.

A p-channel type MOS transistor TRP23 and an n-channel type MOS transistor TRN23 are connected to each other in series. A node N23 between the transistors TRP23 and TRN23 is connected to a buffer BF23, which is connected to an output end TEST. The output end TEST is connected to a test circuit, and gates of the transistors TRP23 and TRN23 are connected to a high voltage supply source Vcc. A source of the transistor TRP23 is connected to a power source VIN, which provides an extremely high voltage much higher than the high voltage Vcc. A source of the transistor TRN23 is connected to a low voltage supply source Vss or to ground. The high voltage detector 930 causes no problems if the high voltage supply source Vcc is stable. When the high voltage supply source Vcc is unstable, for example, at activation, the problem mentioned before occurs.

Figure 89:
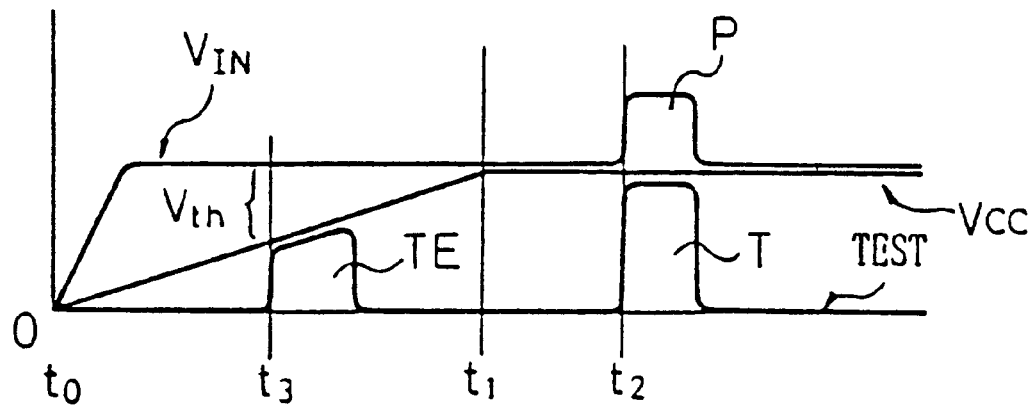
FIG. 89 is a timing chart for explaining the problems of the detector of FIG. 88.

Referring to FIG. 89, the high voltage Vcc is applied to the semiconductor device (semiconductor memory device) at time $t_0$ and is stabilized after time $t_1$. A pulse P of the extremely high voltage VIN higher than the voltage Vcc is applied at time $t_2$. Then, a source voltage of the transistor TRP23 becomes higher than a gate voltage thereof. If the difference between the source and gate voltages exceeds a threshold voltage of the transistor TRP23, the transistor is turned ON, and the terminal TEST provides a test signal T to start a predetermined test mode.

The high voltage Vcc is unstable during a period between $t_0$ and $t_1$. If the voltage VIN rises quickly during this period and if a potential difference between the voltages VIN and Vcc exceeds, at time $t_1$, the threshold voltage of the transistor TRP23, the terminal TEST will provide a test signal TE to unexpectedly start the test mode. This results in a malfunction.

This problem is usually caused when the voltage VIN is applied before the application of the high voltage Vcc.

Figure 90:
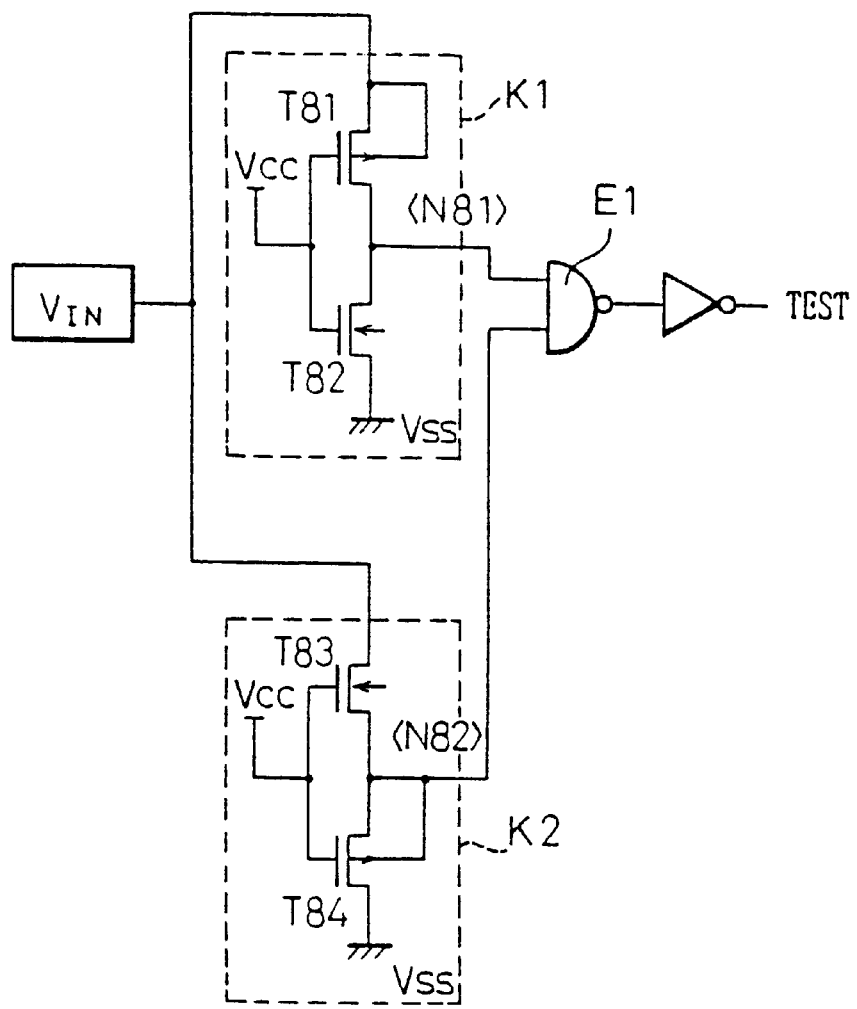
FIG. 90 is a circuit diagram showing a test mode signal detector of a semiconductor device according to the ninth aspect of the present invention.

FIG. 90 shows a test mode signal detector of a semiconductor device (semiconductor memory device) according to the ninth aspect of the present invention.

The detector 930 has a first detector section K1, a second detector section K2, and an operation circuit E1. The first detector section K1 has a p-channel type MOS T81 and an n-channel type MOS transistor T82, and these transistors T81 and T82 are connected to each other in series. A node between the transistors T81 and T82 forms a first output end N81 of the first detector section K1. Gates of the transistors T81 and T82 are connected to a high voltage supply source Vcc, and a source of the transistor T81 is connected to an external input terminal VIN. A source of the transistor T82 is connected to a low voltage supply source Vss or to a ground GND.

The second detector section K2 has a p-channel type MOS transistor T83 and an n-channel type MOS transistor T84, and the transistors T83 and T84 are connected to each other in series. A node between the transistors T83 and T84 forms a second output end N82 of the second detector section K2. Gates of the transistors T83 and T84 are connected to the high voltage supply source Vcc. A source of the transistor T83 is connected to the external input terminal VIN, and a source of the transistor T84 is connected to the low voltage supply source Vss or to the ground GND. The operation circuit E1 carries out a logical operation according to output signals from the detector sections K1 and K2, to provide a test signal TEST.

This detector effectively prevents application of an unexpected test signal, with no regard to the order of application of voltages. The detector detects the extremely high voltage VIN only on an expected occasion to start a test mode.

In FIG. 90, the supply source of the high voltage Vcc may be an internal power source or an external power source. The external input terminal VIN provides the test mode starting voltage (extremely high voltage) that is higher than the high voltage Vcc. The operation circuit E1 may be a NAND gate. An output end of the circuit E1 may have an inverter INV, if necessary.

During a normal state with the high voltage Vcc being stable, the transistor T83 is ON, and the transistor T84 is OFF. Accordingly, the output end N82 of the detector section K2 provides a signal of high level H, and therefore, the test terminal TEST provides an output signal of the output terminal N81 of the detector section K1, thereby securing the same operation as the conventional circuit.

When the high voltage Vcc is applied, there is a risk that the output end N81 of the detector section K1 may provide a signal of high level H by mistake. When the extremely high voltage VIN is higher than the voltage Vcc and a voltage difference between them exceeds the threshold voltage of the transistor T81, the transistor T83 is weakly turned ON or is turned OFF to turn ON the transistor T84. As a result, the output end N82 of the second detector section K2 provides a signal of low level L, and therefore, the test terminal TEST is maintained at low level L.

Figure 91:
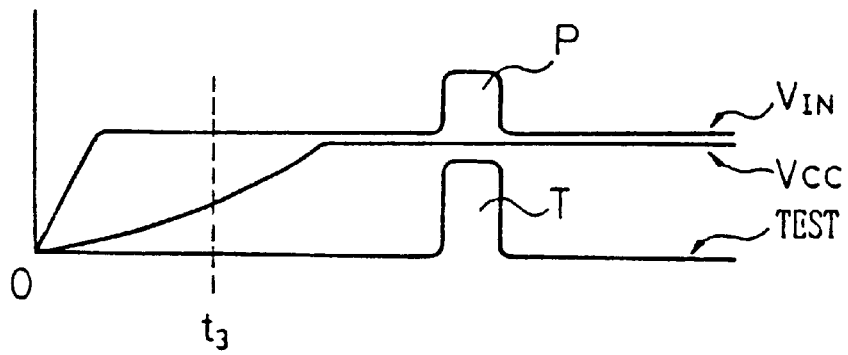
FIG. 91 is a timing chart of the detector of FIG. 90.

Accordingly, as shown in FIG. 91, the embodiment of the ninth aspect of the present invention completely prevents the unexpected start of the test mode.

Figure 92:
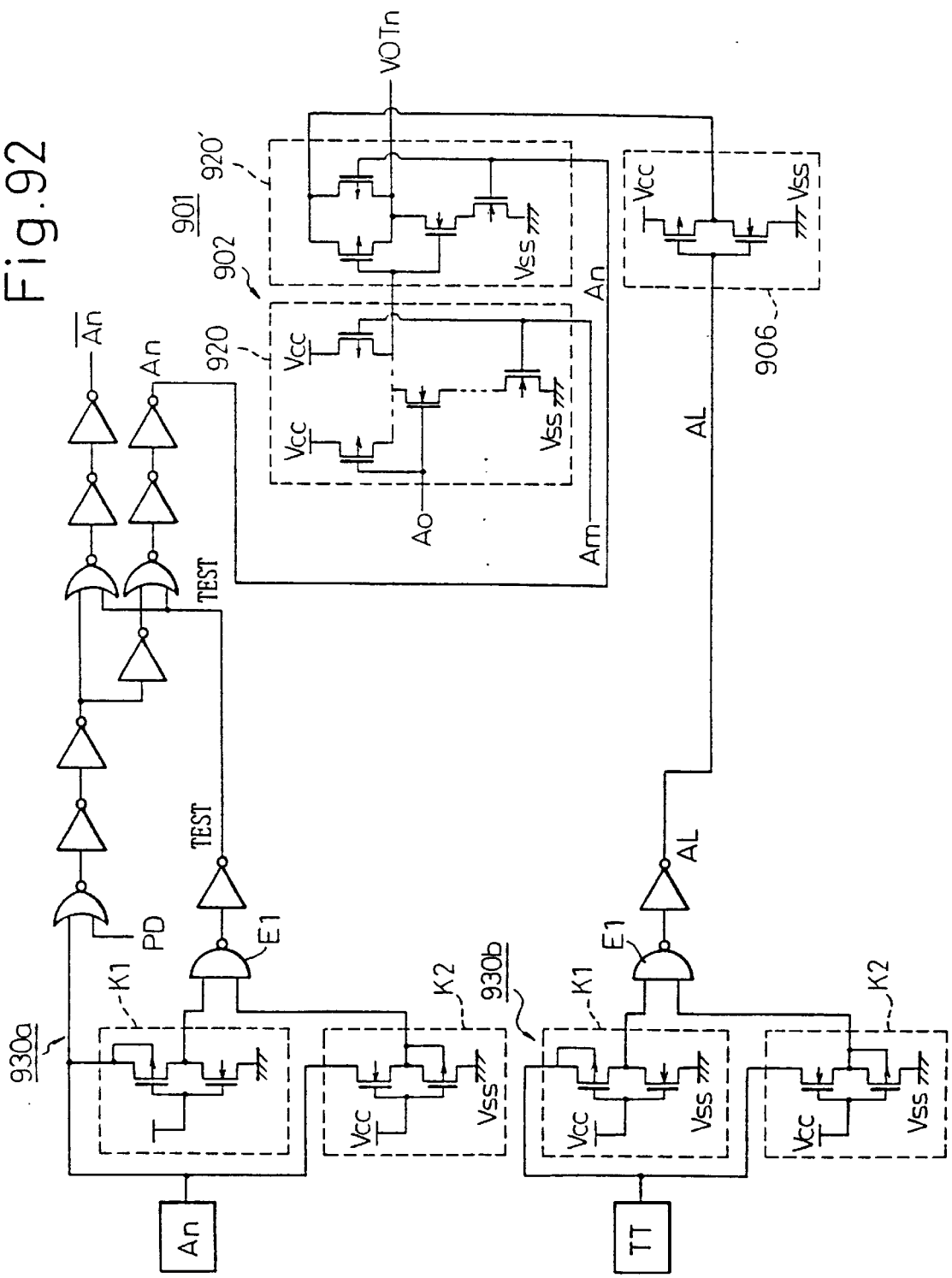
FIG. 92 shows a decoder circuit shown in FIG. 85B, using the detectors 930 shown in FIG. 90.

FIG. 92 shows a decoder circuit shown in FIG. 85B, using the detectors 930 shown in FIG. 90.

As shown in FIG. 92, two detectors 930a and 930b are provided for applying signals An and AL. Namely, the detector 930a receives an address signal An through a terminal (An), and when a voltage level of the terminal An is at an extremely high voltage (for example, 12 volts) higher than a normal high voltage (for example, 5 volts) for starting a test mode in a semiconductor memory device, a test signal TEST of a high level H is output therefrom. Note, when the test signal TEST is at a high level H, the decoder circuit 902 (901) carried out a test mode of full selection or nonselection functions of word or bit lines. Further, the detector 930b receives a signal TT through a terminal (TT), and when a voltage level of the terminal TT is at an extremely high voltage higher than a normal high voltage, the decoder circuit 901 (decoder 902) is set to a full selection mode. On the other hand, when a voltage level of the terminal TT is at a low voltage, the decoder circuit 901 (decoder 902) is set to a nonselection mode.

Namely, when the test signal TEST is at a high level H, a signal An is at a low level L. In this state, when a control signal AL is at a low level L, a full selection mode is set in a semiconductor memory device (for example, EEPROM, flash memory) by the decoder circuit 901. On the other hand, when the control signal AL is at a high level H, a nonselection mode is set in the semiconductor memory device by the decoder circuit 901. Note, in the normal operation (normal mode) of the semiconductor memory device, the test signal TEST is at a low level L, that is the voltage level of the terminal An is at a normal voltage (for example, 0 volts to 5 volts).

As described above, the detectors can be provided for setting full selection or non selection function (test mode) in the semiconductor memory device.

As explained above, a semiconductor memory device according to the first aspect of the present invention effectively employs redundant word lines and achieves stable write and verify operations, thereby improving the yield and performance of semiconductor memories.

A semiconductor memory device according to the second aspect of the present invention replaces defective real cells with redundant cells without increasing the size of a semiconductor memory device, thereby improving the yield of large capacity semiconductor memories and reducing the cost thereof.

A semiconductor memory device according to the third aspect of the present invention carries out a delivery test of a semiconductor memory device with "n" rewrite operations at the maximum, taking into account deterioration due to an increase in the number of rewrite operations, to thereby guarantee the maximum rewrite operations N (N>n) for a user.

A semiconductor memory device according to the fourth aspect of the present invention provides a semiconductor memory device in which the threshold voltage of a write voltage supply transistor has no influence on a write drain voltage, so that data is correctly written even with a low write voltage.

A semiconductor memory device according to the fifth aspect of the present invention correctly reads data even if there are overerased cell transistors.

A semiconductor memory device according to the sixth aspect of the present invention saves overerased cell transistors and correctly reads data.

A semiconductor memory device according to the seventh aspect of the present invention simultaneously erases blocks of memory cells and easily verifies the erasure.

A semiconductor memory device according to the eighth aspect of the present invention achieves a word line full selection function, a word line nonselection function, a bit line full selection function, and a bit line nonselection function. The eighth aspect of the present invention achieves these functions only by providing a second power source for the decoder circuit containing a plurality of decoders. The second power source circuit has a switch including an inverter for selecting one of at least two power source voltages. The eighth aspect of the present invention realizes these functions without increasing the size of the decoder circuit. This decoder circuit is appropriate for an integrated semiconductor device.

A semiconductor memory device according to the ninth aspect of the present invention employs two power sources but is as easy to handle as if it had only a single power source. This memory requires no step-up circuit for the power sources and works with low voltages.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory device comprising:
   a plurality of word lines;
   a plurality of bit lines; and
   a plurality of nonvolatile memory cells each formed of a MIS transistor disposed at each intersection of said word lines and said bit lines, and a threshold voltage of said MIS transistor being externally electrically controllable, wherein said nonvolatile memory cells are divided into a plurality of cell blocks to be selected according to a block selection signal provided by a block address buffer, each of said cell blocks has a data erasing circuit and a latching circuit latching said block selection signal, and thereby data of said cell blocks that have latched said block selection signal are simultaneously erased.

2. A semiconductor memory device as claimed in claim 1, wherein said semiconductor memory device comprises data decision circuits for discriminating cell data in said respective cell blocks, expected value storage circuits each for storing an expected value for write and write-verify operations as well as an expected value for an erase-verify operation, coincidence circuits each for comparing an output signal of said data decision circuit with the expected value and providing a coincidence signal, and a logic circuit for providing a logical multiply of the coincidence signals from said respective cell blocks.

3. A semiconductor memory device as claimed in claim 1, wherein said semiconductor memory device comprises data decision circuits for discriminating cell data in said respective cell blocks, expected value generators each for generating an expected value for write and write-verify operations as well as an expected value for an erase-verify operation, coincidence circuits each for comparing an output signal of said data decision circuit with the expected value and providing a coincidence signal, and a logic circuit for providing a logical multiply of the coincidence signals from said respective cell blocks.

4. A semiconductor memory device as claimed in claim 1, wherein said semiconductor memory device comprises data decision circuits for discriminating cell data in said respective cell blocks, data inversion circuits each for inverting an output signal of said data decision circuit in accordance with erase and write operations, and a logic circuit for providing a logical multiply of said data inversion circuits from said respective cell blocks.

* * * * *